United States Patent
Hiscock et al.

(10) Patent No.: US 11,971,441 B2
(45) Date of Patent: Apr. 30, 2024

(54) METHOD FOR MEASURING DISTANCE TO A SHORT IN A TWO-CONDUCTOR WIRE

(71) Applicant: QUALCOMM Incorporated, San Diego, CA (US)

(72) Inventors: Paul Dominic Hiscock, Cambridge (GB); Murray Jarvis, Cambridge (GB); Nicolas Graube, Cambridge (GB); Mafalda Pereira Varela, London (GB); Thomas Allan, St. Neots (GB)

(73) Assignee: QUALCOMM Incorporated, San Diego, CA (US)

( * ) Notice: Subject to any disclaimer, the term of this patent is extended or adjusted under 35 U.S.C. 154(b) by 371 days.

(21) Appl. No.: 17/451,150

(22) Filed: Oct. 15, 2021

(65) Prior Publication Data

US 2023/0118013 A1    Apr. 20, 2023

(51) Int. Cl.
  *G01R 31/08*  (2020.01)
  *G01R 19/165*  (2006.01)
  *G01S 13/88*  (2006.01)

(52) U.S. Cl.
  CPC ......... *G01R 31/086* (2013.01); *G01R 19/165* (2013.01); *G01S 13/88* (2013.01)

(58) Field of Classification Search
  None
  See application file for complete search history.

(56) References Cited

U.S. PATENT DOCUMENTS

| | | | |
|---|---|---|---|
| 7,808,247 B1 | 10/2010 | Lo | |
| 2005/0194978 A1* | 9/2005 | Smith | .................... G01R 31/11 |
| | | | 340/686.1 |
| 2017/0257262 A1 | 9/2017 | Dalal | |
| 2019/0317143 A1* | 10/2019 | Dase | ......... H02H 3/38 |
| 2020/0049755 A1 | 2/2020 | Cabanillas et al. | |

FOREIGN PATENT DOCUMENTS

| | | |
|---|---|---|
| DE | 102017214996 A1 | 2/2019 |
| JP | 2018146233 A | 9/2018 |
| WO | 2021083656 A1 | 5/2021 |

OTHER PUBLICATIONS

International Search Report and Written Opinion—PCT/US2022/042558—ISA/EPO—Dec. 20, 2022.
Schirone L., et al., "Fault Detection in a Photovoltaic Plant by Time Domain Reflectometry", Progress in Photovoltaics: Research and Applications, vol. 2, Jan. 1994, pp. 35-44.

* cited by examiner

*Primary Examiner* — Farhana A Hoque
(74) *Attorney, Agent, or Firm* — The Marbury Law Group, PLLC

(57) ABSTRACT

Various embodiments may provide systems and methods for determining a distance to a short in a two-conductor wire. Various embodiments may include determining a distance to a short in a two-conductor wire based at least in part on a phase difference between a phase of an injected tone and a phase of a reflected tone. Various embodiments may include determining a distance to a short in a two-conductor wire based at least in part on both a phase difference and an amplitude difference between an injected tone and a reflected tone. Various embodiments may include determining a distance to a short in a two-conductor wire based at least in part on a measured peak voltage of a combined pulse.

23 Claims, 27 Drawing Sheets

METHOD FOR MEASURING DISTANCE TO A SHORT IN A TWO-CONDUCTOR WIRE

BACKGROUND

Devices for detecting and locating the position of a short along a two-conductor wire, and specifically the distance from an end of the wire to the short, are valuable tools supporting system inspection, system fault detection, system diagnostics, and system topology measures.

SUMMARY

Various aspects include systems and methods for determining a distance to a short in a two-conductor wire. Various aspects may include a method for determining a distance to a short in a two-conductor wire. In various aspects, the method may be performed by a processor of a device connected to the two-conductor wire.

Various aspects may include injecting an initial tone into a first end of the two-conductor wire, the initial tone having an initial known signal phase, measuring a signal phase of an initial reflected tone at the first end of the two-conductor wire resulting from injecting the initial tone, determining an initial phase difference as a phase difference between the initial known signal phase and the measured signal phase of the initial reflected tone, and determining a distance to the short in the two-conductor wire based at least in part on the determined initial phase difference. In some aspects, the initial known signal phase may be an initial known current phase and the measured signal phase of the initial reflected tone may be a measured current phase of the initial reflected tone. In some aspects, the initial known signal phase may be an initial known voltage phase and the measured signal phase of the initial reflected tone may be a measured voltage phase of the initial reflected tone.

In various aspects, the initial tone may have an initial frequency. Various aspects further include injecting a second tone into the first end of the two-conductor wire, the second tone having a second initial voltage phase and a second frequency different from the initial frequency, measuring a voltage phase of a second reflected tone at the first end of the two-conductor wire resulting from injecting the second tone, and determining a second phase difference as a phase difference between the second initial voltage phase and the measured voltage phase of the second reflected tone. In various aspects, determining the distance to the short in the two-conductor wire based at least in part on the determined initial phase difference may include determining the distance to the short in the two-conductor wire based at least in part on the determined initial phase difference and the determined second phase difference.

Various aspects may further include controlling a device along the two-conductor wire to create the short in the two-conductor wire prior to injecting the initial tone, prior to injecting the second tone, and prior to determining the distance to the short.

In some aspects, the initial tone may have an initial known signal amplitude. Some aspects may further include measuring an amplitude of the initial reflected tone at the first end of the two-conductor wire resulting from injecting the initial tone, and determining an initial amplitude difference as a difference between the initial known amplitude and the measured amplitude of the initial reflected tone. In some aspects, determining the distance to the short in the two-conductor wire based at least in part on the determined initial phase difference may include determining the distance to the short in the two-conductor wire based at least in part on the determined initial phase difference and the determined initial amplitude difference. In some aspects, the initial known signal amplitude may be an initial known current amplitude, and the measured amplitude of the initial reflected tone may be a measured current amplitude of the initial reflected tone. In some aspects, the initial known signal amplitude may be an initial known voltage amplitude, and the measured amplitude of the initial reflected tone may be a measured voltage amplitude of the initial reflected tone.

Some aspects may include injecting a selected pulse into a first end of the two-conductor wire, the selected pulse having a selected peak voltage and a selected pulse shape, measuring a peak voltage of a combined pulse at the first end of the two-conductor wire resulting from injecting the selected pulse, and determining a distance to the short in the two-conductor wire based at least in part on the measured peak voltage of the combined pulse.

Some aspects may further include determining the selected peak voltage for the selected pulse and the selected pulse shape for the selected pulse based at least in part on a known length of the two-conductor wire prior to injecting the selected pulse. In some aspects, the selected pulse may be a ramp-pulse with no modulation applied to the ramp-pulse.

Some aspects may include, prior to injecting the selected pulse, injecting a test pulse into the first end of the two-conductor wire while no shorts are present in the two-conductor wire, measuring a peak voltage of a returned test pulse at the first end of the two-conductor wire resulting from injecting the test pulse, determining a distance to a second end of the two-conductor wire based at least in part on the measured peak voltage of the returned test pulse, determining whether the determined distance to the second end of the two-conductor wire is the same as a known length of the two-conductor wire, and performing a calibration operation in response to determining that the distance to the second end of the two-conductor wire is not the same as the known length of the two-conductor wire. In some aspects, injecting the selected pulse into the first end of the two-conductor wire may include injecting the selected pulse into the first end of the two-conductor wire in response to determining that the distance to the second end of the two-conductor wire is the same as the known length of the two-conductor wire.

Various aspects may include controlling a device along the two-conductor wire to create the short in the two-conductor wire prior to injecting the selected pulse into the first end of the two-conductor wire.

Further aspects may include a device having a processor configured to perform one or more operations of any of the methods summarized above. Further aspects may include processing devices for use in a device configured with processor-executable instructions to perform operations of any of the methods summarized above. Further aspects may include a non-transitory processor-readable storage medium having stored thereon processor-executable instructions configured to cause a processor of a device to perform operations of any of the methods summarized above. Further aspects include a device having means for performing functions of any of the methods summarized above. Further aspects include a system on chip for use in a device and that includes a processor configured to perform one or more operations of any of the methods summarized above.

BRIEF DESCRIPTION OF THE DRAWINGS

The accompanying drawings, which are incorporated herein and constitute part of this specification, illustrate exemplary embodiments of the claims, and together with the general description given above and the detailed description given below, serve to explain the features of the claims.

DETAILED DESCRIPTION

Figure 1A:
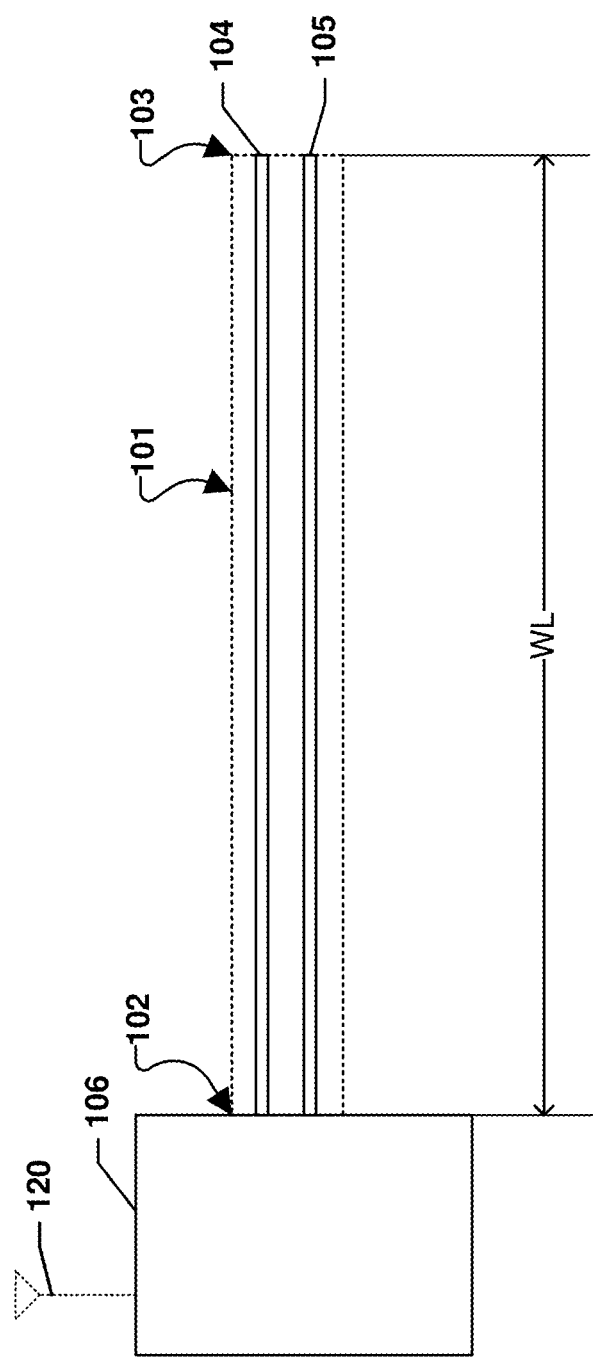
FIG. 1A is a system block diagram illustrating an example system including a two-conductor wire suitable for implementing various embodiments.

Various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Various embodiments include systems and methods for determining a distance to a short in a two-conductor wire. Various embodiments may include determining a distance to a short in a two-conductor wire based at least in part on a phase difference between a voltage phase of an injected tone and a voltage phase of a reflected tone. Various embodiments may include determining a distance to a short in a two-conductor wire based at least in part on a phase difference between a current phase of an injected tone and a current phase of a reflected tone. Various embodiments may include determining a distance to a short in a two-conductor wire based at least in part on both: a phase difference between a voltage phase of an injected tone and a voltage phase of a reflected tone; and an amplitude difference between a voltage amplitude of the injected tone and a voltage amplitude of the reflected tone. Various embodiments may include determining a distance to a short in a two-conductor wire based at least in part on both: a phase difference between a current phase of an injected tone and a current phase of a reflected tone; and an amplitude difference between a current amplitude of the injected tone and a current amplitude of the reflected tone. Various embodiments may include determining a distance to a short in a two-conductor wire based at least in part on a measured peak voltage of a combined pulse. Various embodiments may enable reliable determination of a distance to a short in a two-conductor wire. Various embodiments may provide low-cost devices for determining a distance to a short in a two-conductor wire. Various embodiment methods for determining a distance to a short in a two-conductor wire may be support system inspection, system fault detection, system diagnostics, and system topology measures.

The term "two-conductor wire" is used herein to refer to a wire (sometimes also referred to as a cable) having at least two-conductors. As used herein, a "two-conductor wire" may be a wire (or cable) having two or more conductors, such as two conductors, three conductors, four conductors, five conductors, more than five conductors, etc. The two or more conductors in a two-conductor wire may be separated from one another, such as by one or more insulating materials, one or more supporting structures, and/or physical distance. A two-conductor wire may be an embedded structure in another device, such as a collection of two or more conductors within a device. Alternatively, a two-conductor wire may be its own structure, such as two or more conductors supported in a jacket structure. Examples of two-conductor wires may include power cables, transmission lines, telephone lines, communication buses, etc.

As used herein the term "short" may refer to an electrical connection that occurs between at least two conductors of a two-conductor wire at a point in the wire between a first end of the two-conductor wire and a second opposite end of the two-conductor wire. Shorts may enable electrical current to flow between the at least two conductors of the two-conductor wire. Shorts may be unintentionally created, such as by damage to the two-conductor wire, a manufacturing defect in the two-conductor wire, etc., or shorts may be intentionally created, such as by a device along the two-conductor wire closing one or more switches thereby connecting the at least two conductors, by a device being inserted into the two-conductor wire electrically connecting the at least two conductors, etc.

The term "pulse" as used herein refers to a signal that has a waveform that departs from a base value to another value and returns to the base value. In some scenarios a pulse may be a signal that has a waveform that departs from a base value to another value and returns to the base value without crossing the base value. In other scenarios pulses may be a signal that has a waveform that departs from a base value to another value and returns to the base value after crossing the base value at one or more points. Pulses may be unidirectional waveforms. For example, a pulse may rise from a base value toward a peak value and return to the base value. The portion of the pulse rising from the base value toward the peak value may be the rising edge of the pulse. A positive pulse may have a non-negative base value, rise to a positive peak value, and return to the non-negative base value without crossing the zero axis. A negative pulse may have a non-positive base value, descend to a negative peak value, and return to the non-positive base value without crossing the zero axis. Positive pulses when reflected may result in negative pulses propagating from the point of reflection and negative pulses when reflected may result in positive pulses propagating from the point of reflection. Examples of pulses may include a rectangular pulse, a Gaussian, a triangle pulse, etc.

The term "tone" as used herein refers to a periodic signal that has a positive component, a negative component, and a magnitude in which the signal crosses the zero axis. Examples of tones includes sine waves and cosine waves.

The term "system on chip" (SOC) is used herein to refer to a single integrated circuit (IC) chip that contains multiple resources or processors integrated on a single substrate. A single SOC may contain circuitry for digital, analog, mixed-signal, and radio-frequency functions. A single SOC also may include any number of general purpose or specialized processors (digital signal processors, modem processors, video processors, etc.), memory blocks (such as ROM, RAM, Flash, etc.), and resources (such as timers, voltage regulators, oscillators, etc.). SOCs also may include software for controlling the integrated resources and processors, as well as for controlling peripheral devices.

The term "system in a package" (SIP) may be used herein to refer to a single module or package that contains multiple resources, computational units, cores or processors on two or more IC chips, substrates, or SOCs. For example, a SIP may include a single substrate on which multiple IC chips or semiconductor dies are stacked in a vertical configuration. Similarly, the SIP may include one or more multi-chip modules (MCMs) on which multiple ICs or semiconductor dies are packaged into a unifying substrate. A SIP also may include multiple independent SOCs coupled together via high speed communication circuitry and packaged in close proximity, such as on a single motherboard or in a single device. The proximity of the SOCs facilitates high speed communications and the sharing of memory and resources.

Various embodiments may be include devices operating according to various communication standards including sending and/or receiving signals according to any of the Institute of Electrical and Electronics Engineers (IEEE) 16.11 standards, or any of the IEEE 802.11 standards, the Bluetooth® standard, code division multiple access (CDMA), CDMA-2000, frequency division multiple access (FDMA), time division multiple access (TDMA), time division synchronous code division multiple access (TD-SCDMA), Global System for Mobile communications (GSM), GSM/General Packet Radio Service (GPRS), Enhanced Data GSM Environment (EDGE)(also known as Enhanced GPRS (EGPRS)), Terrestrial Trunked Radio (TETRA), Wideband-CDMA (WCDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless, cellular or Internet of Things (IoT) network, such as an IEEE 802.15.4 protocol (for example, Thread, ZigBee, and Z-Wave), 6LoWPAN, Bluetooth Low Energy (BLE), LTE Machine-Type Communication (LTE MTC), Narrow Band LTE (NB-LTE), Cellular IoT (CIoT), Narrow Band IoT (NB-IoT), BT Smart, Wi-Fi, LTE-U, LTE-Direct, MuLTEfire, as well as relatively extended-range wide area physical layer interfaces (PHYs) such as Random Phase Multiple Access (RPMA), Ultra Narrow Band (UNB), Low Power Long Range (LoRa), Low Power Long Range Wide Area Network (LoRaWAN), Weightless, Worldwide Interoperability for Microwave Access (WiMAX), or multicast Domain Name Service (DNS)(mDNS), or Connected Home Over IP (CHIP), or a system utilizing Third Generation (3G), Fourth Generation (4G) or Fifth Generation (5G), or further implementations thereof, technology.

Various embodiments may provide devices and methods for determining the distance from an end of a two-conductor wire to a short across two conductors of the two-conductor wire. For example, the short may be a short across two conductors of the same length in a two-conductor wire.

FIG. 1A is a system block diagram illustrating an example system including a two-conductor wire 101. The system may include a device 106 connected to the two-conductor wire 101. In various embodiments, the device 106 may be configured to determine a distance to a short in the two-conductor wire 101.

The two-conductor wire 101 may include two or more conductors, such as a first conductor 104 and second conductor 105. While illustrated as including two conductors, first conductor 104 and second conductor 105, the two-conductor wire 101 may include additional conductors. The two-conductor wire 101 may have a known length, such as a wire length "WL" running from a first end 102 of the two-conductor wire 101 to a second end 103 of the two-conductor wire 101. The first conductor 104 and the second conductor 105 may be same length conductors, such as conductors running the known length of the two-conductor wire 101, such as the "WL". The two-conductor wire 101 may be an embedded structure in another device, such as a collection of two or more conductors within a device. Alternatively, a two-conductor wire 101 may be its own structure, such as two or more conductors supported in a jacket structure.

The device 106 may be permanently connected to the two-conductor wire 101 or the device 106 may be removably connected to the two-conductor wire 101. Whether permanently or removably connected to the two-conductor wire 101, the device 106 may be electrically connected to each of the first conductor 104 and the second conductor 105. In some embodiments, the device 106 may optionally include an antenna 120 configured to send and/or receive electromagnetic radiation to support sending and/or receiving wireless signals by the device 106. The antenna 120 may support communications using various radio access technologies (RATs), such as Bluetooth Low Energy (BLE), Wi-Fi, etc. The device 106 may be any type device connected to the two-conductor wire 101, such as a fault detector connected to the two-conductor wire 101 to detect faults in the two-conductor wire 101, a test device connected to the two-conductor wire 101 to test an attribute of the two-conductor wire 101, a control device connected to the two-conductor wire 101 to control devices connected to the two-conductor wire 101, a communication device connected to the two-conductor wire 101 to communicate with another device via the two-conductor wire 101, etc.

Figure 1B:
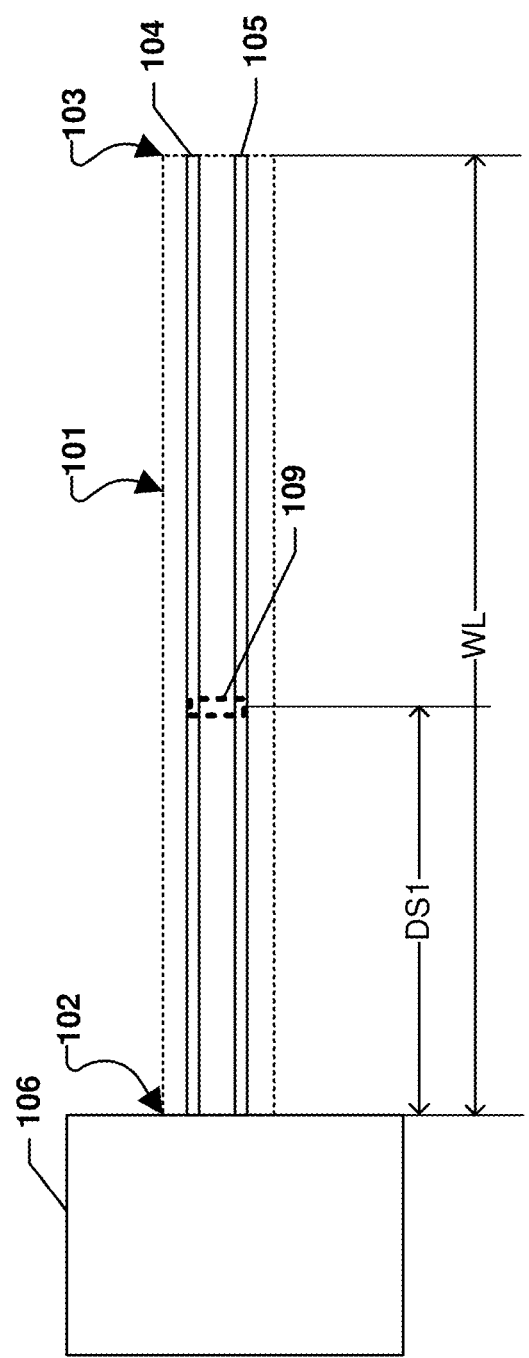
FIG. 1B is a system block diagram illustrating an example short in the system of FIG. 1A.

FIG. 1B illustrates an example short 109 in the system of FIG. 1A. With reference to FIGS. 1A and 1B, the short 109 may an electrical connection across the first conductor 104 and the second conductor 105 that enables current to travel between the first conductor 104 and the second conductor 105. As examples, the short 109 may be unintentionally created, such as by damage to the two-conductor wire 101, a manufacturing defect in the two-conductor wire 101, etc. As other examples, the short 109 may be intentional created, such as by a connection between the first conductor 104 and the second conductor 105 being inserted in the two-conductor wire 101. The short 109 may be a distance, DS1, from the first end 102. In various embodiments, the device 106 may be configured to determine the distance, DS1, from the first end 102 to the short 109 in the two-conductor wire 101.

Figure 1C:
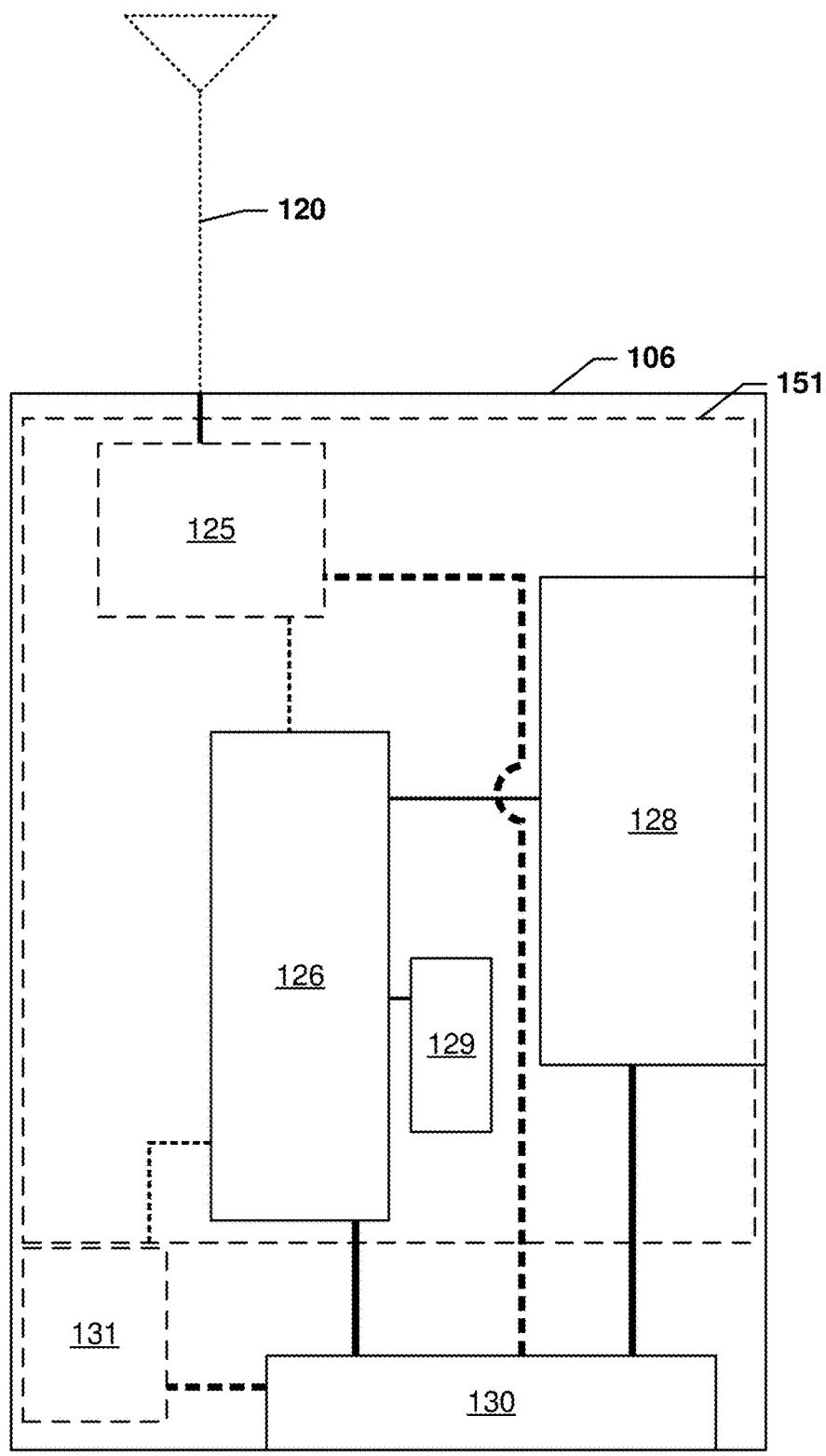
FIG. 1C is a component block diagram of a device configured to be connected to a two-conductor wire suitable for use with various embodiments.

FIG. 1C is a component block diagram of the device 106 configured to be connected to a two-conductor wire in accordance with various embodiments. With reference to FIGS. 1A-1C, the device 106 may include a distance measurement circuit 128 connected to a processor 126. In various embodiments, the processor 126 may be connected to a memory 129. The memory 129 may be a volatile or non-volatile memory. The processor 126 may be a dedicated processor, a SOC, or a SIP. The processor 126 and/or distance measurement circuit 128 may be powered by a power source 130 of the device 106, such as a battery, connection to an external power source, combination of battery and external power source, etc.

The distance measurement circuit 128 may be a circuit, SOC, SIP, or other type device configured to connect to the two-conductor wire 101. Specifically, the distance measurement circuit 128 may be configured to connect to any one or more of the two or more conductors of the two-conductor wire 101, such as the first conductor 104 and/or the second conductor 105. The distance measurement circuit 128 may be configured to determine a distance to a short, such as short 109, in the two-conductor wire 101. As an example, the distance measurement circuit 128 may be configured to determine the distance, DS1, from the first end 102 to the short 109 in the two-conductor wire 101. The distance measurement circuit 128 may include various signal generation and signal processing hardware, such as one or more its own respective processors, radios, signal generators (e.g., pulse generators, tone generators, etc.), multiplexers, voltage detection circuits, phase detection circuits, resistors, capacitors, inductors, operational amplifiers, analog-to-digital converters (ADCs), digital-to-analog converters (DACs), connectors, logic gates, switches (e.g., field-effect transistors (FETs), dedicated radio frequency (RF) switch integrated circuits (ICs), thyristors, bipolar junction transistors (BJTs), logic gates, etc.), oscillators, power amplifiers, mixers, connectors, circulators, directional couplers, and/or any other type electronics hardware.

The device 106 may optionally include a wireless transceiver 125 connected to the optional antenna 120 and the processor 126. The antenna 120, wireless transceiver 125, and/or processor 126 may support communications using various RATs, such as one or more of Bluetooth, Wi-Fi, etc. The antenna 120 and wireless transceiver 125 may be optional as the device 106 may not communicate wireless with other devices in all scenarios. Additionally, and/or alternatively, the processor 126 and distance measurement circuit 128 may optionally support communications with other devices via the connection to the two-conductor wire 101. Support for communications via the distance measurement circuit 128 may be optional as the device 106 may not communicate via the two-conductor wire 101 with other devices in all scenarios. In an optional configuration, the processor 126, memory 129, distance measurement circuit 128, may be components of the same SIP 151.

In an optional configuration, the device 106 may include a display 131 connected to the processor 126 and/or power source 130. The display 131 may be a touch screen display, such as a resistive-sensing touchscreen, capacitive-sensing touchscreen infrared sensing touchscreen, or the like.

Figure 2:
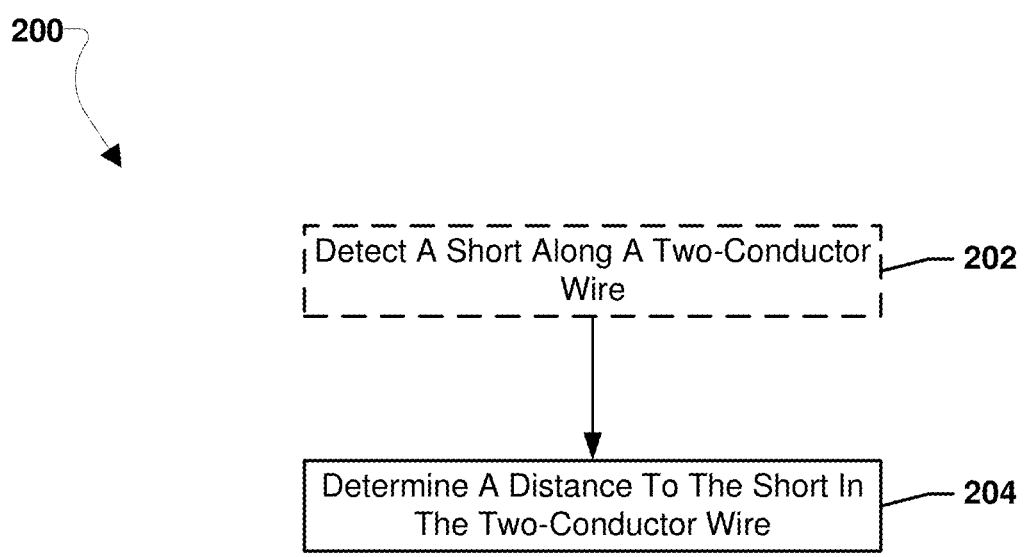
FIG. 2 is a process flow diagram illustrating a method for determining a distance to a short in a two-conductor wire in accordance with various embodiments.

FIG. 2 is a process flow diagram illustrating a method 200 for determining a distance to a short in a two-conductor wire in accordance with various embodiments. With reference to FIGS. 1A-2, the method 200 may be performed by a processor (e.g., 126) of a device (e.g., device 106). With reference to FIGS. 1A-2, the means for performing each of the operations of the method 200 may be one or more processors of a device (e.g., the device 106), such as one or more processors 126, and one or more distance measurement circuits of a device (e.g., the device 106), such as one or more distance measurement circuits 128.

In optional block 202, the processor may perform operations to detect a short along a two-conductor wire. For example, a distance measurement circuit (e.g., 128) may indicate a rapid current change in a two-conductor wire (e.g., 101) that may indicate a short (e.g., 109) has occurred. The processor may be configured to respond to the rapid current change as an indication of a short occurring. Block 202 may be optional as detection of a short may not be required in all scenarios. For example, the device 106 may be connected to the two-conductor wire 101 after a short has been identified by a system operator, thus detection of a short may not be needed.

In block 204, the processor may perform operations to determine a distance to the short in the two-conductor wire. For example, the processor may control a distance measurement circuit (e.g., 128) to determine a distance to a short (e.g., 109) in a two-conductor wire (e.g., 101) based at least in part on a phase difference between a voltage phase of an injected tone and a voltage phase of a reflected tone. As another example, the processor may control a distance measurement circuit (e.g., 128) to determine a distance to a short (e.g., 109) in a two-conductor wire (e.g., 101) based at least in part on a phase difference between a current phase of an injected tone and a current phase of a reflected tone. As another example, the processor may control a distance measurement circuit (e.g., 128) to determine a distance to a short (e.g., 109) in a two-conductor wire (e.g., 101) based at least in part on both: a phase difference between a voltage phase of an injected tone and a voltage phase of a reflected tone; and an amplitude different between a voltage amplitude of an injected tone and a voltage amplitude of a reflected tone. As another example, the processor may control a distance measurement circuit (e.g., 128) to determine a distance to a short (e.g., 109) in a two-conductor wire (e.g., 101) based at least in part on both: a phase difference between a current phase of an injected tone and a current phase of a reflected tone; and an amplitude different between a current amplitude of an injected tone and a current amplitude of a reflected tone. As another example, the processor may control a distance measurement circuit (e.g., 128) to determine a distance to a short (e.g., 109) in a two-conductor wire (e.g., 101) based at least in part on a measured peak voltage of a combined pulse.

In various embodiments, a short, such as short 109, may be controllably triggered. A controllable device connected to the two-conductor wire 101 may be controlled to close the short on demand for purposes of locating the controllable device along the two-conductor wire 101. Such controllable devices may be connected to the two-conductor wire 101 at various locations. To locate the controllable devices on the two-conductor wire 101, the controllable devices may be individually controlled (e.g., by a wireless signal or a signal sent over the two-conductor wire 101) to short two conductors of the two-conductor wire 101. After the short (e.g., short 109) is created, the distance to the short may be determined and thus the distance to the controllable device creating the short may be determined. Distances to multiple such controllable devices on the two-conductor wire 101 may be determined by sequentially controlling each controllable device to short the conductors, determining the distance, and then controlling the controllable device to un-short the conductors.

Figure 3A:
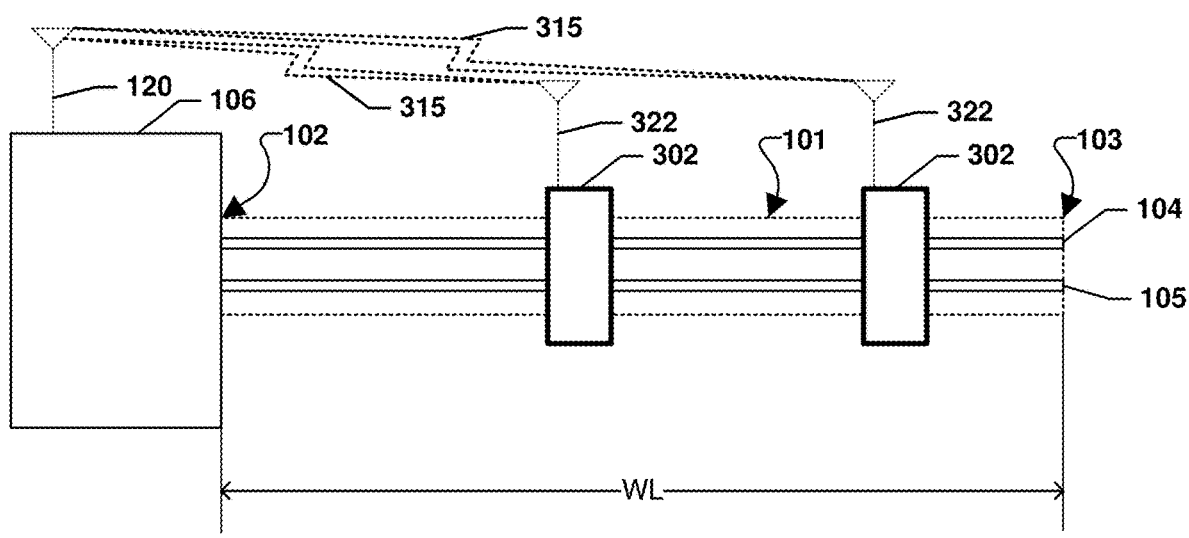
FIG. 3A is a system block diagram illustrating an example system including a two-conductor wire suitable for implementing various embodiments.

FIG. 3A illustrates an example system including the two-conductor wire 101 and the device 106 along with two controllable devices 302. With reference to FIGS. 1A-3A, the controllable devices 302 may be connected to the two-conductor wire 101 at various locations. The controllable devices 302 may be configured to create a short between two conductors of the two-conductor wire 101, such as between the first conductor 104 and the second conductor 105. The controllable devices 302 may be any type devices configured to be connected to the two-conductor wire 101. As an example, the controllable devices 302 may be IoT devices connected to the two-conductor wire 101. As another example, the controllable devices 302 may be networked devices connected to the two-conductor wire 101. While two controllable devices 302 are illustrated in FIG. 3A, any number of controllable devices 302 may be present on the two-conductor wire 101, such as one controllable device 302, two controllable devices 302, three controllable devices 302, more than three controllable devices 302, etc.

The controllable devices 302 may be permanently connected to the two-conductor wire 101 or the controllable devices 302 may be removably connected to the two-conductor wire 101. Whether permanently or removably connected to the two-conductor wire 101, the controllable devices 302 may be electrically connected to each of the first conductor 104 and the second conductor 105. In some embodiments, a controllable device 302 may optionally include an antenna 322 configured to send and/or receive electromagnetic radiation to support sending and/or receiving wireless signals by the controllable device 302. The antenna 322 may support communications using various RATs, such as Bluetooth Low Energy (BLE), Wi-Fi, etc.

In an optional configuration, the controllable devices 302 may communicate with the device 106 via wireless transmissions 315 between the device 106 and one or more of the controllable devices 302. Support for wireless communications by the controllable devices 302 may be optional as the controllable devices 302 may be controlled in other manners, such as via wired connections to the controllable devices 302. Additionally, and/or alternatively, the controllable devices 302 and the device 106 may optionally support communications with one another via their respective connections to the two-conductor wire 101. Support for communications via the two-conductor wire 101 between the controllable devices 302 and the device 106 may be optional as the controllable devices 302 may not communicate via the two-conductor wire 101 with in all scenarios. In some configurations, the device 106 may control the controllable devices 302 to cause one or more of the controllable devices 302 to create a short between the first conductor 104 and the second conductor 105 and/or to cause one or more of the controllable devices 302 to remove a short between the first conductor 104 and the second conductor 105.

Figure 3B:
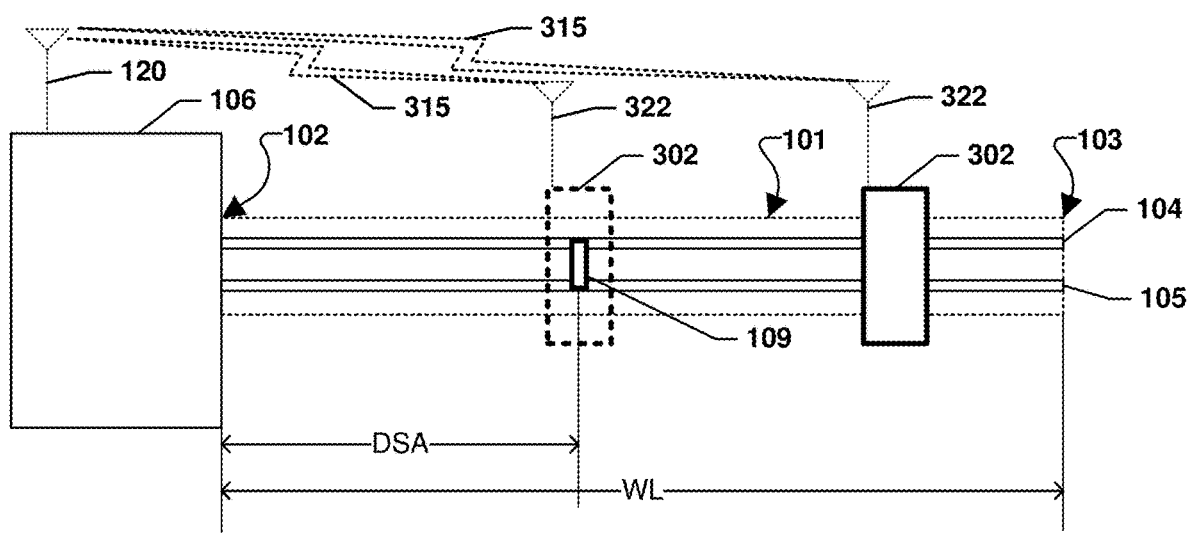
FIG. 3B is a system block diagram illustrating an example of a first short in the system of FIG. 3A.

FIG. 3B is a system block diagram illustrating an example of a first short 109 created by a first of the controllable devices 302. With reference to FIGS. 1A-3B, the short 109 may be created by the controllable device 302 closest to the first end 102. For example, the device 106 may signal to the controllable device 302 closest to the first end 102 to create the short 109. Similarly, the device 106 may signal the controllable device 302 closest to the second end 103 to not create a short. The control signal to cause the controllable device 302 to create the short 109 may be sent via wireless transmissions 315 and/or via the two-conductor wire 101. The distance to the short 109 created by the controllable device 302 closest to the first end 102 may be a distance, DSA, from the device 106. In various embodiments, the device 106 may be configured to determine a distance to the controllable device 302 closest to the first end 102 based on the distance to the short 109 in the two-conductor wire 101. As an example, the distance measurement circuit 128 of the device 106 may be configured to determine the distance, DSA, from the first end 102 to the short 109 in the two-conductor wire 101 as the distance to the controllable device 302 closest to the first end 102.

Figure 3C:
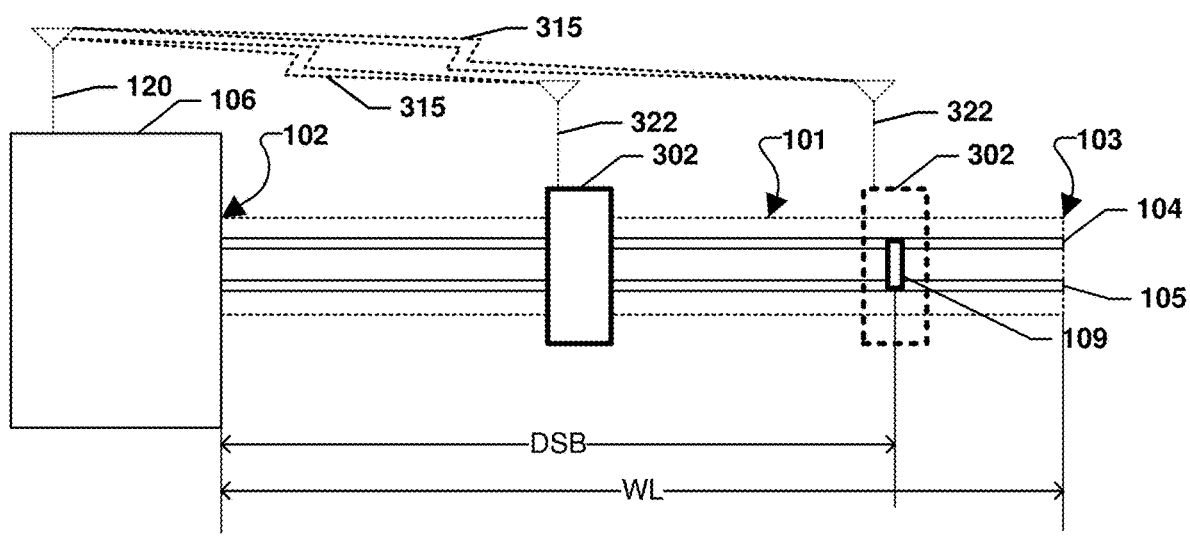
FIG. 3C is a system block diagram illustrating an example of a second short in the system of FIG. 3A.

Similarly, FIG. 3C is a system block diagram illustrating an example of a second short 109 created by a second of the controllable devices 302. With reference to FIGS. 1A-3C, the short 109 may be created by the controllable device 302 closest to the second end 103. For example, the device 106 may signal to the controllable device 302 closest to the second end 103 to create the short 109. Similarly, the device 106 may signal the controllable device 302 closest to the first end 102 to not create a short. The control signal to cause the controllable device 302 to create the short 109 may be sent via wireless transmissions 315 and/or via the two-conductor wire 101. The distance to the short 109 created by the controllable device 302 closest to the second end 103 may be a distance, DSB, from the device 106. The distance DSB may be different than the distance DSA. The controllable devices 302 may be uniquely identified by assigned identifiers, and the device 106 may uniquely signal each of the respective controllable devices 302 using that controllable device's 302 identifier such that only one of the controllable devices 302 creates a short 109 at any given time. In various embodiments, the device 106 may be configured to determine a distance to the controllable device 302 closest to the second end 103 based on the distance to the short 109 in the two-conductor wire 101. As an example, the distance measurement circuit 128 of the device 106 may be configured to determine the distance, DSB, from the first end 102 to the short 109 in the two-conductor wire 101 as the distance to the controllable device 302 closest to the second end 103.

Figure 3D:
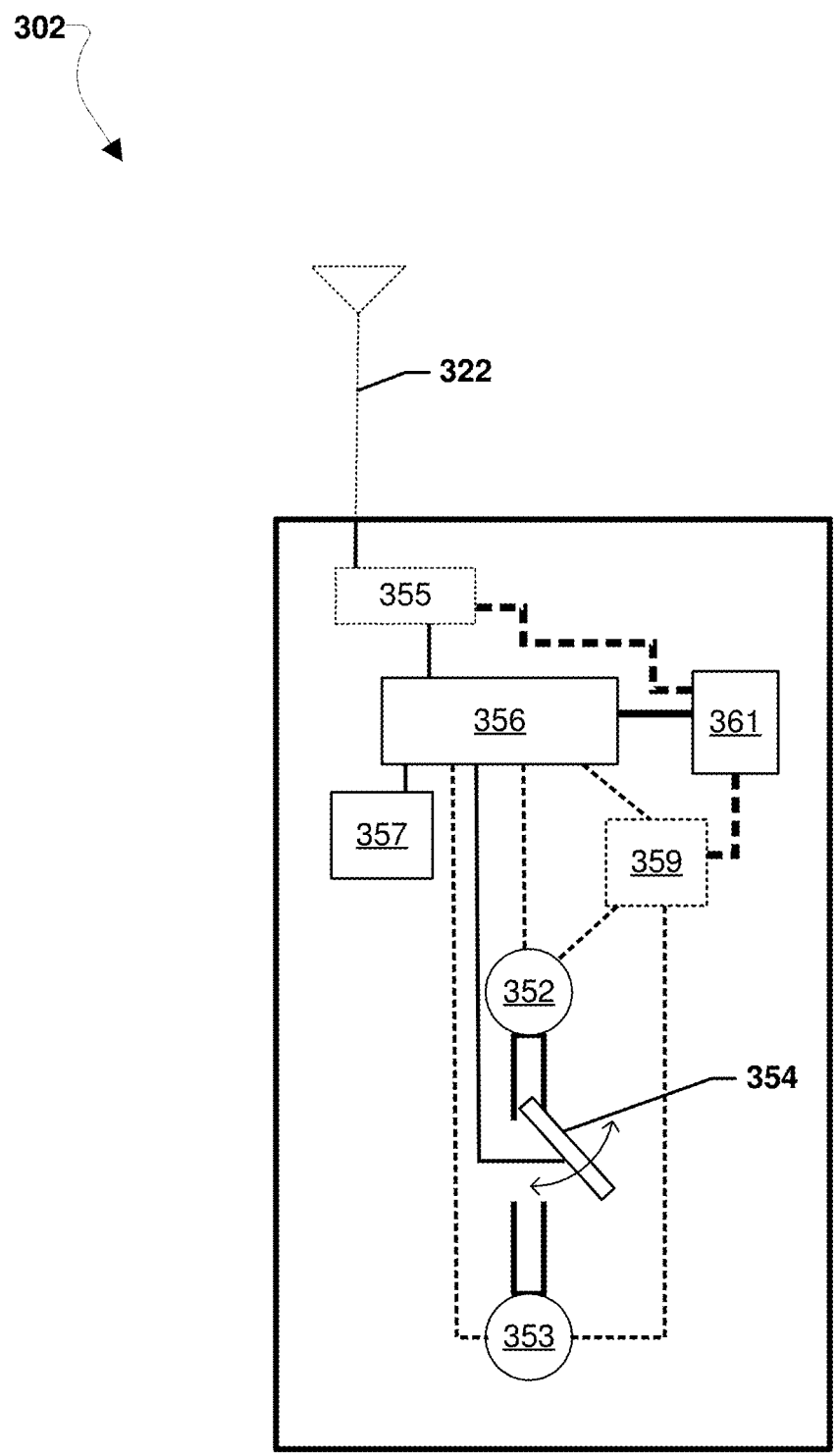
FIG. 3D is a component block diagram of a device configured to be connected to a two-conductor wire suitable for use with various embodiments.

FIG. 3D is a component block diagram of a controllable device 302 configured to be connected to a two-conductor wire, such as two-conductor wire 101. With reference to FIGS. 1A-3D, the device 302 may include a controllable switch 354 disposed between two connectors 352 and 353. For example, the controllable switch 354 may be any type switch, configured to be at least moved between two positions, such as opened and closed. As example, the controllable switch 354 may be one or more FETs, dedicated radio frequency (RF) switch integrated circuits (ICs), thyristors, BJTs, logic gates, etc. In various embodiments, the controllable switch 354 may be connected to a processor 356 that may be connected to a memory 357. The memory 357 may be a volatile or non-volatile memory. The processor 356 may be a dedicated processor, a SOC, or a SIP. The processor 356 and/or controllable switch 354 may be powered by a power source 361 of the controllable device 302, such as a battery, connection to an external power source, combination of battery and external power source, etc.

The connectors 352 and 353 may each be configured to connect to one of the conductors of a two-conductor wire, such as to the first conductor 104 or second conductor 105 of the two-conductor wire 101. The connectors 352 and 353 may electrically connect the controllable device 302 to the conductors 104, 105. The controllable switch 354 may be configured such that when the controllable switch 354 is closed, a short between the connectors 352 and 353, and thereby a short between the two conductors 104 and 105, may be created (e.g., short 109 may be created). The controllable switch 354 may be configured such that when the controllable switch 354 is opened, the connectors 352 and 353 may not be electrically connected with one another, and thereby a short between the connectors 352 and 353 may not occur. The controllable switch 354 may be connected to the processor 356 and may open and close responsive to signals from the processor 356.

The controllable device 302 may optionally include a wireless transceiver 355 connected to the optional antenna 322 and the processor 356. The antenna 322, wireless transceiver 355, and/or processor 356 may support communications using various RATs, such as one or more of Bluetooth, Wi-Fi, etc. The antenna 322 and wireless transceiver 355 may be optional as the controllable device 302 may not communicate wireless with other devices in all scenarios. Additionally, and/or alternatively, the processor 356 and connectors 352 and 353 may optionally support communications with other devices via the connection to the two-conductor wire 101. For example, an optional wired transceiver 359 may be connected to the processor 356 and support communications via the two-conductor wire 101.

Support for communications via the controllable device 302 may be optional as the controllable device 302 may not communicate via the two-conductor wire 101 with other devices in all scenarios. When present in the controllable device 302, the wireless transceiver 355 and/or wired transceiver 359 may be optionally connected to, and powered by, the power source 361.

Figure 4A:
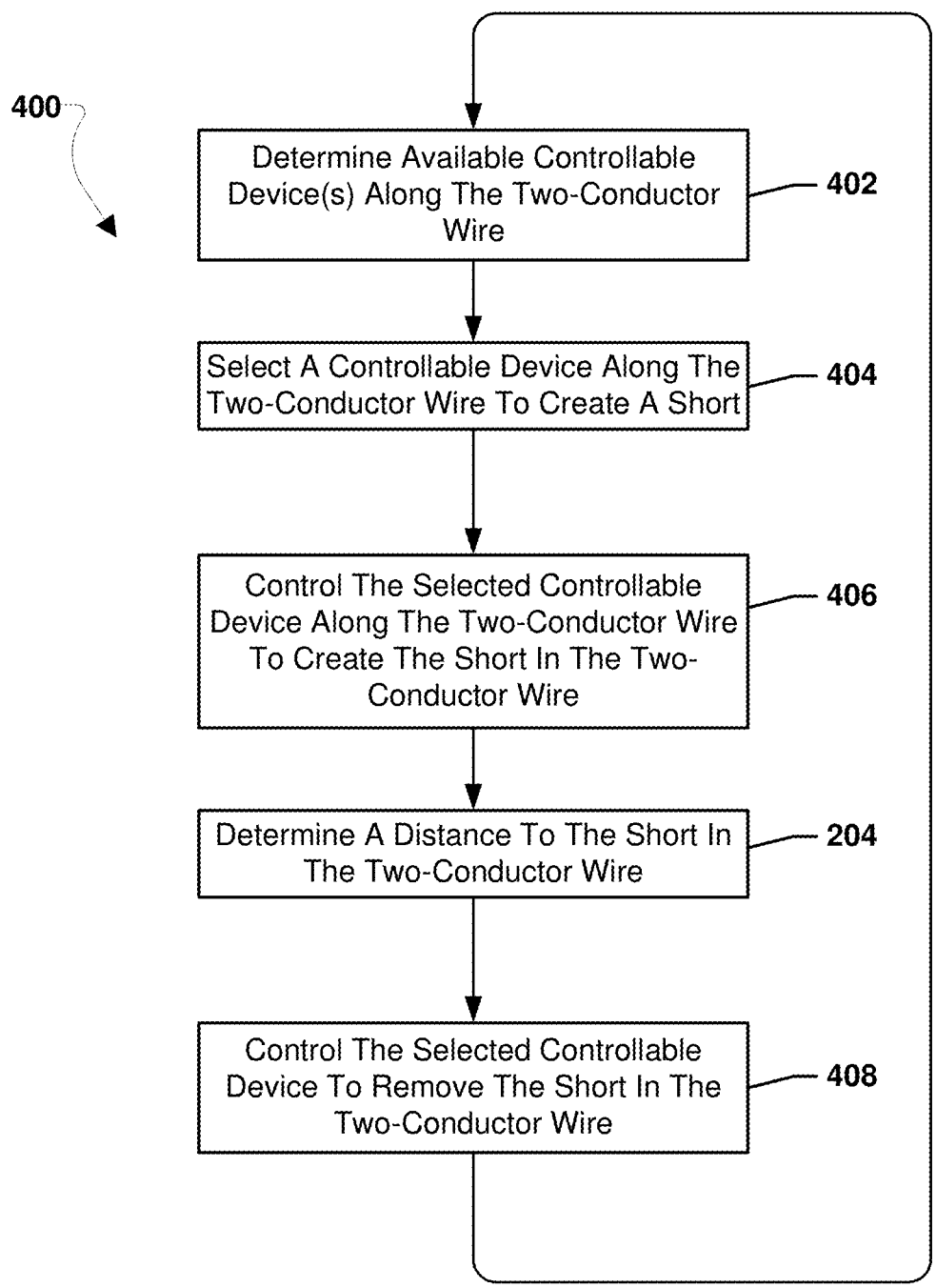
FIG. 4A is a process flow diagram illustrating a method for determining a distance to a short in a two-conductor wire in accordance with various embodiments.

FIG. 4A illustrates a method 400 for determining a distance to a short (e.g., short 109) in a two-conductor wire (e.g., 101) in accordance with various embodiments. With reference to FIGS. 1A-4A, the method 400 may be performed by a processor (e.g., 126) of a device (e.g., device 106). With reference to FIGS. 1A-4A, the means for performing each of the operations of the method 400 may be one or more processors of a device (e.g., the device 106), such as one or more processors 126, and one or more distance measurement circuits of a device (e.g., the device 106), such as one or more distance measurement circuits 128.

In block 402, the processor may perform operations to determine one or more available controllable devices along the two-conductor wire. In various embodiments, controllable devices (e.g., 302) may be uniquely identified by assigned identifiers. The controllable devices (e.g., 302) may transmit their identifiers, for example wirelessly (e.g., via their antennas 322) and/or via wired connections (e.g., via the two-conductor wire 101) and the processor may determine the determine one or more available controllable devices (e.g., 302) along the two-conductor wire (e.g., 101) based on the received identifiers (e.g., the identifiers received via wireless transmission 315 received by the antenna 120 and/or received via wired transmission received by the distance measurement circuit 128).

In block 404, the processor may perform operations to select a controllable device along the two-conductor wire to create a short. For example, the processor may select one of the one or more controllable devices (e.g., 302) to create a short.

In block 406, the processor may perform operations to control the selected controllable device along the two-conductor wire to create the short in the two-conductor wire. For example, the processor may send a signal to the selected controllable device (e.g., 302) including that controllable device's identifier and indicating that controllable device is to create a short (e.g., 109) in the two-conductor wire 101. The signal to the selected controllable device (e.g., 302) may be sent wirelessly (e.g., via wireless transmission 315 sent by the antenna 120) and/or sent along a wire (e.g., via wired transmission by the distance measurement circuit 128 along one or more conductors of the two-conductor wire 101). Optionally, the processor may send signals to the non-selected controllable devices (e.g., 302) indicating to those non-selected controllable devices to not create a short and/or remove any shorts created in the two-conductor wire (e.g., 101).

In block 204, the processor may perform operations of like numbered block of the method 200 (FIG. 2) to determine a distance to the short in the two-conductor wire as described. For example, the processor may control a distance measurement circuit (e.g., 128) to determine a distance to a short (e.g., 109) created by the selected controllable device (e.g., 302) in a two-conductor wire (e.g., 101) based at least in part on a phase difference between a voltage phase of an injected tone and a voltage phase of a reflected tone. As another example, the processor may control a distance measurement circuit (e.g., 128) to determine a distance to a short (e.g., 109) in a two-conductor wire (e.g., 101) based at least in part on a phase difference between a current phase of an injected tone and a current phase of a reflected tone. As another example, the processor may control a distance measurement circuit (e.g., 128) to determine a distance to a short (e.g., 109) in a two-conductor wire (e.g., 101) based at least in part on both: a phase difference between a voltage phase of an injected tone and a voltage phase of a reflected tone; and an amplitude different between a voltage amplitude of an injected tone and a voltage amplitude of a reflected tone. As another example, the processor may control a distance measurement circuit (e.g., 128) to determine a distance to a short (e.g., 109) in a two-conductor wire (e.g., 101) based at least in part on both: a phase difference between a current phase of an injected tone and a current phase of a reflected tone; and an amplitude different between a current amplitude of an injected tone and a current amplitude of a reflected tone. As another example, the processor may control a distance measurement circuit (e.g., 128) to determine a distance to a short (e.g., 109) created by the selected controllable device (e.g., 302) in a two-conductor wire (e.g., 101) based at least in part on a measured peak voltage of a combined pulse. In various embodiments, the processor may be configured to set the distance to the selected controllable device (e.g., 302) equal to the determined distance to the short (e.g., 109) in the two-conductor wire (e.g., 101).

In block 408, the processor may perform operations to control the selected controllable device to remove the short in the two-conductor wire. For example, the processor may send a signal to the selected controllable device (e.g., 302) including that controllable device's identifier and indicating that controllable device is to remove a short (e.g., 109) in the two-conductor wire 101. The signal to the selected controllable device (e.g., 302) may be sent wirelessly (e.g., via wireless transmission 315 sent by the antenna 120) and/or sent along a wire (e.g., via wired transmission by the distance measurement circuit 128 along one or more conductors of the two-conductor wire 101).

Figure 4B:
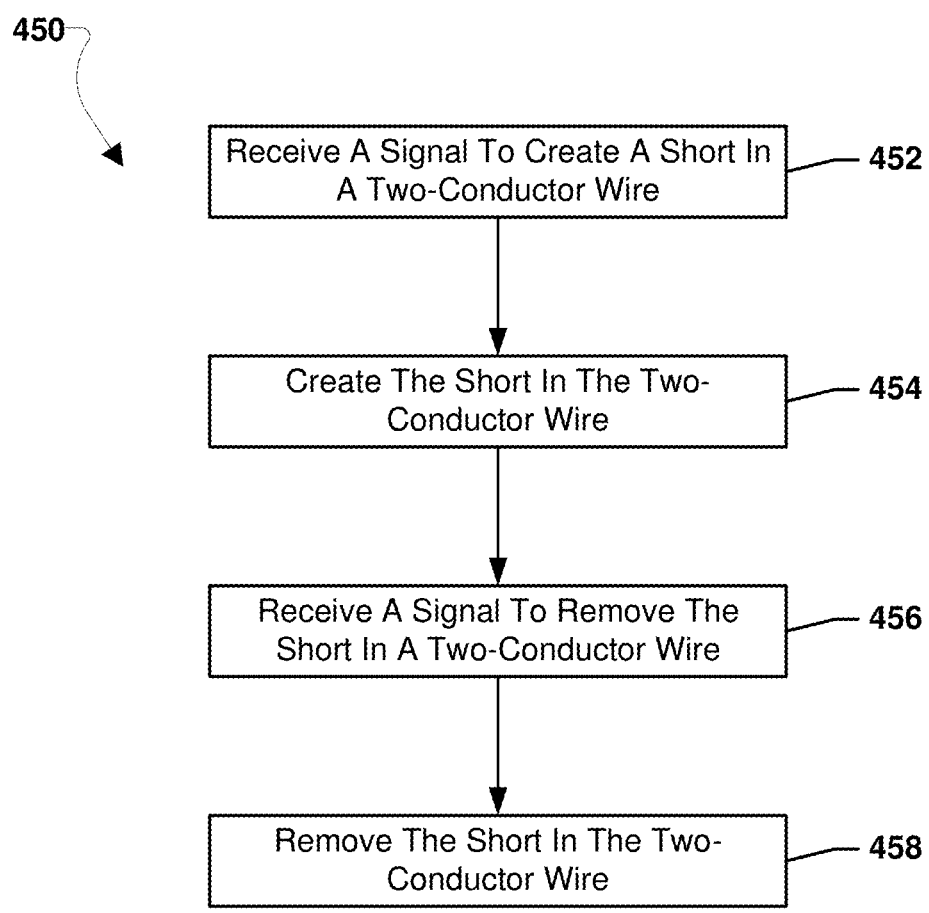
FIG. 4B is a process flow diagram illustrating a method for creating a short in a two-conductor wire in accordance with various embodiments.

FIG. 4B illustrates an embodiment method 450 for creating a short in a two-conductor wire (e.g., 101). With reference to FIGS. 1A-4B, the method 450 may be performed by a processor (e.g., 356) of a controllable device (e.g., controllable device 302). With reference to FIGS. 1A-4B, the means for performing each of the operations of the method 450 may be one or more processors of a controllable device (e.g., the controllable device 302), such as one or more processors 356, and one or more controllable switches of a controllable device (e.g., the controllable device 302), such as one or more controllable switches 354. In various embodiments, the operations of the method 450 may be performed in conjunction with the operations of the method 400 (FIG. 4A).

In block 452, the processor may perform operations to receive a signal to create a short in a two-conductor wire. For example, the processor may receive a signal from a device (e.g., 106) including the controllable device's identifier and indicating the controllable device is to create a short (e.g., 109) in the two-conductor wire 101. The signal from the device (e.g., 106) may be received wirelessly (e.g., via wireless transmission 315 received by the antenna 322) and/or received along a wire (e.g., via wired transmission along one or more conductors of the two-conductor wire 101). The signal may include an indication of the controllable device's identifier and an indication to create a short.

In block 454, the processor may perform operations to create the short in the two-conductor wire. For example, the processor (e.g., 356) may send a signal to a controllable switch (e.g., 354) to cause the controllable switch (e.g., 354) to close. The controllable switch (e.g., 354) may be configured such that when the controllable switch (e.g., 354) is closed, connectors (e.g., 352 and 353) connected to the two-conductor wire (e.g., 101) are electrically connected to one another thereby creating a short (e.g., 109) between conductors (e.g., 104 and 105).

In block 456, the processor may perform operations to receive a signal to remove the short in a two-conductor wire. For example, the processor may receive a signal from a device (e.g., 106) including the controllable device's identifier and indicating the controllable device is to remove a short (e.g., 109) in the two-conductor wire 101. The signal from the device (e.g., 106) may be received wirelessly (e.g., via wireless transmission 315 received by the antenna 322) and/or received along a wire (e.g., via wired transmission along one or more conductors of the two-conductor wire 101). The signal may include an indication of the controllable device's identifier and an indication to remove a short.

In block 458, the processor may perform operations to remove the short in the two-conductor wire. For example, the processor (e.g., 356) may send a signal to a controllable switch (e.g., 354) to cause the controllable switch (e.g., 354) to open. The controllable switch (e.g., 354) may be configured such that when the controllable switch (e.g., 354) is open, connectors (e.g., 352 and 353) connected to the two-conductor wire (e.g., 101) are electrically isolated from one another thereby removing (or preventing) a short (e.g., 109) between conductors (e.g., 104 and 105).

Figure 5A:
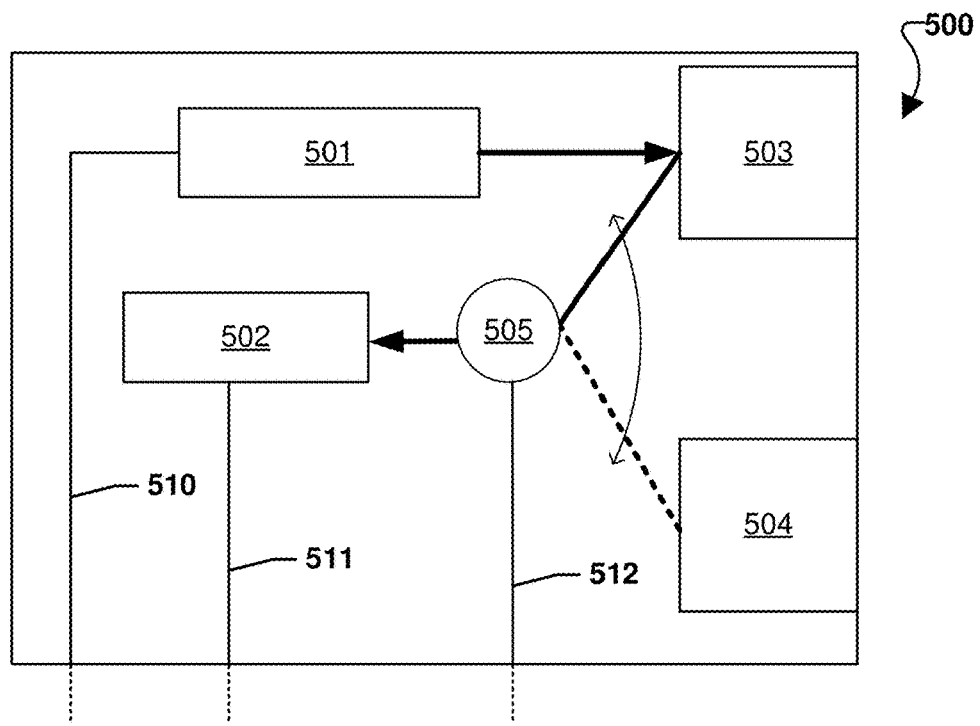
FIG. 5A illustrates an example distance measurement circuit in accordance with various embodiments.

FIG. 5A illustrates an example distance measurement circuit 500 in accordance with various embodiments. With reference to FIGS. 1A-5A, the circuit 500 may be an example of a configuration of a distance measurement circuit, such as distance measurement circuit 128. With reference to FIGS. 1A-5A, the distance measurement circuit 500 may be an example means for performing at least a portion of the operations of the methods 200 (FIG. 2) and/or 400 (FIG. 4A). The distance measurement circuit 500 may be a SOC or a SIP. The distance measurement circuit 500 may be configured to enable determination of a distance to a short (e.g., 109) in a two-conductor wire (e.g., 101). The distance measurement circuit 500 may be configured to enable determination of a distance to a short (e.g., 109) based at least in part on a phase difference between a voltage phase of an injected tone and a voltage phase of a reflected tone. The distance measurement circuit 500 may be configured to enable determination of a distance to a short (e.g., 109) based at least in part on a phase difference between a current phase of an injected tone and a current phase of a reflected tone. The distance measurement circuit 500 may be configured to enable determination of a distance to a short (e.g., 109) based at least in part on both: a phase difference between a voltage phase of an injected tone and a voltage phase of a reflected tone; and an amplitude difference between a voltage amplitude of an injected tone and a voltage amplitude of a reflected tone. The distance measurement circuit 500 may be configured to enable determination of a distance to a short (e.g., 109) based at least in part on both: a phase difference between a current phase of an injected tone and a current phase of a reflected tone; and an amplitude difference between a current amplitude of an injected tone and a current amplitude of a reflected tone.

The distance measurement circuit 500 may include two radios 501 and 502. As an example, the two radios 501 and 502 may each be Bluetooth Low Energy (BLE) radios configured to perform angle-of-arrival (AoA) measurements according to the BLE protocol. The distance measurement circuit 500 may include a first connector 503 and a second connector 504. The first connector 503 may be an electrical connector configured to electrically connect the distance measurement circuit 500 to a conductor of a two-conductor wire, such as the first conductor 104 of the two-conductor wire 101. The second connector 504 may be an electrical connector configured to electrically connect the distance measurement circuit 500 to a conductor of a two-conductor wire, such as the second conductor 105 of the two-conductor wire 101. The first connector 503 and the second connector 504 may be electrically isolated from one another.

The first radio 501 may be connected to the first connector 503. For example, the antenna connection of the first radio 501 may be wired to the first connector 503. In this manner, instead of generating wireless transmissions via an antenna or receiving wireless transmissions via an antenna, the first radio 501 may output wired communications to the first connector 503 and thereby onto a conductor of a two-conductor wire connected to the first connector 503, such as the first conductor 104 of the two-conductor wire 101, or receive wired communications from the first connector 503 received via a conductor of a two-conductor wire connected to the first connector 503, such as the first conductor 104 of the two-conductor wire 101.

The second radio 502 may be connected to a controllable switch 505. The antenna connection of the second radio 502 may be connected to the controllable switch 505. The controllable switch 505 may be any type switch, configured to be at least moved between two positions, such as opened and closed. As example, the controllable switch 505 may be one or more FETs, dedicated RF switch ICs, thyristors, BJTs, logic gates, etc. The controllable switch 505 may be controlled to connect the second radio 502 to the first connector 503 or the second connector 504. In this manner, instead of generating wireless transmissions via an antenna or receiving wireless transmissions via an antenna, when the controllable switch 505 connects the second radio 502 to the first connector 503, the second radio 502 may output wired communications to the first connector 503 and thereby onto a conductor of a two-conductor wire connected to the first connector 503, such as the first conductor 104 of the two-conductor wire 101, or receive wired communications from the first connector 503 received via a conductor of a two-conductor wire connected to the first connector 503, such as the first conductor 104 of the two-conductor wire 101. In a similar manner, instead of generating wireless transmissions via an antenna or receiving wireless transmissions via an antenna, when the controllable switch 505 connects the second radio 502 to the second connector 504, the second radio 502 may output wired communications to the second connector 504 and thereby onto a conductor of a two-conductor wire connected to the second connector 504, such as the second conductor 105 of the two-conductor wire 101, or receive wired communications from the second connector 504 received via a conductor of a two-conductor wire connected to the second connector 504, such as the second conductor 105 of the two-conductor wire 101.

In various embodiments, the controllable switch 505 may be connected to a processor of a device, such as processor 126 of device 106, by a connection 512. Via the connection 512, the processor (e.g., 126) may control the operations of the controllable switch 505. For example, the processor (e.g., 126) may send signals to the controllable switch 505 to cause the controllable switch 505 to connect the second radio 502 to the first connector 503 or the second radio 502 to the second connector 504.

The first radio 501 may be connected to a processor of a device, such as processor 126 of device 106, by a connection 510. Via the connection 510, the processor (e.g., 126) may control the operations of the first radio 501. For example, the processor (e.g., 126) may send signals to the first radio 501 to output one or more tones. As an example, the processor (e.g., 126) may control the first radio 501 to transmit AoA packets per the BLE protocol.

The second radio 502 may be connected to a processor of a device, such as processor 126 of device 106, by a connection 511. Via the connection 511, the processor (e.g., 126) may control the operations of the second radio 511. For example, the processor (e.g., 126) may send signals to the second radio 502 to cause the second radio 511 to receive one or more tones. As an example, the processor (e.g., 126) may control the second radio 511 to receive AoA packets per the BLE protocol. In various embodiments, the processor (e.g., 126) may control the first radio 501 and the second radio 502 via their respective connections 510 and 511 to communicate with one another and perform connected BLE AoA measurements.

In various embodiments, the processor (e.g., 126) may control the first radio 501 to inject one or more tones into the first connector 503. The processor (e.g., 126) may control controllable switch 505 to connect the second radio 502 to the first connector 503 and the processor (e.g., 126) may control the second radio 502 to measure the one or more tones injected by the first radio 501. For example, the second radio 502 may be controlled to capture the phase samples (e.g., in-phase/quadrature (I/Q) samples) and/or amplitude samples of a tone injected by the first radio 501. Specifically, the second radio 502 may be controlled to measure a voltage phase of a tone injected by the first radio 501 and/or a current phase of a tone injected by the first radio 501. The phase samples (e.g., the voltage phase, the current phase, etc.) may be provided by the second radio 501 to the processor (e.g., 126). Specifically, the second radio 502 may be controlled to measure a voltage amplitude of a tone injected by the first radio 501 and/or a current amplitude of a tone injected by the first radio 501. The amplitude samples (e.g., the voltage amplitude, the current amplitude, etc.) may be provided by the second radio 501 to the processor (e.g., 126). The processor (e.g., 126) may control controllable switch 505 to connect the second radio 502 to the second connector 504 and the processor (e.g., 126) may control the second radio 502 to measure the one or more tones received at the second connector 504. For example, the second radio 502 may be controlled to capture the phase samples (e.g., I/Q samples) and/or amplitude samples of a tone received at the second connector 504. Specifically, the second radio 502 may be controlled to measure a voltage phase of a tone received at the second connector 504 and/or a current phase of a tone received at the second connector 504. The phase samples (e.g., the voltage phase, the current phase, etc.) may be provided by the second radio 501 to the processor (e.g., 126). Specifically, the second radio 502 may be controlled to measure a voltage amplitude of a tone received at the second connector 504 and/or a current amplitude of a tone received at the second connector 504. The amplitude samples (e.g., the voltage amplitude, the current amplitude, etc.) may be provided by the second radio 501 to the processor (e.g., 126).

To illustrate operations of the example distance measurement circuit 500, reference is made to an implementation in which a short (e.g., 109) has occurred between the first conductor 104 and the second conductor 105 of the two-conductor wire 101 and the first connector 503 is connected to the first conductor 104 and the second connector 504 is connected to the second conductor 105. In this implementation, the injected tone from the first radio 501 may be sampled (e.g., the voltage phase measured, the current phase measured, the voltage amplitude measured, and/or the current amplitude measured) by the second radio 501 when injected. The injected tone may travel through the first conductor 104 across the short (e.g., 109) and be returned along the second conductor 105 to the second connector 504 as a reflected tone. The reflected tone may have a phase difference (e.g., a different voltage phase and/or different current phase) than the injected tone and/or the reflected tone may have an amplitude difference (e.g., a different voltage amplitude and/or different current amplitude) than the injected tone. The controllable switch 505 may be controlled (e.g., by the processor 126) to connect the second radio 502 to the second connector 504. The controllable switch 505 may be controlled (e.g., by the processor 126) to connect the second radio 502 to the second connector 504 such that the second radio 502 may collect a sample at a sample separation of the sampling of the injected tone, such as 1 microsecond (µs) between sampling the injected tone and the reflected tone. The second radio 502 may sample (e.g., the voltage phase measured, the current phase measured, the voltage amplitude measured, and/or the current amplitude measured) the reflected tone received at the second connector 504. The samples of the injected tone and the reflected tone (e.g., the measurement of the voltage phase of the injected tone and the measurement of the voltage phase of the reflected tone, the measurement of the current phase of the injected tone and the measurement of the current phase of the reflected tone, the measurement of the voltage amplitude of the injected tone and the measurement of the voltage amplitude of the reflected tone, and/or the measurement of the current amplitude of the injected tone and the measurement of the current amplitude of the reflected tone) may be passed by the second radio 502 to the processor (e.g., the processor 126). The phase difference between the injected tone and reflected tone may be determined based on the samples. The amplitude difference between the injected tone and reflected tone may be determined based on the samples. In various embodiments, the injected tone or tones may be BLE carriers, and the injected tones and reflected tones may be sampled for each BLE carrier. For example, all thirty-seven BLE carriers of the thirty-seven BLE channels may be sampled respectively as an injected tone and reflected tone pair with 1 µs spacing between associated injected tone and reflected tone samples.

Figure 5B:
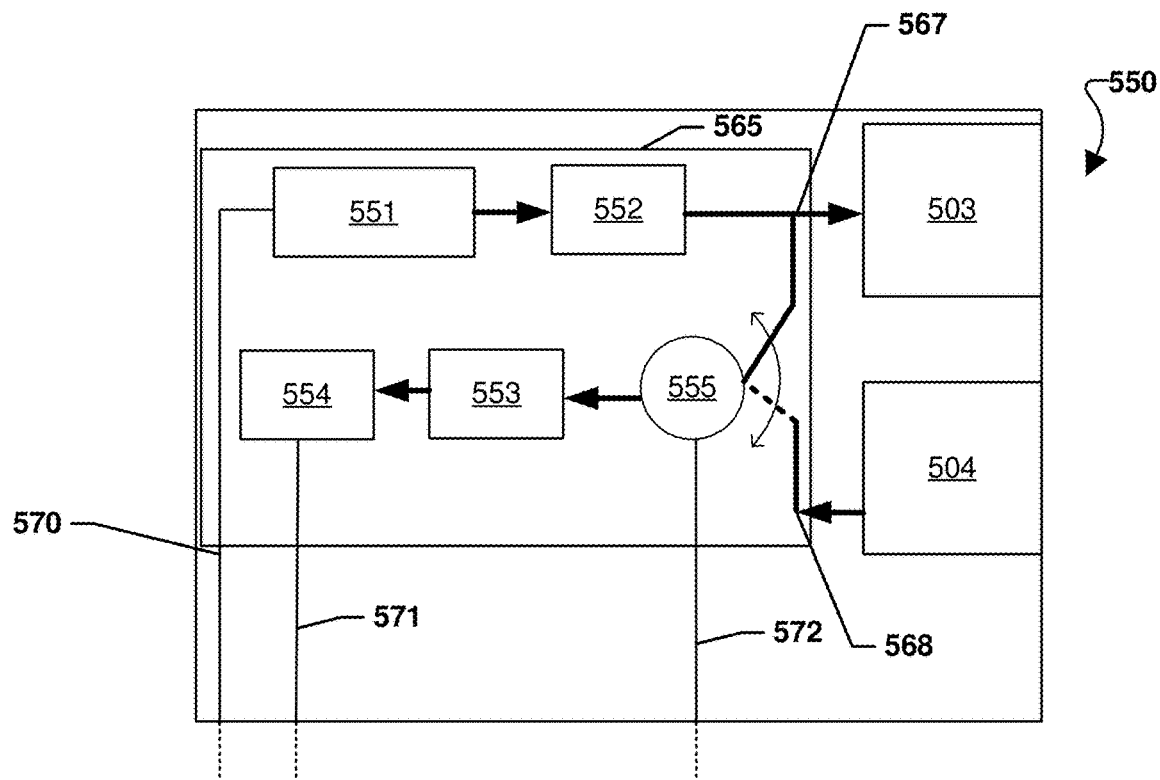
FIG. 5B illustrates an example distance measurement circuit in accordance with various embodiments.

FIG. 5B illustrates an example distance measurement circuit 550 in accordance with various embodiments. With reference to FIGS. 1A-5B, the circuit 550 may be an example of a configuration of a distance measurement circuit, such as distance measurement circuit 128. With reference to FIGS. 1A-5B, the distance measurement circuit 550 may be an example means for performing at least a portion of the operations of the methods 200 (FIG. 2) and/or 400 (FIG. 4A). The distance measurement circuit 550 may be a SOC or a SIP. The distance measurement circuit 550 may be configured to enable determination of a distance to a short (e.g., 109) in a two-conductor wire (e.g., 101). The distance measurement circuit 550 may be configured to enable determination of a distance to a short (e.g., 109) based at least in part on a phase difference between a voltage phase of an injected tone and a voltage phase of a reflected tone. The distance measurement circuit 550 may be configured to enable determination of a distance to a short (e.g., 109) based at least in part on a phase difference between a current phase of an injected tone and a current phase of a reflected tone. The distance measurement circuit 550 may be configured to enable determination of a distance to a short (e.g., 109) based at least in part on both: a phase difference between a voltage phase of an injected tone and a voltage phase of a reflected tone; and an amplitude difference between a voltage amplitude of an injected tone and a voltage amplitude of a reflected tone. The distance measurement circuit 550 may be configured to enable determination of a distance to a short (e.g., 109) based at least in part on both: a phase difference between a current phase of an injected tone and a current phase of a reflected tone; and an amplitude difference between a current amplitude of an injected tone and a current amplitude of a reflected tone. As one example, the distance measurement circuit 550 may differ from the distance measurement circuit 500 in that the distance measurement circuit 550 may include a single radio 565 which the distance measurement circuit 500 includes two radios 501 and 502.

The radio 565 may include a local oscillator (LO) 551 connected to a power amplifier 552 (PA). The LO 551 may be connected to a processor of a device, such as processor 126 of device 106, by a connection 570. Via the connection 570, the processor (e.g., 126) may control the operations of the LO 551. For example, the processor (e.g., 126) may send signals to the LO 551 to output one or more tones. As an example, the processor (e.g., 126) may control the LO 551 to output carrier tones, such as one or more of the seventy-nine Bluetooth carrier tones between the frequencies of 2402 mega-hertz (MHz) and 2480 MHz.

The radio 565 may include a mixer 553 connected to an analog-to-digital (ADC) converter 554. The ADC 554 may be connected to a processor of a device, such as processor 126 of device 106, by a connection 571. Via the connection 571, the processor (e.g., 126) may control the operations of the ADC 554 and/or receive outputs from the ADC 554. For example, the processor (e.g., 126) may receive indications of captured phase samples (e.g., in-phase/quadrature (I/Q) samples) from the ADC 554.

The radio 565 may include an output connection 567 that may be connected to the PA 552 and the first connector 503. The output of the PA 552 may be provided to the output connection 567 of the radio 565 and thereby onto a conductor of a two-conductor wire connected to the first connector 503, such as the first conductor 104 of the two-conductor wire 101. The radio 565 may include an input connection 568 that may be connected to the second connector 504. Tones from a conductor of a two-conductor wire connected to the second connector 504, such as the second conductor 105 of the two-conductor wire 101, may be provided to the input connection 568 of the radio 565.

The mixer 553 may be connected to a controllable switch 555. The controllable switch 555 may be any type switch, configured to be at least moved between two positions, such as opened and closed. As example, the controllable switch 555 may be one or more FETs, dedicated RF switch ICs, thyristors, BJTs, logic gates, etc. The controllable switch 555 may be controlled to connect the mixer 553 to the output connection 567 or the input connection 568. In this manner, when the controllable switch 555 connects the mixer 553 to the output connection 567, the mixer 553 may also receive tones output by the PA 552 in addition to those tones traveling to the first connector 503. In a similar manner, when the controllable switch 555 connects the mixer 553 to the input connection 568, the mixer 553 may receive tones received at the input connection 568.

In various embodiments, the controllable switch 555 may be connected to a processor of a device, such as processor 126 of device 106, by a connection 572. Via the connection 572, the processor (e.g., 126) may control the operations of the controllable switch 555. For example, the processor (e.g., 126) may send signals to the controllable switch 555 to cause the controllable switch 555 to connect the mixer 553 to the output connection 567 or the input connection 568.

In various embodiments, the processor (e.g., 126) may control the LO 551 and PA 552 to inject one or more tones into the first connector 503 via the output connection 567. The processor (e.g., 126) may control controllable switch 555 to connect the mixer 553 to the output connection 567 and the processor (e.g., 126) may control the mixer 553 and ADC 554 to measure the one or more tones injected by the LO 551 and PA 552. For example, the mixer 553 and ADC 554 may be controlled to capture the phase samples (e.g., in-phase/quadrature (I/Q) samples) of a tone injected by the LO 551 and PA 552 and/or to capture the amplitude samples of the tone injected by the LO 551 and PA 552. Specifically, the mixer 553 and ADC 554 may be controlled to: measure a voltage phase of a tone injected by the LO 551 and PA 552; measure a current phase of a tone injected by the LO 551 and PA 552; measure a voltage amplitude of a tone injected by the LO 551 and PA 552; and/or measure a current amplitude of a tone injected by the LO 551 and PA 552. The samples, such as phase samples (e.g., the voltage phase and/or the current phase), amplitude samples (e.g., the voltage amplitude and/or the current amplitude), etc., may be provided by the ADC 554 to the processor (e.g., 126). The processor (e.g., 126) may control controllable switch 555 to connect the mixer 553 to the input connection 568 and the processor (e.g., 126) may control the mixer 553 and ADC 554 to measure the one or more tones received at the input connection 568. For example, the mixer 553 and ADC 554 may be controlled to capture the phase samples (e.g., I/Q samples) of a tone received at the input connection 568 and/or to capture the amplitude samples of a tone received at the input connection 568. Specifically, the mixer 553 and ADC 554 may be controlled to: measure a voltage phase of a tone received at the input connection 568; measure a current phase of a tone received at the input connection 568; measure a voltage amplitude of a tone received at the input connection 568; and/or measure a current amplitude of a tone received at the input connection 568. The samples, such as phase samples (e.g., the voltage phase and/or the current phase), amplitude samples (e.g., the voltage amplitude and/or the current amplitude), etc., may be provided by the ADC 554 to the processor (e.g., 126).

To illustrate operations of the example distance measurement circuit 550, reference is made to an implementation in which a short (e.g., 109) has occurred between the first conductor 104 and the second conductor 105 of the two-conductor wire 101 and the first connector 503 is connected to the first conductor 104 and the second connector 504 is connected to the second conductor 105. In this implementation, the injected tone from the LO 551 and PA 552 may be sampled (e.g., the voltage phase measured, the current phase measured, the voltage amplitude measured, and/or the current amplitude measured) by the mixer 553 and ADC 554 when injected. The injected tone may travel through the output connection 567, first connector 503, and the first conductor 104 across the short (e.g., 109) and be returned along the second conductor 105 to the second connector 504 and input connection 568 as a reflected tone. The reflected tone may have a phase difference (e.g., a different voltage phase and/or a different current phase) and/or an amplitude difference (e.g., a different voltage amplitude and/or a different voltage phase) than the injected tone. The controllable switch 555 may be controlled (e.g., by the processor 126) to connect the mixer 553 to the input connection 568. The controllable switch 555 may be controlled (e.g., by the processor 126) to connect the mixer 553 to the input connection 568 such that the mixer 553 and ADC 554 may collect a sample at a sample separation of the sampling of the injected tone. The mixer 553 and ADC 554 may sample (e.g., the voltage phase measured, the current phase measured, the voltage amplitude measured, and/or the current amplitude measured) the reflected tone received at the input connection 568. The samples of the injected tone and the reflected tone (e.g., the measurement of the voltage phase of the injected tone and the measurement of the voltage phase of the reflected tone, the measurement of the current phase of the injected tone and the measurement of the current phase of the reflected tone, the measurement of the voltage amplitude of the injected tone and the measurement of the voltage amplitude of the reflected tone, and/or the measurement of the current amplitude of the injected tone and the measurement of the current amplitude of the reflected tone) may be passed by the ADC 554 to the processor (e.g., the processor 126). The phase difference between the injected tone and reflected tone may be determined based on the samples. The amplitude difference between the injected tone and reflected tone may be determined based on the samples. In various embodiments, the injected tone or tones may be Bluetooth carriers, and the injected tones and reflected tones may be sampled for each Bluetooth carrier frequency. For example, all seventy-nine Bluetooth carriers may be sampled respectively as an injected tone and reflected tone pair.

Figure 5C:
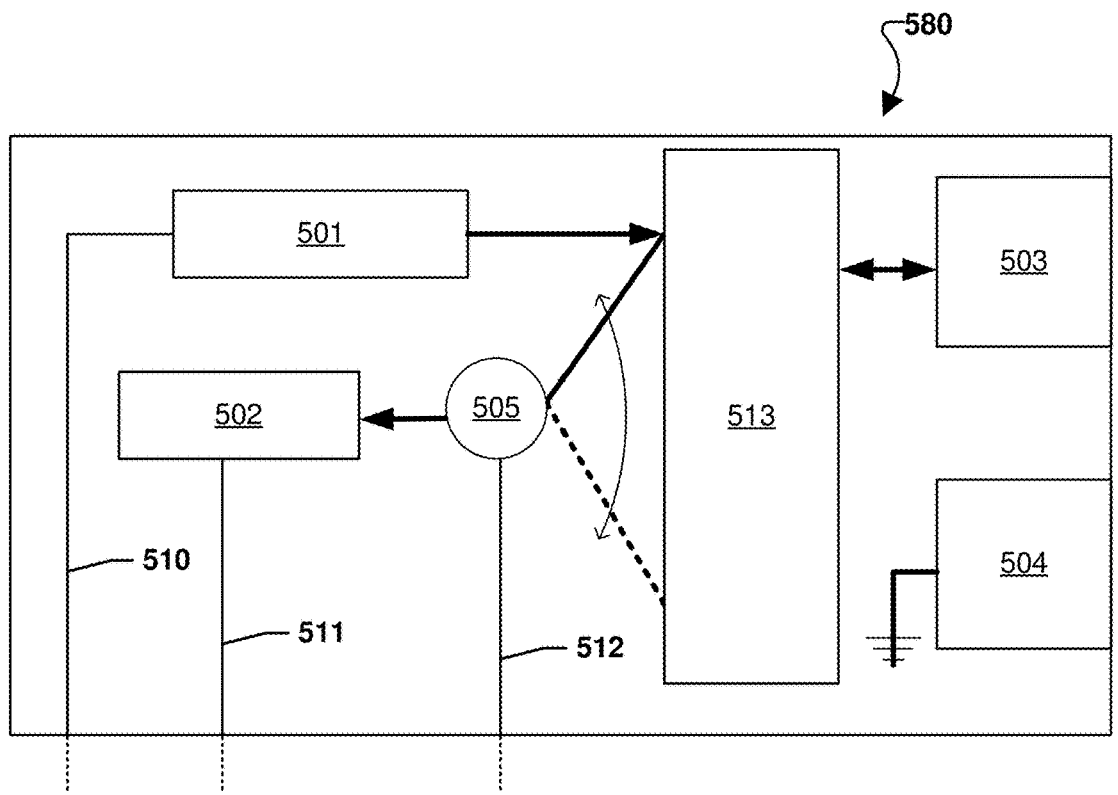
FIG. 5C illustrates an example distance measurement circuit in accordance with various embodiments.

FIG. 5C illustrates an example distance measurement circuit 580 in accordance with some embodiments. With reference to FIGS. 1A-5C, the circuit 580 may be an example of a configuration of a distance measurement circuit, such as distance measurement circuit 128. The distance measurement circuit 580 may be an example means for performing at least a portion of the operations of the methods 200 (FIG. 2) and/or 400 (FIG. 4A). The distance measurement circuit 580 may be an SOC or an SIP. The distance measurement circuit 580 may be configured to enable determination of a distance to a short (e.g., 109) in a two-conductor wire (e.g., 101). The distance measurement circuit 580 may be configured to enable determination of a distance to a short (e.g., 109) based at least in part on a phase difference between a voltage phase of an injected tone and a voltage phase of a reflected tone. The distance measurement circuit 580 may be configured to enable determination of a distance to a short (e.g., 109) based at least in part on a phase difference between a current phase of an injected tone and a current phase of a reflected tone. The distance measurement circuit 580 may be configured to enable determination of a distance to a short (e.g., 109) based at least in part on both: a phase difference between a voltage phase of an injected tone and a voltage phase of a reflected tone; and an amplitude difference between a voltage amplitude of an injected tone and a voltage amplitude of a reflected tone. The distance measurement circuit 580 may be configured to enable determination of a distance to a short (e.g., 109) based at least in part on both: a phase difference between a current phase of an injected tone and a current phase of a reflected tone; and an amplitude difference between a current amplitude of an injected tone and a current amplitude of a reflected tone. As an example, the distance measurement circuit 580 may differ from the distance measurement circuit 500 in that the distance measurement circuit 580 may include a directional coupler 513 and that in the distance measurement circuit 580, the second connector 504 may be grounded.

The directional coupler 513 may be configured to separate an input signal passed into the first connector 503, such as an injected tone, from an output signal from the first connector 503, such as a reflected tone. In the distance measurement circuit 580, the first connector 503 may be connected to the directional coupler 513 while the second connector 504 is grounded. The directional coupler 513 may include an input port configured to receive tones as input signals from the first radio 501. The directional coupler 513 be connected to the first connector 503 and may send injected tones to the first connector 503 and receive reflected tones from the first connector 503. The directional coupler 513 may include an output port configured to output reflected tones received from the first connector 503. In the distance measurement circuit 580, the controllable switch 505 may connect the second radio 502 to the input port of the directional coupler 513 or the second radio 502 to the output port of the directional coupler 513.

To illustrate operations of the example distance measurement circuit 580, reference is made to an implementation in which a short (e.g., 109) has occurred between the first conductor 104 and the second conductor 105 of the two-conductor wire 101 and the first connector 503 is connected to the first conductor 104 and the second connector 504 is connected to the second conductor 105. In this implementation, the injected tone from the first radio 501 may be sampled (e.g., the voltage phase measured, the current phase measured, the voltage amplitude measured, and/or the current amplitude measured) by the second radio 501 when injected at the input port of the directional coupler 513. The injected tone may be received at the input port of the directional coupler 513 and passed by the directional coupler 513 to the first connector 503. The injected tone may be reflected from the short (e.g., 109) back along the first conductor 104 to the first connector 503 as a reflected tone. The reflected tone may have a phase difference (e.g., a different voltage phase and/or a different current phase) than the injected tone and/or an amplitude difference (e.g., a different voltage amplitude and/or a different current amplitude) than the injected tone. The reflected tone from the first connector 503 may be passed by the directional coupler 513 to the output port of the directional coupler 513. The controllable switch 505 may be controlled (e.g., by the processor 126) to connect the second radio 502 to the output port of the directional coupler 513. The controllable switch 505 may be controlled (e.g., by the processor 126) to connect the second radio 502 to the output port of the directional coupler 513 such that the second radio 502 may collect a sample at a sample separation of the sampling of the injected tone, such as 1 µs between sampling the injected tone and the reflected tone. The second radio 502 may sample (e.g., the voltage phase measured, the current phase measured, the voltage amplitude measured, and/or the current amplitude measured) the reflected tone received at the output port of the directional coupler 513. Samples of the injected tone and the reflected tone may be measurements of the voltage phase of the injected tone and the measurements of the voltage phase of the reflected tone, measurements of the current phase of the injected tone and the measurement of the current phase of the reflected tone, measurements of the voltage amplitude of the injected tone and the measurement of the voltage amplitude of the reflected tone, and/or measurements of the current amplitude of the injected tone and the measurement of the current amplitude of the reflected tone. The samples of the injected tone and the reflected tone may be passed by the second radio 502 to the processor (e.g., the processor 126). The phase difference between the injected tone and reflected tone may be determined based on the samples and/or the voltage difference between the injected tone and reflected tone may be determined based on the samples. In some embodiments, the injected tone or tones may be BLE carriers, and the injected tones and reflected tones may be sampled for each BLE carrier. For example, all thirty-seven BLE carriers of the thirty-seven BLE channels may be sampled respectively as an injected tone and reflected tone pair with 1 µs spacing between associated injected tone and reflected tone samples.

Figure 5D:
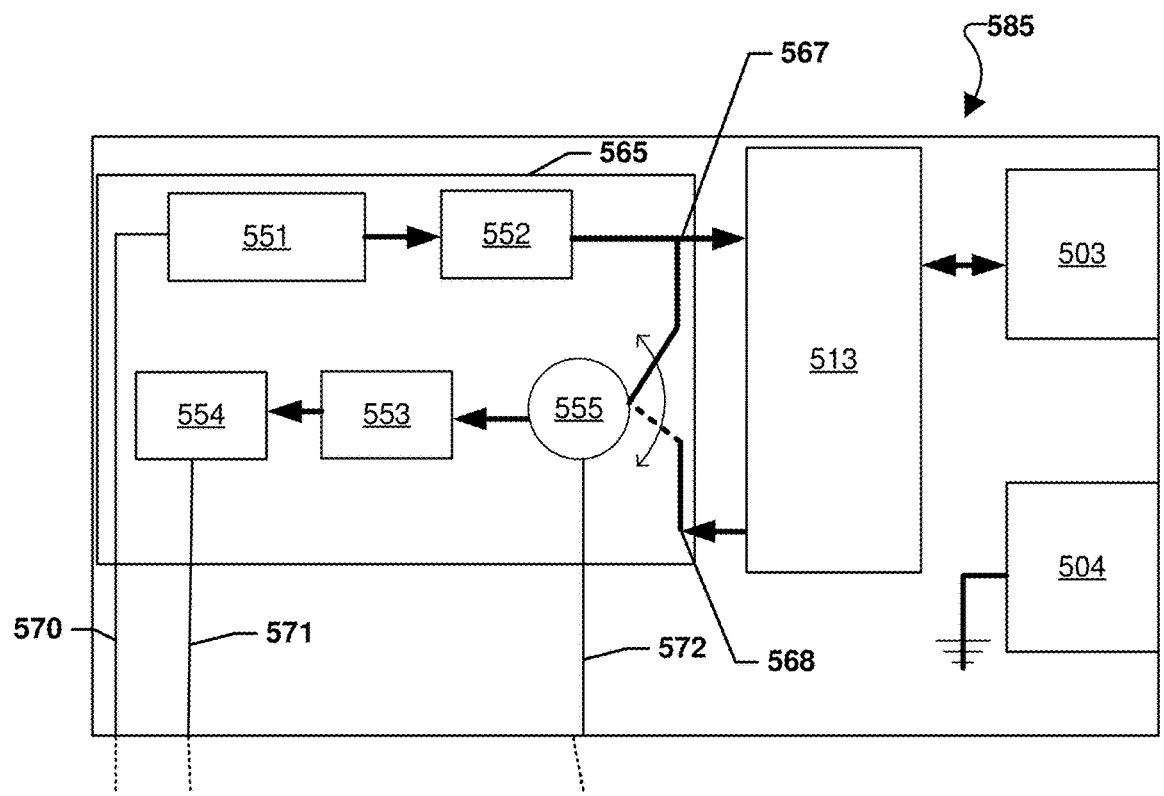
FIG. 5D illustrates an example distance measurement circuit in accordance with various embodiments.

FIG. 5D illustrates an example distance measurement circuit 585 in accordance with some embodiments. With reference to FIGS. 1A-5D, the circuit 585 may be an example of a configuration of a distance measurement circuit, such as distance measurement circuit 128. With reference to FIGS. 1A-5D, the distance measurement circuit 585 may be an example means for performing at least a portion of the operations of the methods 200 (FIG. 2) and/or 400 (FIG. 4A). The distance measurement circuit 585 may be an SOC or an SIP. The distance measurement circuit 585 may be configured to enable determination of a distance to a short (e.g., 109) in a two-conductor wire (e.g., 101). The distance measurement circuit 585 may be configured to enable determination of a distance to a short (e.g., 109) based at least in part on a phase difference between a voltage phase of an injected tone and a voltage phase of a reflected tone. The distance measurement circuit 585 may be configured to enable determination of a distance to a short (e.g., 109) based at least in part on a phase difference between a current phase of an injected tone and a current phase of a reflected tone. The distance measurement circuit 585 may be configured to enable determination of a distance to a short (e.g., 109) based at least in part on both: a phase difference between a voltage phase of an injected tone and a voltage phase of a reflected tone; and an amplitude difference between a voltage amplitude of an injected tone and a voltage amplitude of a reflected tone. The distance measurement circuit 585 may be configured to enable determination of a distance to a short (e.g., 109) based at least in part on both: a phase difference between a current phase of an injected tone and a current phase of a reflected tone; and an amplitude difference between a current amplitude of an injected tone and a current amplitude of a reflected tone. As one example, the distance measurement circuit 585 may differ from the distance measurement circuit 550 in that the distance measurement circuit 585 may include a directional coupler 513 and that in the distance measurement circuit 585, the second connector 504 may be grounded.

The directional coupler 513 may be configured to separate an input signal passed into the first connector 503, such as an injected tone, from an output signal from the first connector 503, such as a reflected tone. In the distance measurement circuit 580, the first connector 503 may be connected to the directional coupler 513 while the second connector 504 may be grounded. The directional coupler 513 may include an input port configured to receive tones as input signals from the PA 552 via the output connection 567. The directional coupler 513 be connected to the first connector 503 and may send injected tones to the first connector 503 and receive reflected tones from the first connector 503. The directional coupler 513 may include an output port configured to output reflected tones received from the first connector 503 to the input connection 568. In the distance measurement circuit 585, the controllable switch 555 may connect the mixer 553 to the input port of the directional coupler 513 via the output connection 567 or the mixer 553 to the output port of the directional coupler 513 via the input connection 568.

To illustrate operations of the example distance measurement circuit 585, reference is made to an implementation in which a short (e.g., 109) has occurred between the first conductor 104 and the second conductor 105 of the two-conductor wire 101 and the first connector 503 is connected to the first conductor 104 and the second connector 504 is connected to the second conductor 105. In this implementation, the injected tone from the LO 551 and PA 552 may be sampled (e.g., the voltage phase measured, the current phase measured, the voltage amplitude measured, and/or the current amplitude measured) by the mixer 553 and ADC 554 when injected. The injected tone may travel through the output connection 567, the directional coupler 513, the first connector 503, and the first conductor 104 to the short (e.g., 109). The injected tone may be reflected from the short (e.g., 109) back along the first conductor 104 to the first connector 503 as a reflected tone. The reflected tone may travel from the first connector 503 to the directional coupler 513 and the reflected tone may be output by the output port of the directional coupler 513 to the input connection 568. The reflected tone may have a phase difference (e.g., a different voltage phase and/or a different current phase) than the injected tone and/or may have an amplitude difference (e.g., a different voltage amplitude and/or a different current amplitude) than the injected tone. The controllable switch 555 may be controlled (e.g., by the processor 126) to connect the mixer 553 to the input connection 568. The controllable switch 555 may be controlled (e.g., by the processor 126) to connect the mixer 553 to the input connection 568 such that the mixer 553 and ADC 554 may collect a sample at a sample separation of the sampling of the injected tone. The mixer 553 and ADC 554 may sample (e.g., the voltage phase may be measured, the current phase may be measured, the voltage amplitude may be measured, and/or the current amplitude may be measured) the reflected tone received at the input connection 568. The reflected tone received at the input connection 568 may be the reflected tone as output by the output port of the directional coupler 513. The samples of the injected tone and the reflected tone (e.g., the measurement of the voltage phase of the injected tone and the measurement of the voltage phase of the reflected tone, the measurement of the current phase of the injected tone and the measurement of the current phase of the reflected tone, the measurement of the voltage amplitude of the injected tone and the measurement of the voltage amplitude of the reflected tone, and/or the measurement of the current amplitude of the injected tone and the measurement of the current amplitude of the reflected tone) may be passed by the ADC 554 to the processor (e.g., the processor 126). The phase difference between the injected tone and reflected tone may be determined based on the samples and/or the amplitude different between the injected tone and reflected tone may be determined based on the samples. In various embodiments, the injected tone or tones may be Bluetooth carriers, and the injected tones and reflected tones may be sampled for each Bluetooth carrier frequency. For example, all seventy-nine Bluetooth carriers may be sampled respectively as an injected tone and reflected tone pair.

Figure 6A:
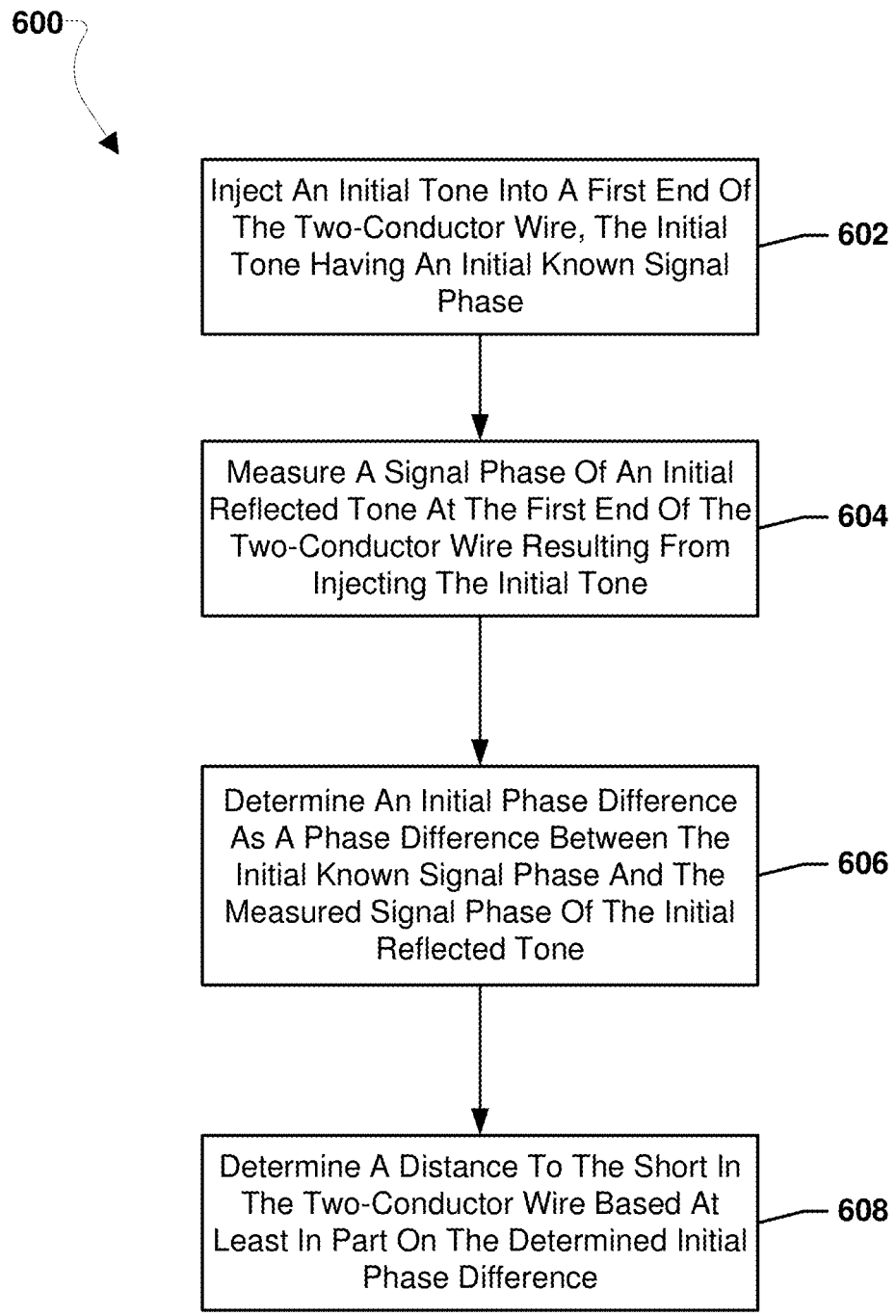
FIG. 6A is a process flow diagram illustrating a method for determining a distance to a short in a two-conductor wire in accordance with various embodiments.

FIG. 6A illustrates an embodiment method 600 for determining a distance to a short in a two-conductor wire. With reference to FIGS. 1A-6A, the method 600 may be performed by a processor (e.g., 126) of a device (e.g., device 106). With reference to FIGS. 1A-6A, the means for performing each of the operations of the method 600 may be one or more processors of a device (e.g., the device 106), such as one or more processors 126, and one or more distance measurement circuits of a device (e.g., the device 106), such as one or more distance measurement circuits 128, 500, 550, 580, 585. In various embodiments, the operations of the method 600 may be performed in conjunction with the operations of the methods 200 (FIG. 2) and/or 400 (FIG. 4A). For example, the operations of the method 600 may be performed as part of the operations of block 204 of the method 200 (FIG. 2) or the method 400 (FIG. 4A) to determine a distance to the short (e.g., short 109) in the two-conductor wire (e.g., two-conductor wire 101).

In block 602, the processor may perform operations to inject an initial tone into a first end of the two-conductor wire, the initial tone having an initial known signal phase. The initial tone may be a carrier of a selected frequency. As examples, the initial tone may be a BLE carrier, a Bluetooth carrier, etc. As an example, the initial tone may be injected into a first end 102 of a two-conductor wire 101, such as the first conductor 104. The initial known signal phase may be a voltage phase measurement and/or current phase measurement determined by sampling the initial tone as the initial tone is injected. As an example, the first radio 501 may be controlled by the processor to inject an initial tone into the first conductor 104 and the controllable switch 505 may be aligned such that the second radio 502 samples the injected initial tone. As another example, the LO 551 and PA 552 may be controlled by the processor to inject an initial tone into the first conductor 104 and the controllable switch 555 may be aligned such that the mixer 553 and ADC 554 sample the injected initial tone.

In block 604, the processor may perform operations to measure a signal phase of an initial reflected tone at the first end of the two-conductor wire resulting from injecting the initial tone. The initial reflected tone may be the injected tone returned back down another conductor of the two-conductor wire after the injected tone passes through the short. As an example, the initial reflected tone may be the tone received at the second conductor 105 at the first end 102 of the two-conductor wire 101 after the initial injected tone traveled down the first conductor 104 through the short 109 and back through the second conductor 105 to the first end 102 of the two-conductor wire 101. The voltage phase of the initial reflected tone may be measured and the voltage phase of the initial reflected tone may be different from the voltage phase of the injected initial tone. The current phase of the initial reflected tone may be measured and the current phase of the initial reflected tone may be different from the voltage phase of the injected initial tone. As an example, the controllable switch 505 may be aligned such that the second radio 502 samples the initial reflected tone as received from the second conductor 105 at the second connector 504. As another example, the controllable switch 555 may be aligned such that the mixer 553 and ADC 554 may be controlled by the processor to sample the initial reflected tone as received from the second conductor 105 at the second connector 504 and the input connection 568.

In block 606, the processor may perform operations to determine an initial phase difference as a phase difference between the initial known signal phase and the measured signal phase of the initial reflected tone. For example, the processor may subtract the measured voltage phase of the initial reflected tone from the initial known voltage phase to determine the initial phase difference. For example, the processor may subtract the measured current phase of the initial reflected tone from the initial known current phase to determine the initial phase difference.

In block 608, the processor may perform operations to determine a distance to the short in the two-conductor wire based at least in part on the determined initial phase difference. For example, the phase difference values may be correlated with distances in a memory structure (e.g., array, look-up table, etc.) in a memory available to the processor and the processor may determine the distance to the short in the two-conductor wire as the distance correlated with the phase difference in the memory structure matching the initial phase difference.

Figure 6B:
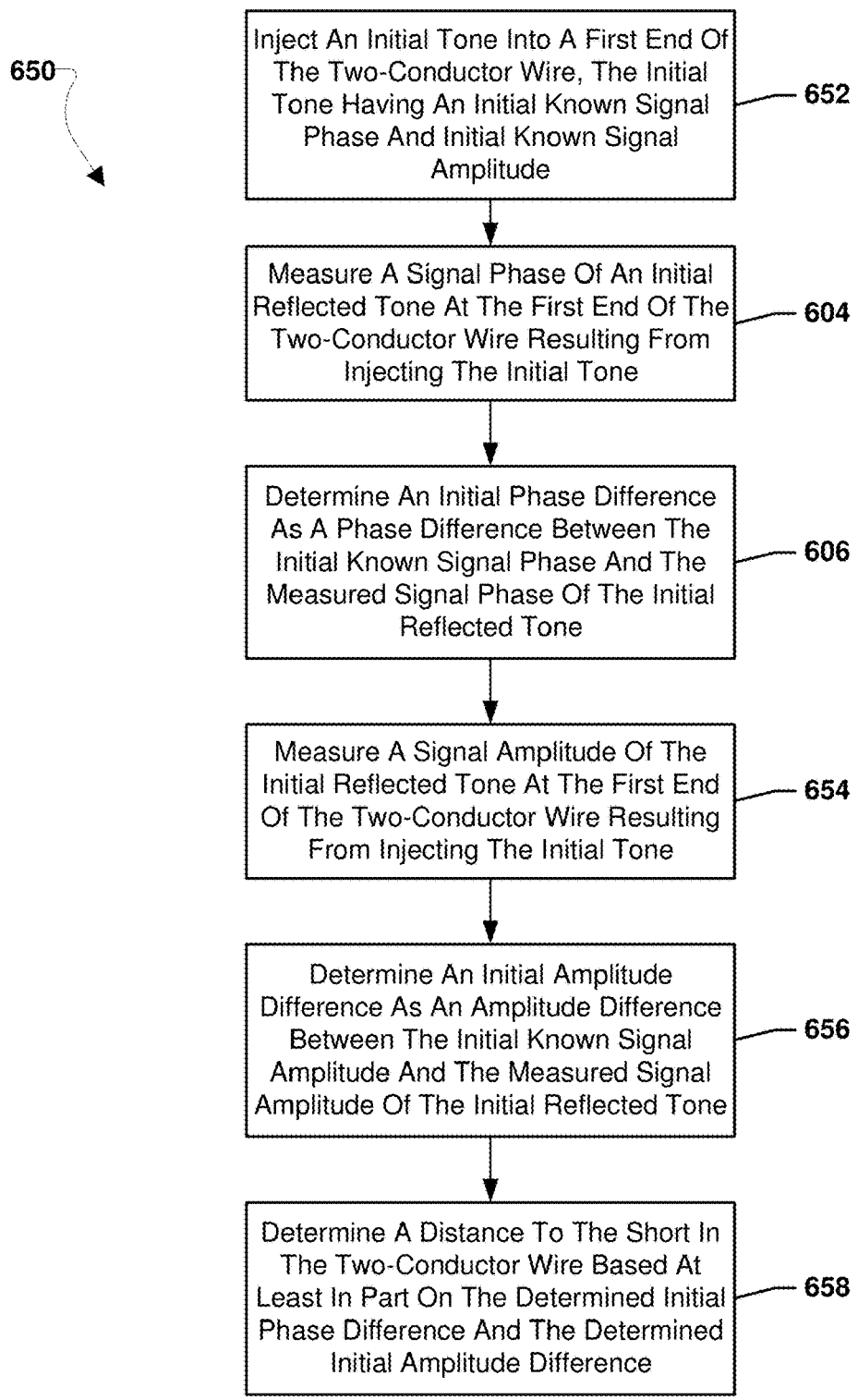
FIG. 6B is a process flow diagram illustrating a method for determining a distance to a short in a two-conductor wire in accordance with various embodiments.

FIG. 6B illustrates an embodiment method 650 for determining a distance to a short in a two-conductor wire. With reference to FIGS. 1A-6B, the method 650 may be performed by a processor (e.g., 126) of a device (e.g., device 106). With reference to FIGS. 1A-6B, the means for performing each of the operations of the method 650 may be one or more processors of a device (e.g., the device 106), such as one or more processors 126, and one or more distance measurement circuits of a device (e.g., the device 106), such as one or more distance measurement circuits 128, 500, 550, 580, 585. In various embodiments, the operations of the method 650 may be performed in conjunction with the operations of the methods 200 (FIG. 2) and/or 400 (FIG. 4A). For example, the operations of the method 650 may be performed as part of the operations of block 204 of the method 200 (FIG. 2) or the method 400 (FIG. 4A) to determine a distance to the short (e.g., short 109) in the two-conductor wire (e.g., two-conductor wire 101).

In block 652, the processor may perform operations to inject an initial tone into a first end of the two-conductor wire, the initial tone having an initial known signal phase and an initial known signal amplitude. The initial tone may be a carrier of a selected frequency. As examples, the initial tone may be a BLE carrier, a Bluetooth carrier, etc. As an example, the initial tone may be injected into a first end 102 of a two-conductor wire 101, such as the first conductor 104. The initial known signal phase may be a voltage phase measurement and/or current phase measurement determined by sampling the initial tone as the initial tone is injected. The initial known signal amplitude may be a voltage amplitude measurement and/or current amplitude measurement determined by sampling the initial tone as the initial tone is injected. As an example, the first radio 501 may be controlled by the processor to inject an initial tone into the first conductor 104 and the controllable switch 505 may be aligned such that the second radio 502 samples the injected initial tone. As another example, the LO 551 and PA 552 may be controlled by the processor to inject an initial tone into the first conductor 104 and the controllable switch 555 may be aligned such that the mixer 553 and ADC 554 sample the injected initial tone.

In blocks 604 and 606 the processor may perform operations of like numbered blocks of the method 600 (FIG. 6A) to measure a signal phase and determine an initial phase difference as described.

In block 654, the processor may perform operations to measure a signal amplitude of the initial reflected tone at the first end of the two-conductor wire resulting from injecting the initial tone. The signal amplitude may be a voltage amplitude measurement and/or current amplitude measurement determined by sampling the initial tone as the initial tone is injected. As an example, the first radio 501 may be controlled by the processor to inject an initial tone into the first conductor 104 and the controllable switch 505 may be aligned such that the second radio 502 samples the injected initial tone. As another example, the LO 551 and PA 552 may be controlled by the processor to inject an initial tone into the first conductor 104 and the controllable switch 555 may be aligned such that the mixer 553 and ADC 554 sample the injected initial tone.

In block 656, the processor may perform operations to determine an initial amplitude difference as an amplitude difference between the initial known signal amplitude and the measured signal amplitude of the initial reflected tone. The voltage amplitude of the initial reflected tone may be measured and the voltage amplitude of the initial reflected tone may be different from the voltage amplitude of the injected initial tone. The current amplitude of the initial reflected tone may be measured and the current amplitude of the initial reflected tone may be different from the current amplitude of the injected initial tone. As an example, the controllable switch 505 may be aligned such that the second radio 502 samples the initial reflected tone as received from the second conductor 105 at the second connector 504. As another example, the controllable switch 555 may be aligned such that the mixer 553 and ADC 554 may be controlled by the processor to sample the initial reflected tone as received from the second conductor 105 at the second connector 504 and the input connection 568.

In block 658, the processor may perform operations to determine a distance to the short in the two-conductor wire based at least in part on the determined initial phase difference and the determined initial amplitude difference. For example, the phase difference values and amplitude difference values may be compared to stored calibration data sets in a memory available to the processor to identify a calibration data set best matching the phase difference values and amplitude difference values. The calibration data sets may be phase differences and amplitude differences previously captured for the two-conductor wire having shorts at different distances, such as during initial calibration procedures, during post manufacture testing, etc. The calibration data sets may be correlated with distances in a memory structure (e.g., array, look-up table, etc.) in a memory available to the processor and the processor may determine the distance to the short in the two-conductor wire as the distance correlated with the calibration data set best matching the phase difference values and amplitude difference values.

Figure 7A:
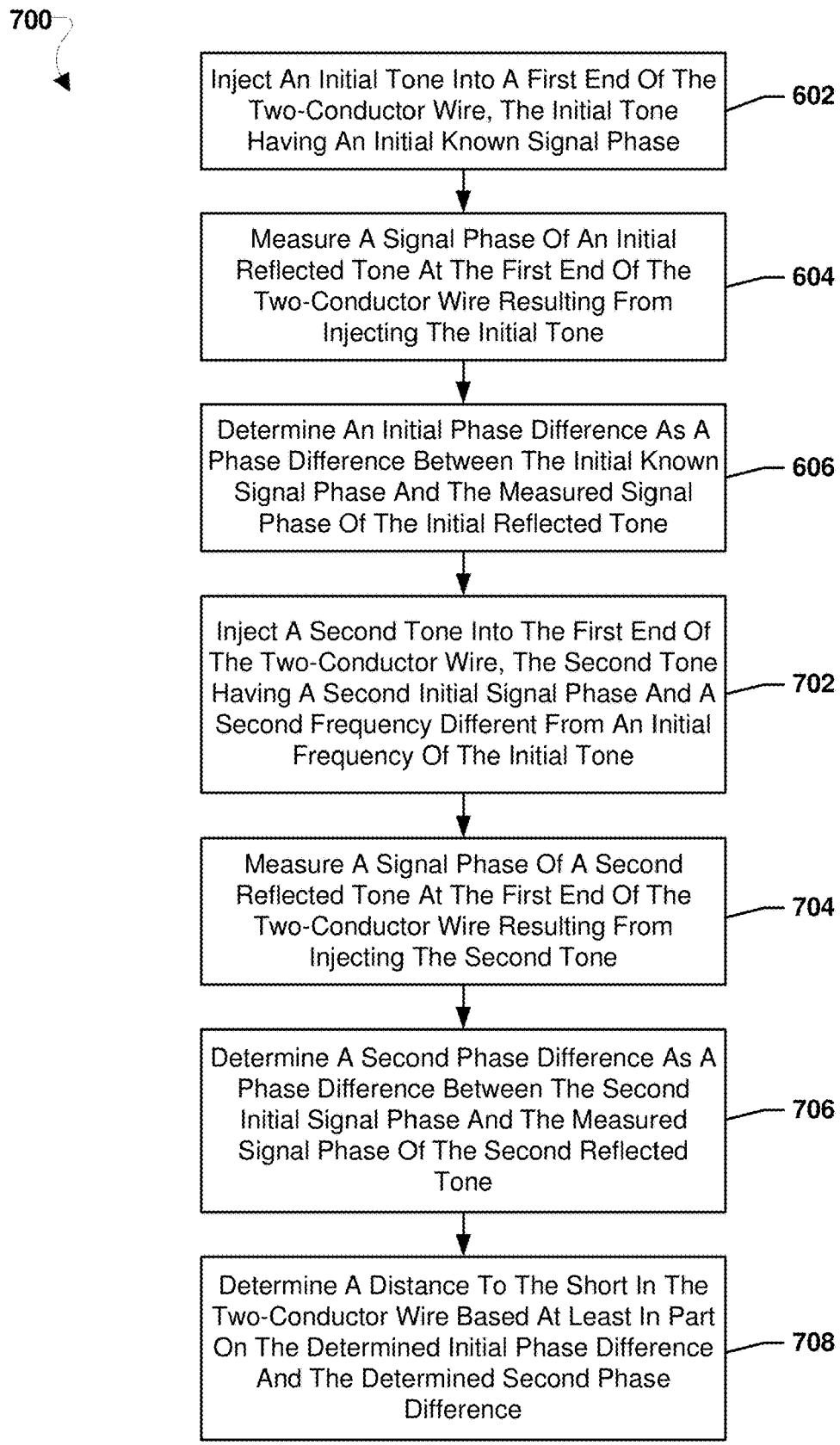
FIG. 7A is a process flow diagram illustrating a method for determining a distance to a short in a two-conductor wire in accordance with various embodiments.

FIG. 7A illustrates an embodiment method 700 for determining a distance to a short in a two-conductor wire. With reference to FIGS. 1A-7A, the method 700 may be performed by a processor (e.g., 126) of a device (e.g., device 106). With reference to FIGS. 1A-7A, the means for performing each of the operations of the method 700 may be one or more processors of a device (e.g., the device 106), such as one or more processors 126, and one or more distance measurement circuits of a device (e.g., the device 106), such as one or more distance measurement circuits 128, 500, 550, 580, 585. In various embodiments, the operations of the method 700 may be performed in conjunction with the operations of the methods 200 (FIG. 2), 400 (FIG. 4A), 600 (FIG. 6A), and/or 650 (FIG. 6B). For example, the operations of the method 700 may be performed as part of the operations of block 204 of the method 200 (FIG. 2) or the method 400 (FIG. 4A) to determine a distance to the short (e.g., short 109) in the two-conductor wire (e.g., two-conductor wire 101).

In blocks 602, 604, and 606, the processor may perform operations of like numbered blocks of the method 600 (FIG. 6A) to determine an initial phase difference as described.

In block 702, the processor may perform operations to inject a second tone into the first end of the two-conductor wire, the second tone having a second initial signal phase and a second frequency different from an initial frequency of the initial tone. The second initial signal phase may be a voltage phase of the second tone. The second initial signal phase may be a current phase of the second tone. The second tone may be a carrier of a selected frequency. The second tone may be a carrier of a different frequency than the initial tone. As examples, the second tone may be a BLE carrier, a Bluetooth carrier, etc. As an example, the second tone may be injected into a first end 102 of a two-conductor wire 101, such as the first conductor 104. The second initial signal phase may be a voltage phase measurement determined by sampling the second tone as the second tone is injected and/or may be a current phase measurement determined by sampling the second tone as the second tone is injected. As an example, the first radio 501 may be controlled by the processor to inject a second tone into the first conductor 104 and the controllable switch 505 may be aligned such that the second radio 502 samples the injected second tone. As another example, the LO 551 and PA 552 may be controlled by the processor to inject a second tone into the first conductor 104 and the controllable switch 555 may be aligned such that the mixer 553 and ADC 554 sample the injected second tone.

In block 704, the processor may perform operations to measure a signal phase of a second reflected tone at the first end of the two-conductor wire resulting from injecting the second tone. The signal phase of the second reflected tone may be a voltage phase of the second reflected tone. The signal phase of the second reflected tone may be a current phase of the second reflected tone. The second reflected tone may be the second tone returned back down another conductor of the two-conductor wire after the injected tone passes through the short. As an example, the second reflected tone may be the tone received at the second conductor 105 at the first end 102 of the two-conductor wire 101 after the second injected tone traveled down the first conductor 104 through the short 109 and back through the second conductor 105 to the first end 102 of the two-conductor wire 101. The voltage phase of the second reflected tone may be measured and the voltage phase of the second reflected tone may be different from the voltage phase of the injected second tone. The current phase of the second reflected tone may be measured and the current phase of the second reflected tone may be different from the voltage phase of the injected second tone. As an example, the controllable switch 505 may be aligned such that the second radio 502 samples the second reflected tone as received from the second conductor 105 at the second connector 504. As another an example, the controllable switch 555 may be aligned such that the mixer 553 and ADC 554 may be controlled by the processor to sample the second reflected tone as received from the second conductor 105 at the second connector 504 and the input connection 568

In block 706, the processor may perform operations to determine a second phase difference as a phase difference between the second initial signal phase and the measured signal phase of the second reflected tone. For example, the processor may subtract the measured voltage phase of the second reflected tone from the second initial voltage phase to determine the second phase difference. For example, the processor may subtract the measured current phase of the second reflected tone from the second initial current phase to determine the second phase difference In block 708, the processor may perform operations to determine a distance to the short in the two-conductor wire based at least in part on the determined initial phase difference and the determined second phase difference. For example, a slope of the line (or gradient of the line) connecting the initial phase difference and the determined second phase difference may be used to determine the round-trip distance, such as the distance from the first conductor (e.g., 104) where the tones were injected through the short (e.g., 109), and back to the second conductor (e.g., 105) where the tones were received. The round-trip distance may be divided in half to determine the distance to the short (e.g., 109).

Figure 7B:
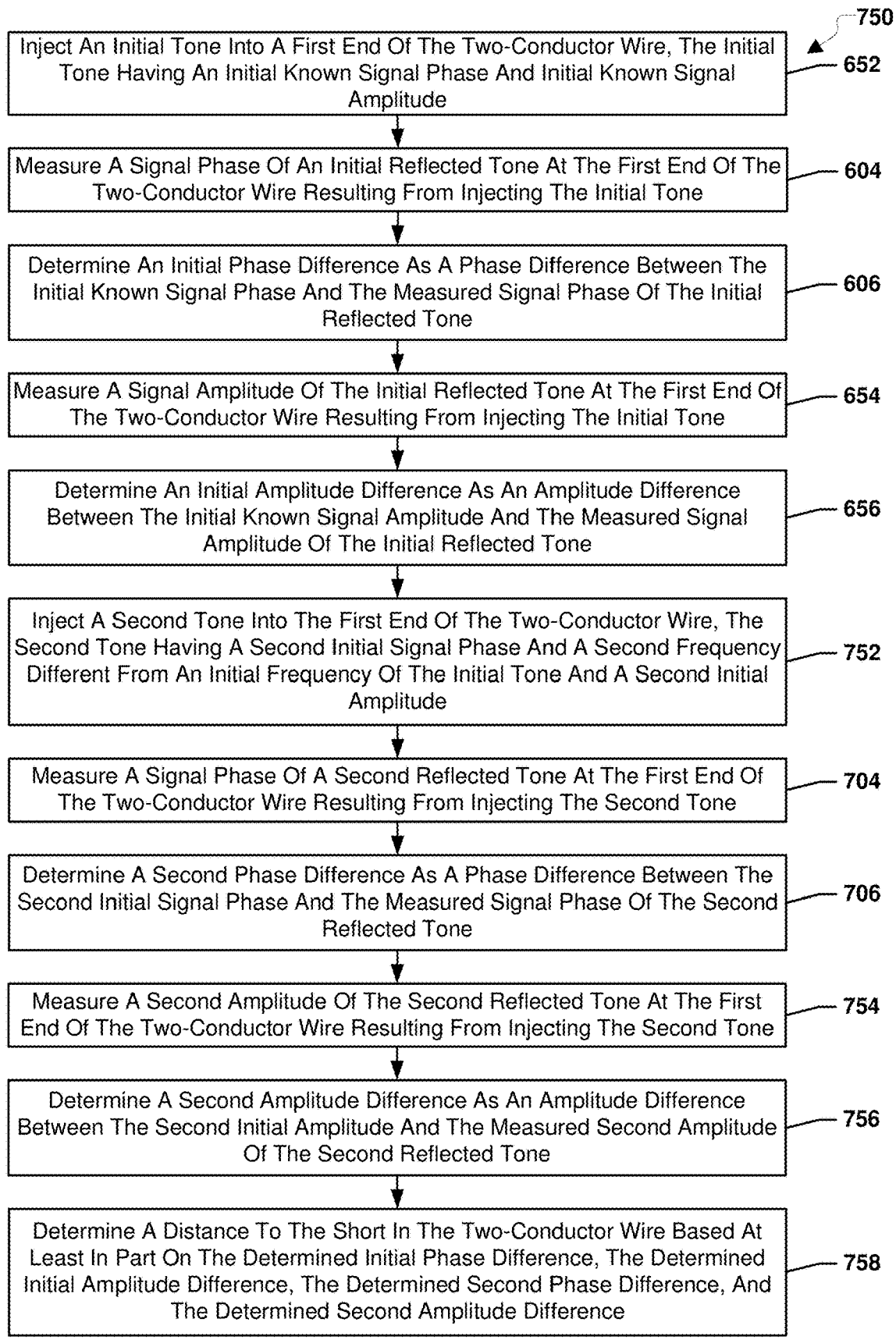
FIG. 7B is a process flow diagram illustrating a method for determining a distance to a short in a two-conductor wire in accordance with various embodiments.

FIG. 7B illustrates an embodiment method 750 for determining a distance to a short in a two-conductor wire. With reference to FIGS. 1A-7B, the method 750 may be performed by a processor (e.g., 126) of a device (e.g., device 106). With reference to FIGS. 1A-7B, the means for performing each of the operations of the method 750 may be one or more processors of a device (e.g., the device 106), such as one or more processors 126, and one or more distance measurement circuits of a device (e.g., the device 106), such as one or more distance measurement circuits 128, 500, 550, 580, 585. In various embodiments, the operations of the method 750 may be performed in conjunction with the operations of the methods 200 (FIG. 2), 400 (FIG. 4A), 600 (FIG. 6A), and/or 650 (FIG. 6B). For example, the operations of the method 750 may be performed as part of the operations of block 204 of the method 200 (FIG. 2) or the method 400 (FIG. 4A) to determine a distance to the short (e.g., short 109) in the two-conductor wire (e.g., two-conductor wire 101).

In blocks 652, 604, 606, 654, and 656 the processor may perform operations of like numbered blocks of the method 650 (FIG. 6B) to determine an initial phase difference and initial amplitude difference as described.

In block 752, the processor may perform operations to inject a second tone into the first end of the two-conductor wire, the second tone having a second initial signal phase and a second frequency different from an initial frequency of the initial tone and a second initial amplitude. The second initial signal phase may be a voltage phase of the second tone. The second initial signal phase may be a current phase of the second tone. The second initial amplitude may be a voltage amplitude of the second tone. The second initial amplitude may be a current amplitude of the second tone. The second tone may be a carrier of a selected frequency. The second tone may be a carrier of a different frequency than the initial tone. As examples, the second tone may be a BLE carrier, a Bluetooth carrier, etc. As an example, the second tone may be injected into a first end 102 of a two-conductor wire 101, such as the first conductor 104. The second initial signal phase may be a voltage phase measurement determined by sampling the second tone as the second tone is injected and/or may be a current phase measurement determined by sampling the second tone as the second tone is injected. The second initial amplitude may be a voltage amplitude measurement determined by sampling the second tone as the second tone is injected and/or may be a current amplitude measurement determined by sampling the second tone as the second tone is injected. As an example, the first radio 501 may be controlled by the processor to inject a second tone into the first conductor 104 and the controllable switch 505 may be aligned such that the second radio 502 samples the injected second tone. As another example, the LO 551 and PA 552 may be controlled by the processor to inject a second tone into the first conductor 104 and the controllable switch 555 may be aligned such that the mixer 553 and ADC 554 sample the injected second tone.

In blocks 704 and 706 the processor may perform operations of like numbered blocks of the method 700 (FIG. 7A) to measure a signal phase of a second reflected tone and determine a second phase difference as described.

In block 754, the processor may perform operations to measure a second amplitude of the second reflected tone at the first end of the two-conductor wire resulting from injecting the initial tone. The second amplitude of the second reflected tone may be a voltage amplitude measurement and/or current amplitude measurement determined by sampling the second tone as the second tone is injected. As an example, the first radio 501 may be controlled by the processor to inject a second tone into the first conductor 104 and the controllable switch 505 may be aligned such that the second radio 502 samples the injected second tone. As another example, the LO 551 and PA 552 may be controlled by the processor to inject a second tone into the first conductor 104 and the controllable switch 555 may be aligned such that the mixer 553 and ADC 554 sample the injected second tone.

In block 756, the processor may perform operations to determine a second amplitude difference as an amplitude difference between the second initial amplitude and the measured second amplitude of the second reflected tone. The voltage amplitude of the second reflected tone may be measured and the voltage amplitude of the second reflected tone may be different from the voltage amplitude of the second initial tone. The current amplitude of the second reflected tone may be measured and the current amplitude of the second reflected tone may be different from the current amplitude of the injected second tone. As an example, the controllable switch 505 may be aligned such that the second radio 502 samples the initial reflected tone as received from the second conductor 105 at the second connector 504. As another example, the controllable switch 555 may be aligned such that the mixer 553 and ADC 554 may be controlled by the processor to sample the initial reflected tone as received from the second conductor 105 at the second connector 504 and the input connection 568.

In block 758, the processor may perform operations to determine a distance to the short in the two-conductor wire based at least in part on the determined initial phase difference, the determined initial amplitude difference, the determined second phase difference, and the determined second amplitude difference. For example, the phase difference values and amplitude difference values may be compared to stored calibration data sets in a memory available to the processor to identify a calibration data set best matching the phase difference values and amplitude difference values. The calibration data sets may be phase differences and amplitude differences previously captured for the two-conductor wire having shorts at different distances, such as during initial calibration procedures, during post manufacture testing, etc. The calibration data sets may be correlated with distances in a memory structure (e.g., array, look-up table, etc.) in a memory available to the processor and the processor may determine the distance to the short in the two-conductor wire as the distance correlated with the calibration data set best matching the phase difference values and amplitude difference values.

Figure 8A:
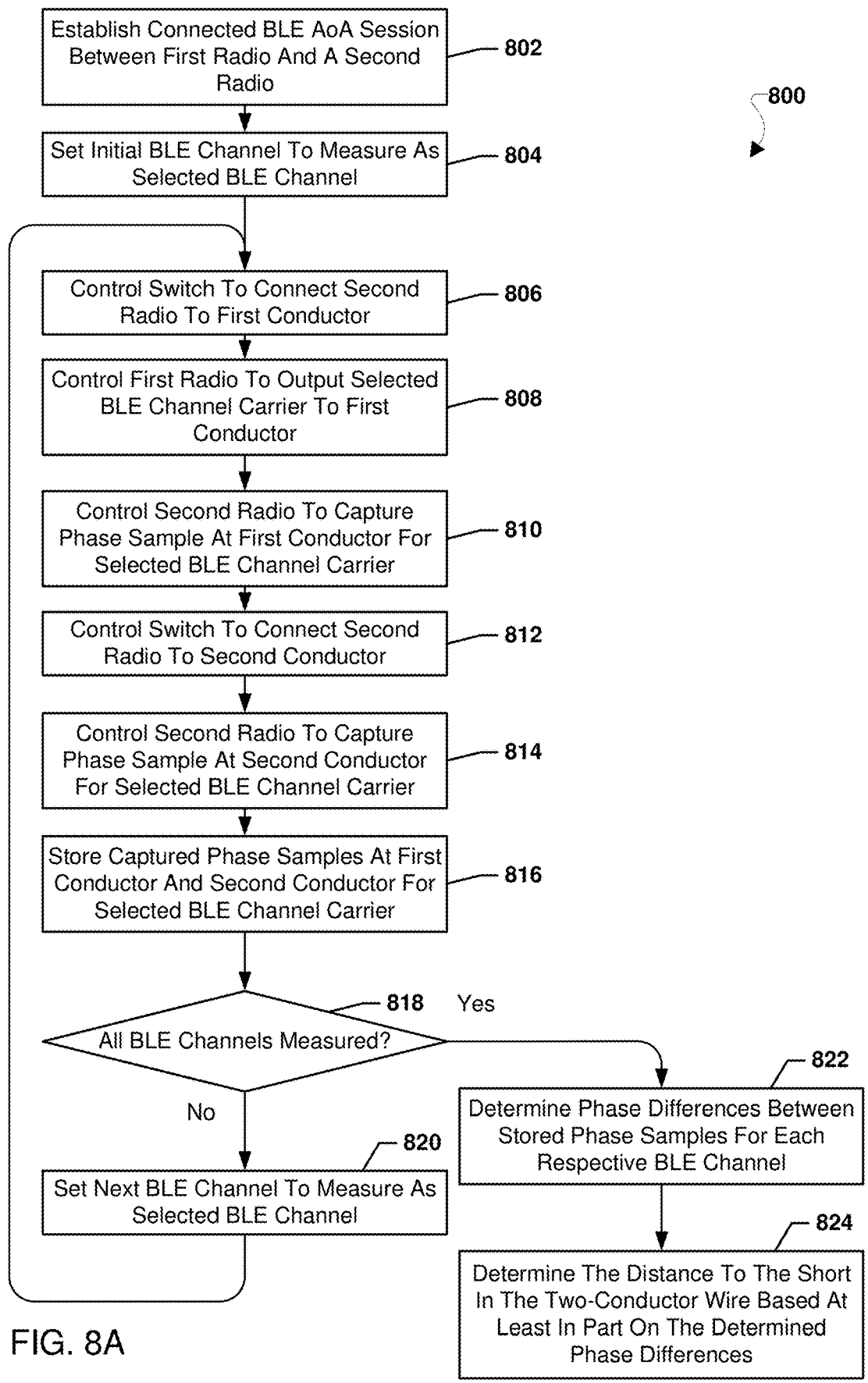
FIG. 8A is a process flow diagram illustrating a method for determining a distance to a short in a two-conductor wire in accordance with various embodiments.

FIG. 8A illustrates an embodiment method 800 for determining a distance to a short in a two-conductor wire. With reference to FIGS. 1A-8A, the method 800 may be performed by a processor (e.g., 126) of a device (e.g., device 106). With reference to FIGS. 1A-8A, the means for performing each of the operations of the method 800 may be one or more processors of a device (e.g., the device 106), such as one or more processors 126, and one or more distance measurement circuits of a device (e.g., the device 106), such as one or more distance measurement circuits 128, 500, 580. In various embodiments, the operations of the method 800 may be performed in conjunction with the operations of the methods 200 (FIG. 2) and/or 400 (FIG. 4A). For example, the operations of the method 800 may be performed as part of the operations of block 204 of the method 200 (FIG. 2) or the method 400 (FIG. 4A) to determine a distance to the short (e.g., short 109) in the two-conductor wire (e.g., two-conductor wire 101).

In block 802, the processor may perform operations to establish a connected BLE AoA session between a first radio and a second radio. For example, the processor may control the first radio 501 and the second radio 502 to establish a connected BLE AoA session such that that first radio 501 transmits BLE AoA packets along the first conductor 104 of the two-conductor wire 101.

In block 804, the processor may perform operations to set an initial BLE channel to measure as the selected BLE channel. As an example, the first BLE channel may be a first of the thirty-seven BLE channels to measure.

In block 806, the processor may perform operations to control a switch to connect the second radio to the first conductor. For example, the processor may control the controllable switch 505 to connect the second radio 502 to the first connector 503 connected to the first conductor 104.

In block 808, the processor may perform operations to control the first radio to output the selected BLE channel carrier to the first conductor. For example, the processor may control the first radio 501 to output the selected BLE channel carrier to the first connector 503 and thereby the first conductor 104. The output of the selected BLE channel carrier may thereby inject the BLE channel carrier as a tone into the first conductor 104 connected to the first connector 503.

In block 810, the processor may perform operations to control the second radio to capture a phase sample (e.g., I/Q sample) at the first conductor for the selected BLE channel carrier. For example, the processor may control the second radio 502 to measure the voltage phase at the first connector 503 connected to the first conductor 104.

In block 812, the processor may perform operations to control a switch to connect the second radio to the second conductor. For example, the processor may control the controllable switch 505 to connect the second radio 502 to the second connector 504 connected to the second conductor 105.

In block 814, the processor may perform operations to control the second radio to capture a phase sample (e.g., I/Q sample) at the second conductor for the selected BLE channel carrier. For example, the processor may control the second radio 502 to measure the voltage phase at the second connector 504 connected to the second conductor 105. The tone sampled by the second radio 502 at the second connector 504 may be the reflected tone that traveled down the first conductor 104, through the short 109, and returned down the second conductor 105.

In block 816, the processor may perform operations to store the captured phase samples at the first conductor and the second conductor for the selected BLE channel carrier. For example, the phase samples may be stored in a memory structure of the memory 129. As an example, voltage phases measured at the first connector 503 connected to the first conductor 104 and the second connector 504 connected to the second conductor 105 may be stored in the memory 129 and associated in the memory 129 with an indication of the selected BLE channel carrier that was the tone injected into the two-conductor wire 101.

In determination block 818, the processor may perform operations to determine whether all BLE channels have been measured. For example, the processor may determine whether phase samples have been captured and stored for all thirty-seven BLE channels.

In response to determining that all BLE channels have not been measured (i.e., determination block 818="No"), the processor may set a next BLE channel to measure as the selected BLE channel in block 820. As an example, the next BLE channel may be a next of the thirty-seven BLE channels to measure.

In response to setting the next BLE channel to measure as the selected BLE channel, the processor may perform operations of blocks 806 to 816 for the newly selected BLE channel. In determination block 818, the processor may perform operations to determine whether all BLE channels have been measured. In this manner, BLE channels may be selected and phase samples captured for those BLE channels until all BLE channels are injected as tones and their reflected tones are measured.

In response to determining that all BLE channels have been measured (i.e., determination block 818="Yes"), the processor may determine phase differences between the stored phase samples for each respective BLE channel in block 822. For example, the processor may subtract the one of the phase samples from the other phase sample for each respective BLE channel to determine the phase difference for that BLE channel. The phase differences may be stored in the memory 129 associated with the frequency of their respective BLE channels.

In block 824, the processor may determine the distance to the short in the two-conductor wire based at least in part on the determined phase differences. For example, the processor may fit a line to the distribution of the determined phase differences using a selected method, such as linear regression, orthogonal regression, etc. A slope of the line (or gradient of the line) may be determined and used to determine the round-trip distance, such as the distance from the first conductor (e.g., 104) where the tones were injected through the short (e.g., 109), and back to the second conductor (e.g., 105) where the tones were received. The round-trip distance may be divided in half to determine the distance to the short (e.g., 109).

Figure 8B:
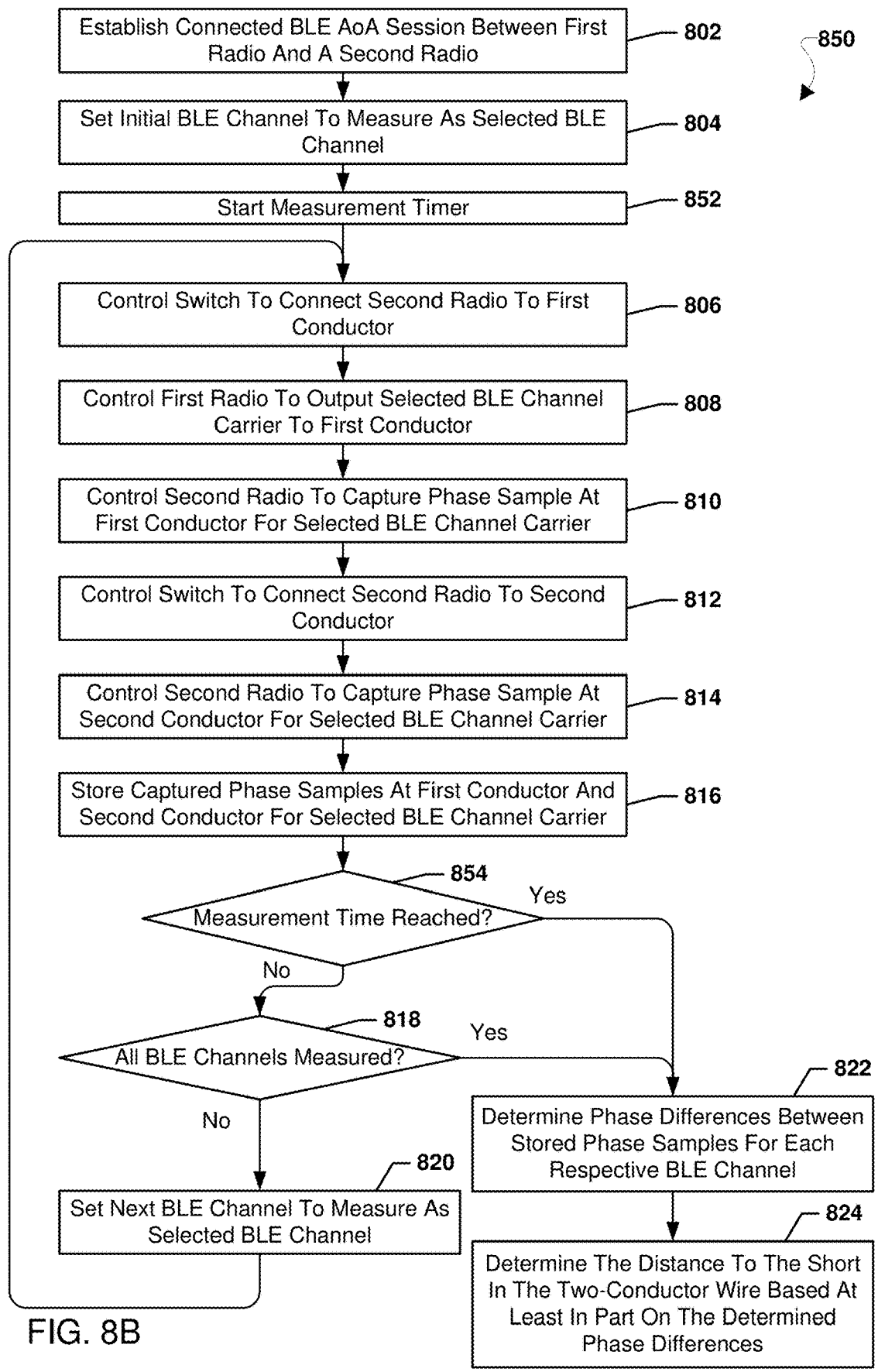
FIG. 8B is a process flow diagram illustrating a method for determining a distance to a short in a two-conductor wire in accordance with various embodiments.

FIG. 8B illustrates an embodiment method 850 for determining a distance to a short in a two-conductor wire. With reference to FIGS. 1A-8B, the method 850 may be performed by a processor (e.g., 126) of a device (e.g., device 106). With reference to FIGS. 1A-8B, the means for performing each of the operations of the method 850 may be one or more processors of a device (e.g., the device 106), such as one or more processors 126, and one or more distance measurement circuits of a device (e.g., the device 106), such as one or more distance measurement circuits 128, 500, 580. In various embodiments, the operations of the method 850 may be performed in conjunction with the operations of the methods 200 (FIG. 2) and/or 400 (FIG. 4A). For example, the operations of the method 850 may be performed as part of the operations of block 204 of the method 200 (FIG. 2) or the method 400 (FIG. 4A) to determine a distance to the short (e.g., short 109) in the two-conductor wire (e.g., two-conductor wire 101).

In blocks 802 and 804, the processor may perform operations of like numbered blocks of the method 800 (FIG. 8A) to establish a BLE AoA session and set an initial BLE channel to measure as the selected BLE channel as described.

In block 852, the processor may start a measurement timer. The measurement timer may be any type timer, such as a count-up timer, count-down timer, etc.

In blocks 806, 808, 810, 812, 814, and 816, the processor may perform operations of like numbered blocks of the method 800 (FIG. 8A) to capture and store phase samples at the first conductor and second conductor for the selected BLE channel carrier as described.

In determination block 854, the processor may determine whether the measurement time is reached. The measurement time may be a maximum time allotted for attempting to determine a distance to a short in a two-conductor wire. The processor may determine whether the measurement time is reached based on the measurement timer. For example, the measurement timer being a count-up timer that reaches or exceeds a selected time may indicate the measurement time is reached. As another example, the measurement timer being a count-down timer that reached zero may indicate the measurement time is reached.

In response to determining that the measurement time is not reached (i.e., determination block 854="No"), the processor may perform like operations of determination block 818 of the method 800 (FIG. 8A) to determine whether all BLE channels are measured as described. In this manner, as long as the measurement time is not reached, additional channels that may remain to be measured may be selected and phase samples captured for those BLE channels.

In response to determining that the measurement time is reached (i.e., determination block 854="Yes"), the processor may perform like operations of block 822 of the method 800 (FIG. 8A) to determine a phase difference between the stored phase samples as described. In this manner, when the measurement time is reached, whether or not all BLE channels have been measured, the phase difference may be determined. Thus, less than all BLE channels may be tested when the measurement time does not support testing all BLE channels.

Figure 9:
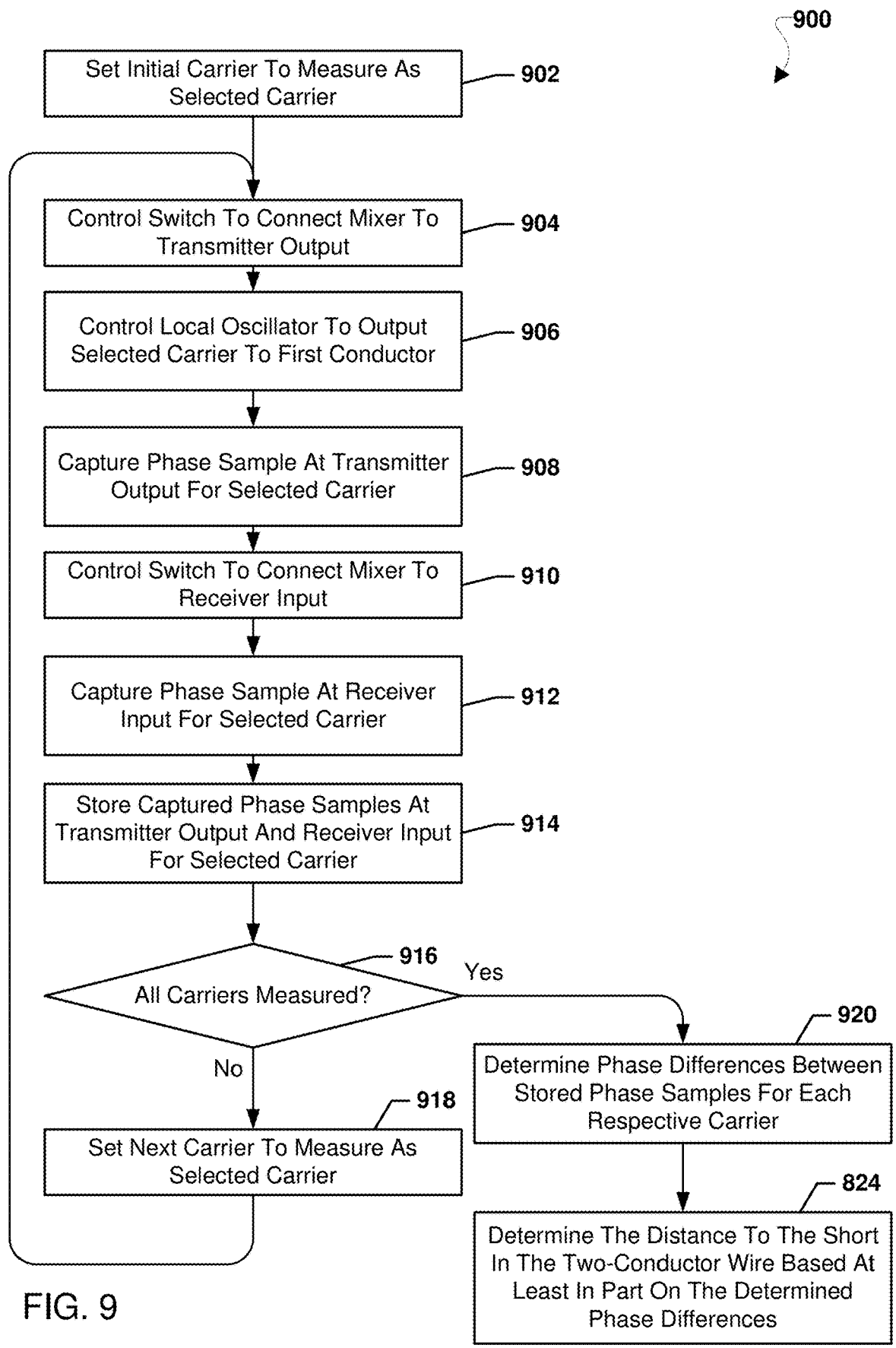
FIG. 9 is a process flow diagram illustrating a method for determining a distance to a short in a two-conductor wire in accordance with various embodiments.

FIG. 9 illustrates an embodiment method 900 for determining a distance to a short in a two-conductor wire. With reference to FIGS. 1A-9, the method 900 may be performed by a processor (e.g., 126) of a device (e.g., device 106). With reference to FIGS. 1A-9, the means for performing each of the operations of the method 900 may be one or more processors of a device (e.g., the device 106), such as one or more processors 126, and one or more distance measurement circuits of a device (e.g., the device 106), such as one or more distance measurement circuits 128, 550, 585. In various embodiments, the operations of the method 900 may be performed in conjunction with the operations of the methods 200 (FIG. 2) and/or 400 (FIG. 4A). For example, the operations of the method 900 may be performed as part of the operations of block 204 of the method 200 (FIG. 2) or the method 400 (FIG. 4A) to determine a distance to the short (e.g., short 109) in the two-conductor wire (e.g., two-conductor wire 101).

In block 902, the processor may perform operations to set an initial carrier to measure as a selected carrier. For example, the processor may set one of the seventy-nine Bluetooth carrier tones between the frequencies of 2402 MHz and 2480 MHz as the selected carrier.

In block 904, the processor may perform operations to control a switch to connect a mixer to a transmitter output.

For example, the processor may control the controllable switch 555 to connect the mixer 553 to the output connection 567 that may receive the transmitter output from the LO 551 and PA 552.

In block 906, the processor may perform operations to control a local oscillator to output the selected carrier to a first conductor. For example, the processor may control the LO 551 to output the selected carrier via the PA 552 to the output connection 567.

In block 908, the processor may perform operations to capture a phase sample (e.g., I/Q sample) at the transmitter output for the selected carrier. For example, the selected carrier that is the tone output by the LO 551 and PA 552 to the output connection 567 may be provided by the controllable switch 555 to the mixer 553 and the ADC 554 and the phase sample, such as a voltage phase measurement may be output to the processor thereby capturing the phase sample at the transmitter output for the selected carrier.

In block 910, the processor may perform operations to control the switch to connect the mixer to a receiver input. For example, the processor may control the controllable switch 555 to connect the mixer 553 to the input connection 568 that may receive the receiver input from the second connector 504 connected to the second conductor 105.

In block 912, the processor may perform operations to capture a phase sample (e.g., I/Q sample) at the receiver input for the selected carrier. For example, the processor may control the mixer 553 and ADC 554 to measure the voltage phase of the tone received via the input connection 568. The tone sampled by the mixer 553 and ADC 554 may be the reflected tone that traveled down the first conductor 104, through the short 109, and returned down the second conductor 105.

In block 914, the processor may perform operations to store the captured phase samples at the transmitter output and the receiver input for the selected carrier. For example, the phase samples may be stored in a memory structure of the memory 129. As an example, voltage phases measured at the first connector 503 connected to the first conductor 104 and the second connector 504 connected to the second conductor 105 may be stored in the memory 129 and associated in the memory 129 with an indication of the selected carrier that was the tone injected into the two-conductor wire 101.

In determination block 916, the processor may perform operations to determine whether all carriers have been measured. For example, the processor may determine whether phase samples have been captured and stored for all seventy-nine Bluetooth carrier frequencies.

In response to determining that all carriers have not been measured (i.e., determination block 916="No"), the processor may set a next carrier to measure as the selected carrier in block 918. As an example, the next carrier may be a next of the seventy-nine Bluetooth channels to measure.

In response to setting the next carrier to measure as the selected carrier, the processor may perform operations of blocks 904-914 for the newly selected carrier. In determination block 916, the processor may perform operations to determine whether all carriers have been measured. In this manner, carriers may be selected and phase samples captured for those carriers until all carriers are injected as tones and their reflected tones are measured. For example, carriers may be selected and phase samples captured until all seventy-nine Bluetooth carriers may have phase samples captured when injected as tones and when received as reflected tones.

In response to determining that all carriers have been measured (i.e., determination block 916="Yes"), the processor may determine phase differences between the stored phase samples for each respective carrier in block 920. For example, the processor may subtract the one of the phase samples from the other phase sample for each respective carrier to determine the phase difference for that carrier. The phase differences may be stored in the memory 129 associated with the frequency of the carrier.

In block 824, the processor may perform operations of like numbered block of the method 900 (FIG. 9) to determine the distance to the short in the two-conductor wire based at least in part on the determined phase differences as described. For example, the processor may fit a line to the distribution of the determined phase differences using a selected method, such as linear regression, orthogonal regression, etc. A slope of the line (or gradient of the line) may be determined and used to determine the round-trip distance, such as the distance from the first conductor (e.g., 104) where the tones were injected through the short (e.g., 109), and back to the second conductor (e.g., 105) where the tones were received. The round-trip distance may be divided in half to determine the distance to the short (e.g., 109).

Figure 10A:
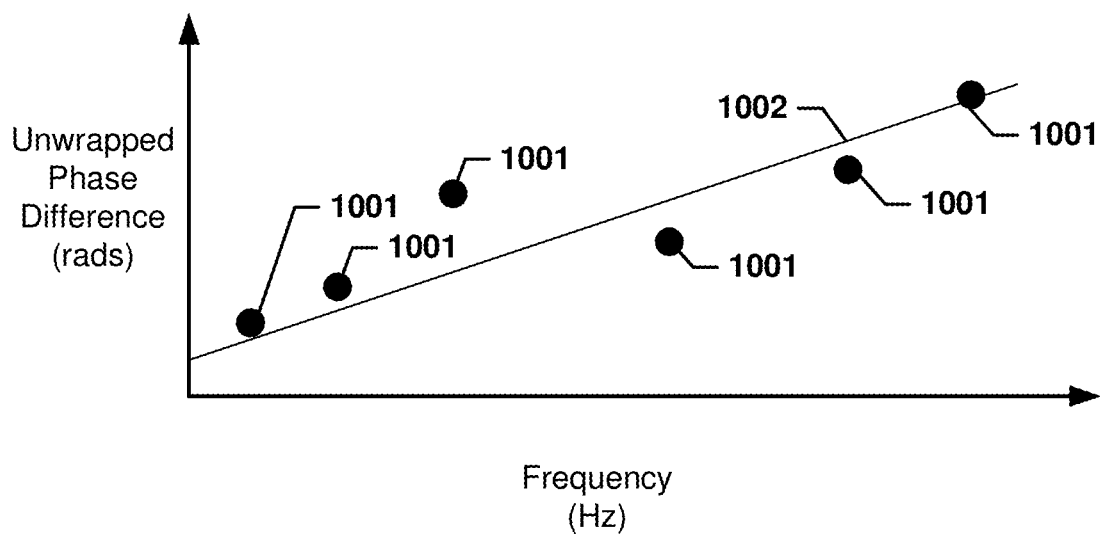
FIG. 10A is an example of a best fit line for a plot of unwrapped phase differences for different frequencies in accordance with various embodiments.

FIG. 10A is an example of a best fit line 1002 for a plot of phase differences 1001 for different frequencies in accordance with various embodiments. With reference to FIGS. 1A-10A, FIG. 10A illustrates unwrapped phase differences 1001 in radians plotted by frequency in Hz. For example, the phase differences 1001 may be the phase differences determined by operations of any of the method 600 (FIG. 6A), 650 (FIG. 6B), 700 (FIG. 7A), 750 (FIG. 7B), 800 (FIG. 8A), 850 (FIG. 8B), and/or 900 (FIG. 9). The best fit line 1002 may be determined by a line fitting method, such as linear regression, orthogonal regression, etc. The best fit line 1002 may have a gradient (or slope) defined as a number of radians over a number of Hz. The gradient of the line 1002 may represent an approximation of the distance to the short along the two-conductor wire, such as the distance to the short 109 along the two-conductor wire 101. As an example, the product of the gradient (g) times the speed of light (c) in a material from which the conductors of the two-conductor wire are formed (e.g., the material forming the first conductor 104 or the second conductor 105) may be divided by two times pi ($\pi$) to yield the round-trip distance (e.g., round-trip distance=(g*c)/(2*$\pi$)). The round-trip distance may be divided by two to determine the distance to the short.

Figure 10B:
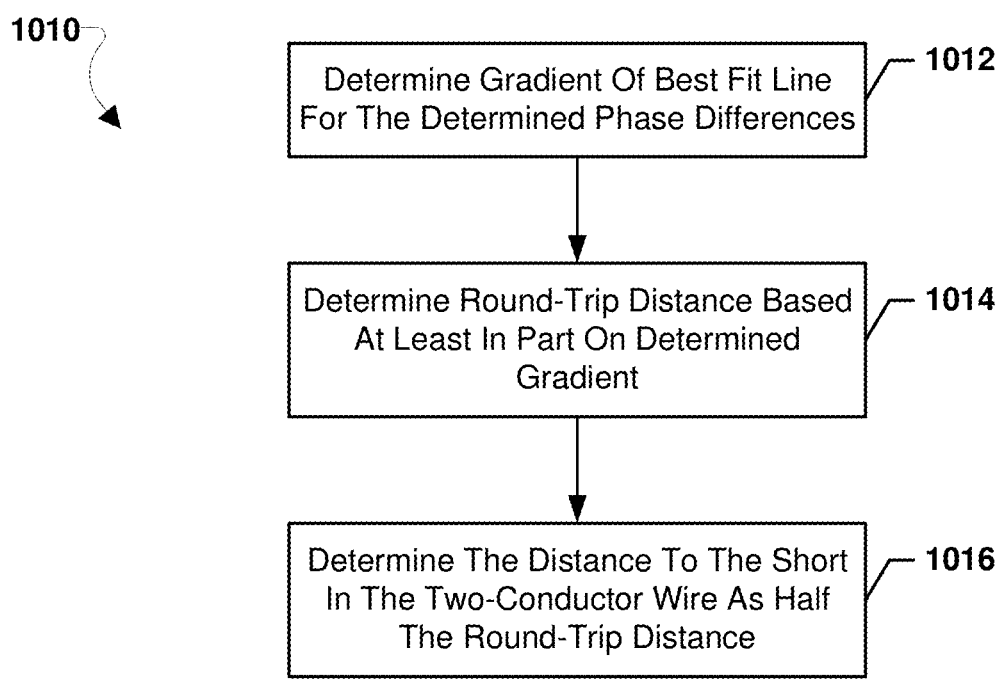
FIG. 10B is a process flow diagram illustrating a method for determining a distance to a short in a two-conductor wire in accordance with various embodiments.

FIG. 10B illustrates an embodiment method 1010 for determining a distance to a short (e.g., short 109) in a two-conductor wire (e.g., two-conductor wire 101). With reference to FIGS. 1A-10B, the method 1010 may be performed by a processor (e.g., 126) of a device (e.g., device 106). With reference to FIGS. 1A-10B, the means for performing each of the operations of the method 1010 may be one or more processors of a device (e.g., the device 106), such as one or more processors 126, and one or more distance measurement circuits of a device (e.g., the device 106), such as one or more distance measurement circuits 128, 500, 550, 580, 585. In various embodiments, the operations of the method 1010 may be performed in conjunction with the operations of the methods 200 (FIG. 2), 400 (FIG. 4A), 600 (FIG. 6A), 650 (FIG. 6B), 700 (FIG. 7), 750 (FIG. 7B), 800 (FIG. 8A), 850 (FIG. 8B), and/or 900 (FIG. 9). As examples, the operations of the method 1010 may be performed as part of the operations of blocks 204 of the method 200 (FIG. 2) or method 400 (FIG. 4A) to determine a distance to the short (e.g., short 109) in the two-conductor wire (e.g., two-conductor wire 101), as part of the operations of block 708 of the method 700 (FIG. 7A) to determine a distance to the short (e.g., short 109) in the two-conductor wire (e.g., two-conductor wire 101), as part of the operations of block 758 of the method 700 (FIG. 7B) to determine a distance to the short (e.g., short 109) in the two-conductor wire (e.g., two-conductor wire 101), and/or as part of the operations of blocks 824 of the method 800 (FIG. 8A), method 850 (FIG. 8B), or method 900 (FIG. 9) to determine a distance to the short (e.g., short 109) in the two-conductor wire (e.g., two-conductor wire 101).

In block 1012, the processor may perform operations to determine a gradient of a best fit line for the determined phase differences. The best fit line (e.g., line 1002) may be determined by a line fitting method, such as linear regression, orthogonal regression, etc. The best fit line (e.g., line 1002) may have a gradient (or slope) defined as a number of radians over a number of Hz.

In block 1014, the processor may perform operations to determine a round-trip distance based at least in part on the determined gradient. The gradient of the line 1002 may represent an approximation of the distance to the short along the two-conductor wire, such as the distance to the short 109 along the two-conductor wire 101. As an example, the product of the gradient (g) times the speed of light (c) in a material from which the conductors of the two-conductor wire are formed (e.g., the material forming the first conductor 104 or the second conductor 105) may be divided by two times pi (π) to yield the round-trip distance (e.g., round-trip distance=(g*c)/(2*π)).

In block 1016, the processor may perform operations to determine the distance to the short in the two-conductor ware as half the round-trip distance. For example, the round-trip distance may be divided by two to determine the distance to the short.

Figure 10C:
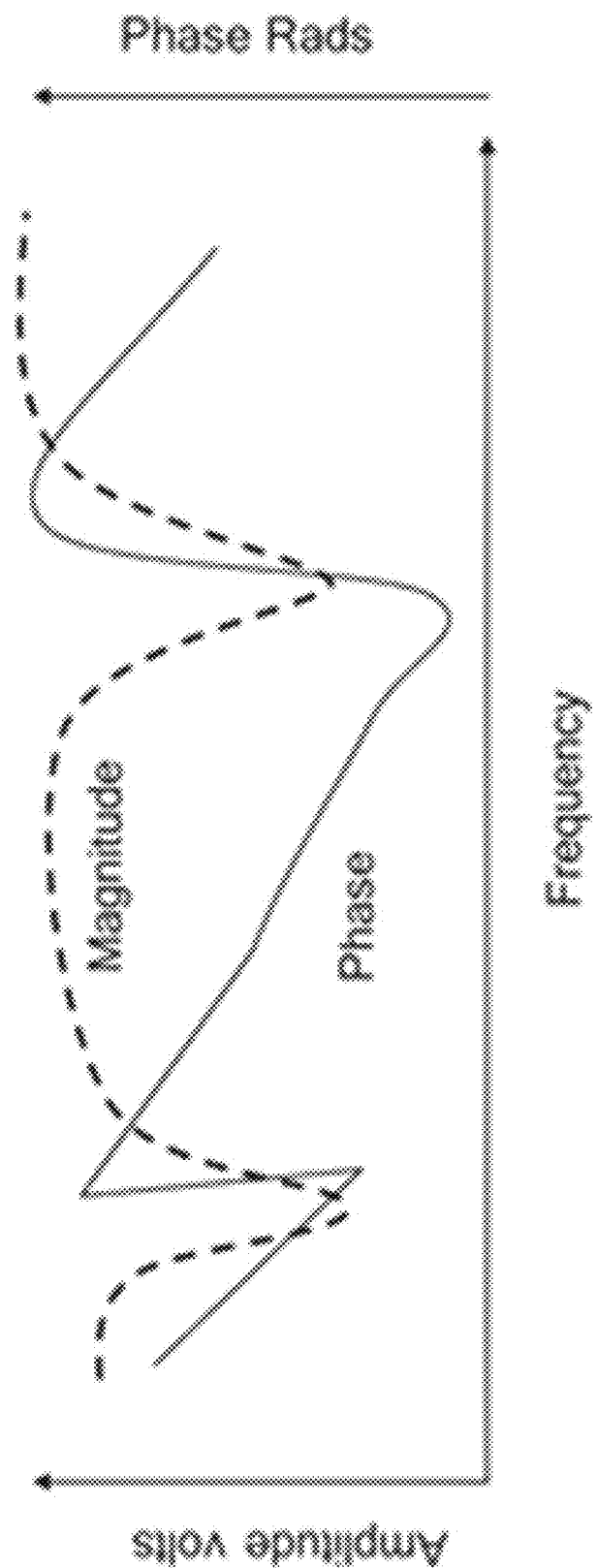
FIG. 10C is an example of calibration data set of phase differences and amplitude differences in accordance with various embodiments.

FIG. 10C is an example of calibration data set of phase differences and amplitude differences that may be observed in various embodiments. With reference to FIGS. 1A-10C, FIG. 10C illustrates phase differences and amplitude differences over frequency. FIG. 10C illustrates a set of determined phase differences and determined amplitude differences that may be used to determine a distance to a short. In various embodiments, a device (e.g., 106) may be calibrated to a two-conductor wire (e.g., 101) prior to use. For example, in a laboratory setting a short may be placed at known distances along the conductors (e.g., 104, 105) of the two-conductor wire (e.g., 101). For each calibration distance, the amplitude and phase may be captured against frequency and stored as calibration data sets. The stored calibration data sets may be correlated with distances at which the shorts associated with the data sets were captured. When the device (e.g., 106) is deployed to determine a distance to a short, the amplitude and phase may be captured and compared to the calibration data sets. The calibration data set that best matches the sampled amplitude and phase may be selected and the distance to the short determined as the distance correlated with that best matching calibration data set.

Figure 10D:
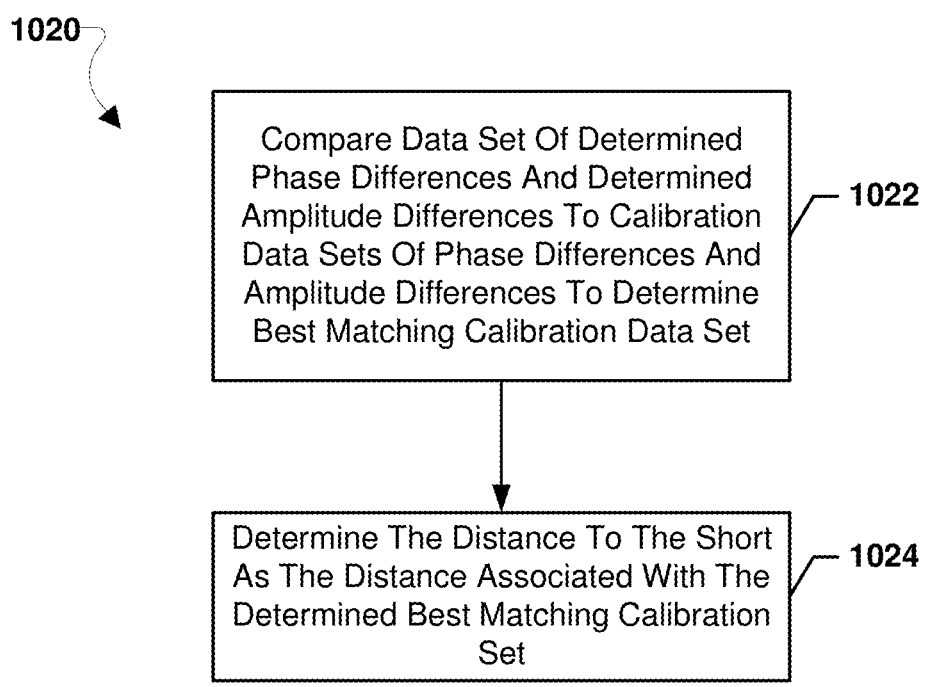
FIG. 10D is a process flow diagram illustrating a method for determining a distance to a short in a two-conductor wire in accordance with various embodiments.

FIG. 10D illustrates an embodiment method 1020 for determining a distance to a short (e.g., 109) in a two-conductor wire (e.g., 101). With reference to FIGS. 1A-10D, the method 1020 may be performed by a processor (e.g., 126) of a device (e.g., device 106). With reference to FIGS. 1A-10D, the means for performing each of the operations of the method 1020 may be one or more processors of a device (e.g., the device 106), such as one or more processors 126, and one or more distance measurement circuits of a device (e.g., the device 106), such as one or more distance measurement circuits 128, 500, 550, 580, 585. In various embodiments, the operations of the method 1020 may be performed in conjunction with the operations of the methods 200 (FIG. 2), 400 (FIG. 4A), 650 (FIG. 6B), and/or 750 (FIG. 7B). As examples, the operations of the method 1020 may be performed as part of the operations of blocks 204 of the method 200 (FIG. 2) or the method 400 (FIG. 4A) to determine a distance to the short (e.g., short 109) in the two-conductor wire (e.g., two-conductor wire 101) and/or as part of the operations of block 758 of the method 750 (FIG. 7B) to determine a distance to the short (e.g., short 109) in the two-conductor wire (e.g., two-conductor wire 101).

In block 1022, the processor may perform operations to compare a data set of determined phase differences and determined amplitude differences to calibration data sets of phase differences and amplitude differences to determine a best matching calibration set. For each potential distance to a short in the two-conductor wire (e.g., 101), the amplitude and phase may have been previously captured against frequency and stored as calibration data sets. The stored calibration data sets may be correlated with distances at which the shorts associated with the data sets were captured. When the device (e.g., 106) is deployed to determine a distance to a short, the amplitude and phase may be captured and compared to the calibration data sets. The calibration data set that best matches the sampled amplitude and phase may be selected.

In block 1024, the processor may perform operations to determine a distance to the short as the distance associated with the determined best matching calibration set. The stored calibration data sets may be correlated with distances at which the shorts associated with the data sets were captured. The calibration data set that best matches the sampled amplitude and phase may be selected and the distance to the short determined as the distance correlated with that best matching calibration data set.

Figure 11A:
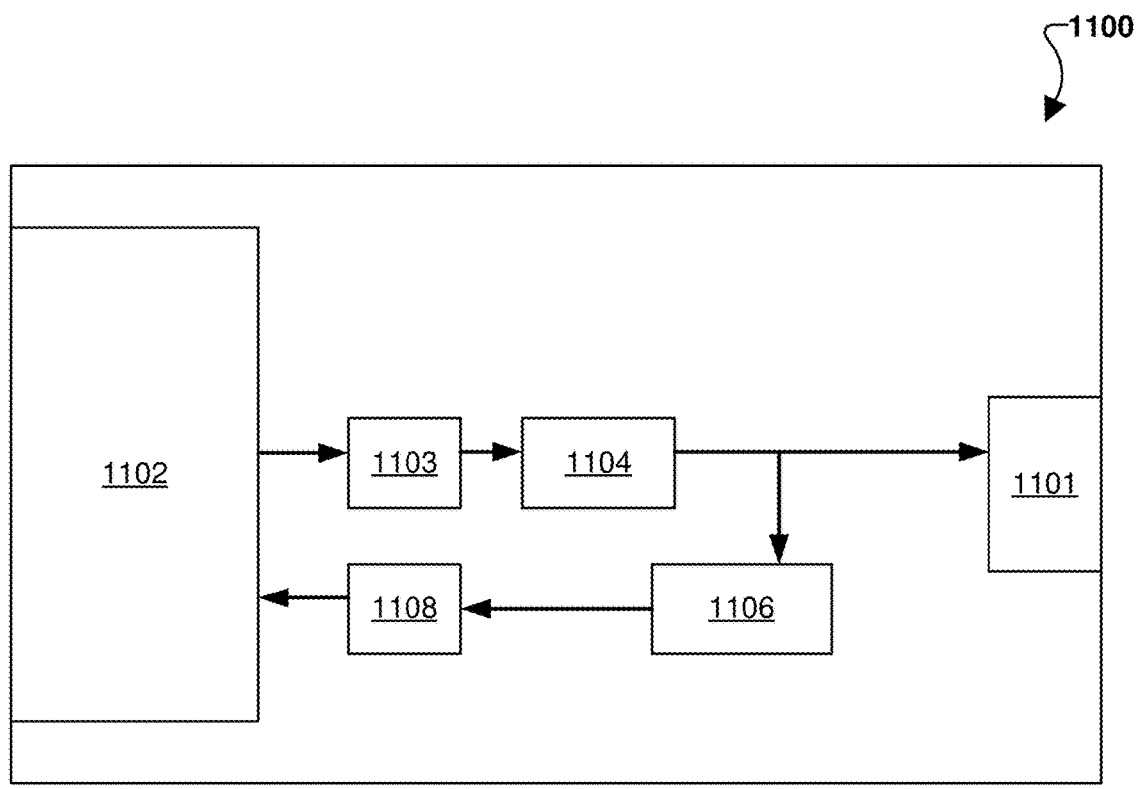
FIG. 11A illustrates an example distance measurement circuit in accordance with various embodiments.

FIG. 11A illustrates an example distance measurement circuit 1100 in accordance with various embodiments. With reference to FIGS. 1A-11A, the circuit 1100 may be an example of a configuration of a distance measurement circuit, such as distance measurement circuit 128. With reference to FIGS. 1A-11A, the distance measurement circuit 1100 may be an example means for performing at least a portion of the operations of the methods 200 (FIG. 2) and/or 400 (FIG. 4A). The distance measurement circuit 1100 may be a SOC or a SIP. The distance measurement circuit 1100 may be configured to enable determination of a distance to a short (e.g., 109) in a two-conductor wire (e.g., 101). The distance measurement circuit 1100 may be configured to enable determination of a distance to a short (e.g., 109) based at least in part on a measured peak voltage of a combined pulse.

The distance measurement circuit 1100 may include a processor 1102. The processor 1102 may be connected to a processor of a device, such as processor 126 of device 106. The processor 1102 may connect to a pulse generator 1103. For example, the pulse generator may be a twenty nanosecond (ns) pulse generator. The processor 1102 may be configured to control the operations of the pulse generator 1103 to cause the pulse generator 1103 to output a pulse, such as a voltage pulse. The pulse generator 1103 may output generated pulses to a matched circuit 1104 that may output pulses to a connector 1101 and a peak detect circuit 1106. The peak detect circuit 1106 may be connected to an ADC 1108 and the ADC 1108 may connect to the processor 1102.

The connector 1101 may be connected to a conductor of a two-conductor wire, such as the first conductor 104 of two-conductor wire 101 or the second conductor 105 of the two-conductor wire 101. The other conductor(s) of the two-conductor wire, such as two-conductor wire 101, not connected to the connector 1101 may be grounded. The pulse generator 1103 may be controlled to output a pulse to the connector 1101 via the matched circuit 1104. The pulse output to the connector 1101 may travel into the conductor (e.g., the first conductor 104 or the second conductor 105). The pulse output into the conductor (e.g., the first conductor 104 or the second conductor 105) may travel down the conductor (e.g., the first conductor 104 or the second conductor 105) and be reflected back at a short (e.g., the short 109). The reflected pulse may interfere with the injected pulse and reduce the peak voltage of the combined pulse. The peak detect circuit 1106 may detect the peak voltage of the combined pulse (e.g., the waveform resulting from the interfering combination of the injected pulse and the reflected pulse). As the transmitted pulse travels down the conductor (e.g., the first conductor 104 or the second conductor 105) being tested it hits the short (e.g., the short 109) and is bounced back inverted along the conductor (e.g., the first conductor 104 or the second conductor 105) being tested. The forward and reverse pulses sum up along the conductor (e.g., the first conductor 104 or the second conductor 105) and can be measured at the connector 1101 by the peak detect circuit 1106. The peak voltage of the combined pulse may be related to the distance to the short (e.g., the short 109). The two pulses combine resulting in a change in height (e.g., change in peak voltage) of the test waveform that may be proportional to the distance from the end of the two-conductor wire to the short (e.g., the distance from end 102 to the short 109 in the two-conductor wire 101). The farther the distance to the short from the end of the two-conductor wire (e.g., the distance to the short 109 from the end 102 of the two-conductor wire 101), the higher the peak voltage may be in the combined signal. The value of the peak voltage in the combined pulse may proportional to the distance to the short (e.g., the distance to the short 109 from the end 102 of the two-conductor wire 101) such that peak voltage values may be correlated with distances along the two-conductor wire (e.g., the two-conductor wire 101). Based on the measured peak voltage in the returned signal, the distance to the short (e.g., the short 109) may be determined that correlates with the measured peak voltage.

Figure 11B:
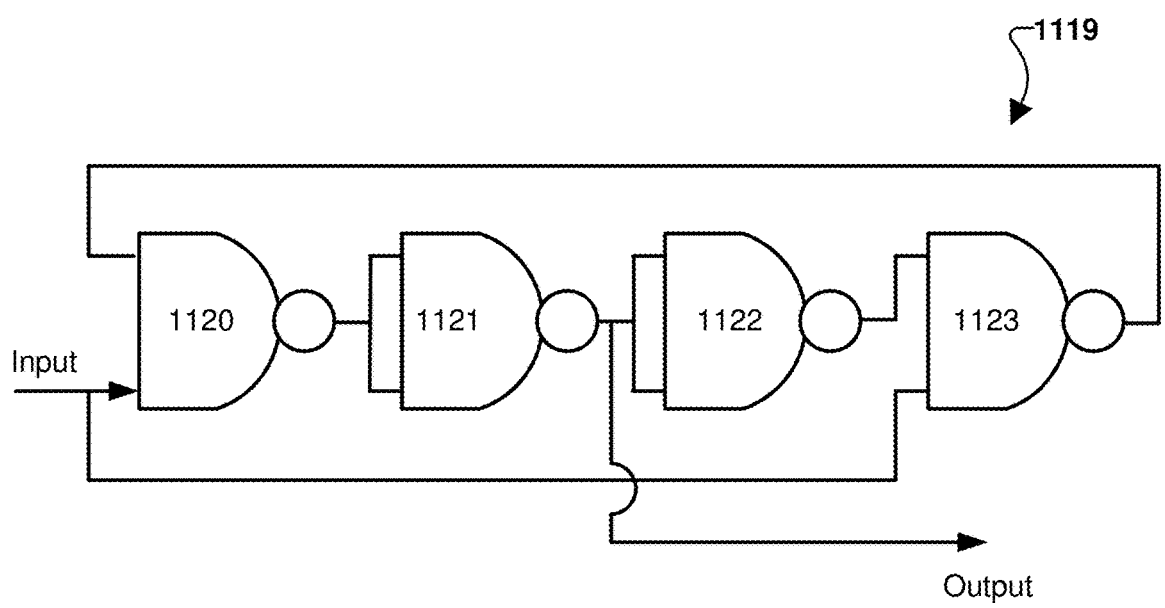
FIG. 11B illustrates an example pulse generation circuit in accordance with various embodiments.

FIG. 11B illustrates an example pulse generation circuit 1119 in accordance with various embodiments. With reference to FIGS. 1A-11B, the circuit 1119 may be an example of a configuration of a pulse generation circuit, such as pulse generation circuit 1103. With reference to FIGS. 1A-11B, the pulse generation circuit 1119 may be an example means for performing at least a portion of the operations of the methods 200 (FIG. 2) and/or 400 (FIG. 4A). The pulse generation circuit 1119 may be a SOC or a SIP. The pulse generation circuit 1119 may be configured to convert a slow input edge pulse, such as 50 ns or more pulse width pulse, into a fast output pulse, such as 20-30 ns pulse width pulse. The pulse generation circuit 1119 may include four NAND gates 1120, 1121, 1122, and 1123. An input may be sent to the first input of the NAND gate 1120 and the first input of NAND gate 1123. The output of the NAND gate 1120 may be sent to both inputs of the NAND gate 1121. The output of the NAND gate 1121 may be sent to both inputs of the NAND gate 1122. The output of the NAND gate 1121 may also be the output of the pulse generation circuit 1119. The output of the NAND gate 1122 may be sent to a second input of the NAND gate 1123. The output of the NAND gate 1123 may be sent to the second input of the NAND gate 1120. The duration of the pulse may be related to the propagation delay of the NAND gates 1120, 1121, 1122, and/or 1123. To adjust the speed of the pulse, specific speed of the NAND gates 1120, 1121, 1122, and/or 1123 may be selected and additional components, such as capacitors, inductors, and resistors may be added to the pulse generation circuit 1119.

Figure 12:
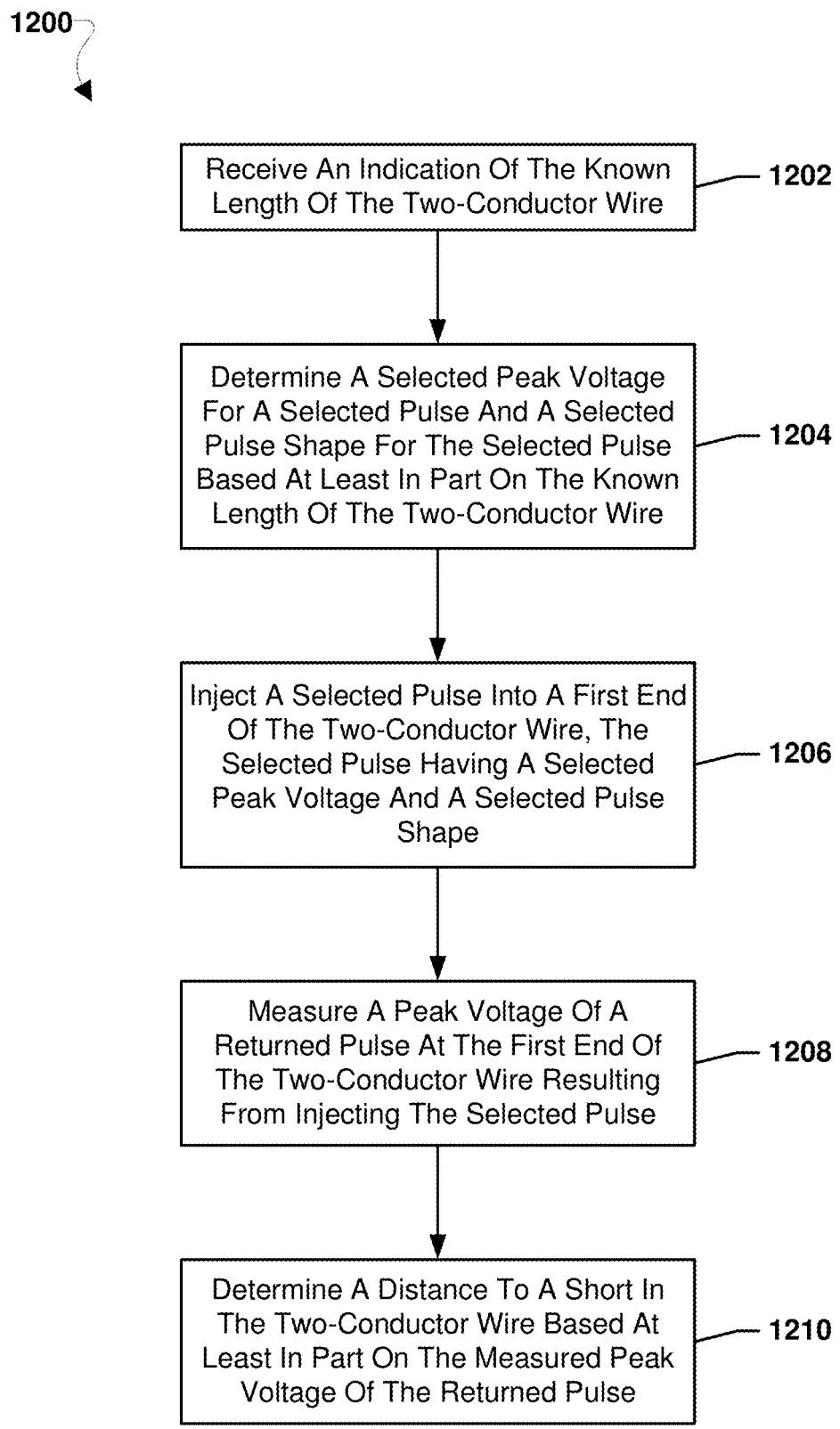
FIG. 12 is a process flow diagram illustrating a method for determining a distance to a short in a two-conductor wire in accordance with various embodiments.

FIG. 12 illustrates an embodiment method 1200 for determining a distance to a short in a two-conductor wire. With reference to FIGS. 1A-12, the method 1200 may be performed by a processor (e.g., 126, 1102) of a device (e.g., device 106). With reference to FIGS. 1A-12, the means for performing each of the operations of the method 1200 may be one or more processors of a device (e.g., the device 106), such as one or more processors 126, 1102, and one or more distance measurement circuits of a device (e.g., the device 106), such as one or more distance measurement circuits 128, 1100. In various embodiments, the operations of the method 1200 may be performed in conjunction with the operations of the methods 200 (FIG. 2) and/or 400 (FIG. 4A). For example, the operations of the method 1200 may be performed as part of the operations of block 204 of the method 200 (FIG. 2) or the method 400 (FIG. 4A) to determine a distance to the short (e.g., short 109) in the two-conductor wire (e.g., two-conductor wire 101).

In block 1202, the processor may perform operations to receive an indication of the known length of the two-conductor wire. As examples, the known length of the two-conductor wire (e.g., 101) may be indicated by a user input, loaded from a memory, etc. For example, the known length of the two-conductor wire (e.g., 101) may be a length (or distance) from a first end (e.g., 102) to a second end (e.g., 103) of the two-conductor wire (e.g., 101).

In block 1204, the processor may perform operations to determine a selected peak voltage for a selected pulse and a selected pulse shape for the selected pulse based at least in part on the known length of the two-conductor wire. For example, the shape of a pulse may be any pulse shape, such as a Gaussian, a triangle pulse, etc. In various embodiments, the selected pulse may be a ramp-pulse with no modulation applied to the ramp-pulse. In some embodiments, the pulse shape may be configured such that the ramp-up portion of the pulse has a different shape than a ramp-down portion of the pulse.

In block 1206, the processor may perform operations to inject a selected pulse into a first end of the two-conductor wire, the selected pulse having a selected peak voltage and a selected pulse shape. For example, the injected pulse may be any pulse shape, such as a Gaussian, a triangle pulse, etc. In various embodiments, the injected pulse may be a ramp-pulse with no modulation applied to the ramp-pulse. In some embodiments, the pulse shape may be configured such that the ramp-up portion of the pulse has a different shape than a ramp-down portion of the pulse.

In block 1208, the processor may perform operations to measure a peak voltage of a combined pulse at the first end of the two-conductor wire resulting from injecting the selected pulse. For example, the processor may measure the peak voltage of the combined pulse in the first conductor 104 at the first end 102 of the two-conductor wire 101 using the peak detect circuit 1106 and ADC 1108.

In block 1210, the processor may perform operations to determine a distance to a short in the two-conductor wire based at least in part on the measured peak voltage of the combined pulse. For example, the peak voltage values may be correlated with distances in a memory structure (e.g., array, look-up table, etc.) in a memory available to the processor and the processor may determine the distance to the short in the two-conductor wire as the distance correlated with the peak voltage in the memory structure matching the measured peak voltage.

Figure 13:
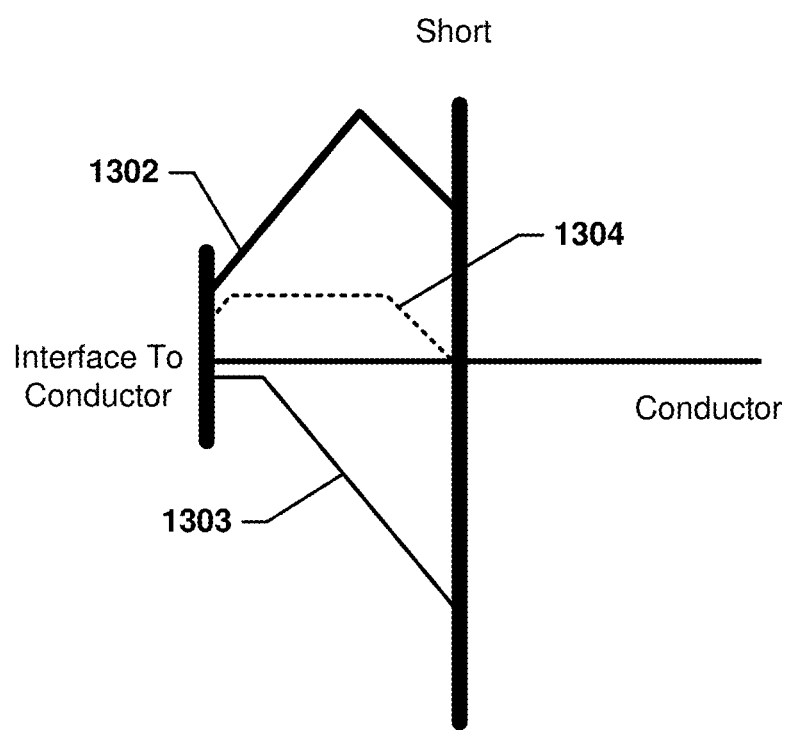
FIG. 13 illustrates aspects of pulse interference in the presence of a short circuit.

FIG. 13 illustrates aspects of pulse interference in the presence of a short circuit, such as short 109. With reference to FIGS. 1A-13, FIG. 13 illustrates a snapshot of an instant in time showing the spatial voltages of the injected pulse 1302, reflected pulse 1303, and combined pulse 1304. The injected pulse 1302 may be injected into a conductor, such as conductor 104, 105, of two-conductor wire 101. FIG. 13 illustrates a spatial arrangement of a pulse in a conductor, such as conductor 104, 105, of two-conductor wire 101. The injected pulse 1302 may have a pulse width and may travel toward the short, such as short 109. The pulse width (or pulse duration) of the injected pulse 1302 may be selected such that the whole injected pulse 1302 fills the two-conductor wire 101 in space when no short is present. When a short 109 is present, the injected pulse 1302 may be reflected from the short, such as short 109, with a reflected pulse 1303 returned down the conductor (e.g., 104, 105). For example, the injected pulse 1302 may be inverted when reflected from the short 109 and be returned down the conductor (e.g., 104, 105) as a reflected pulse 1303. The reflected pulse 1303 and the injected pulse 1302 may sum together to form a combined pulse 1304 that has a peak voltage lower than the peak voltage of the injected pulse 1302.

Figure 14:
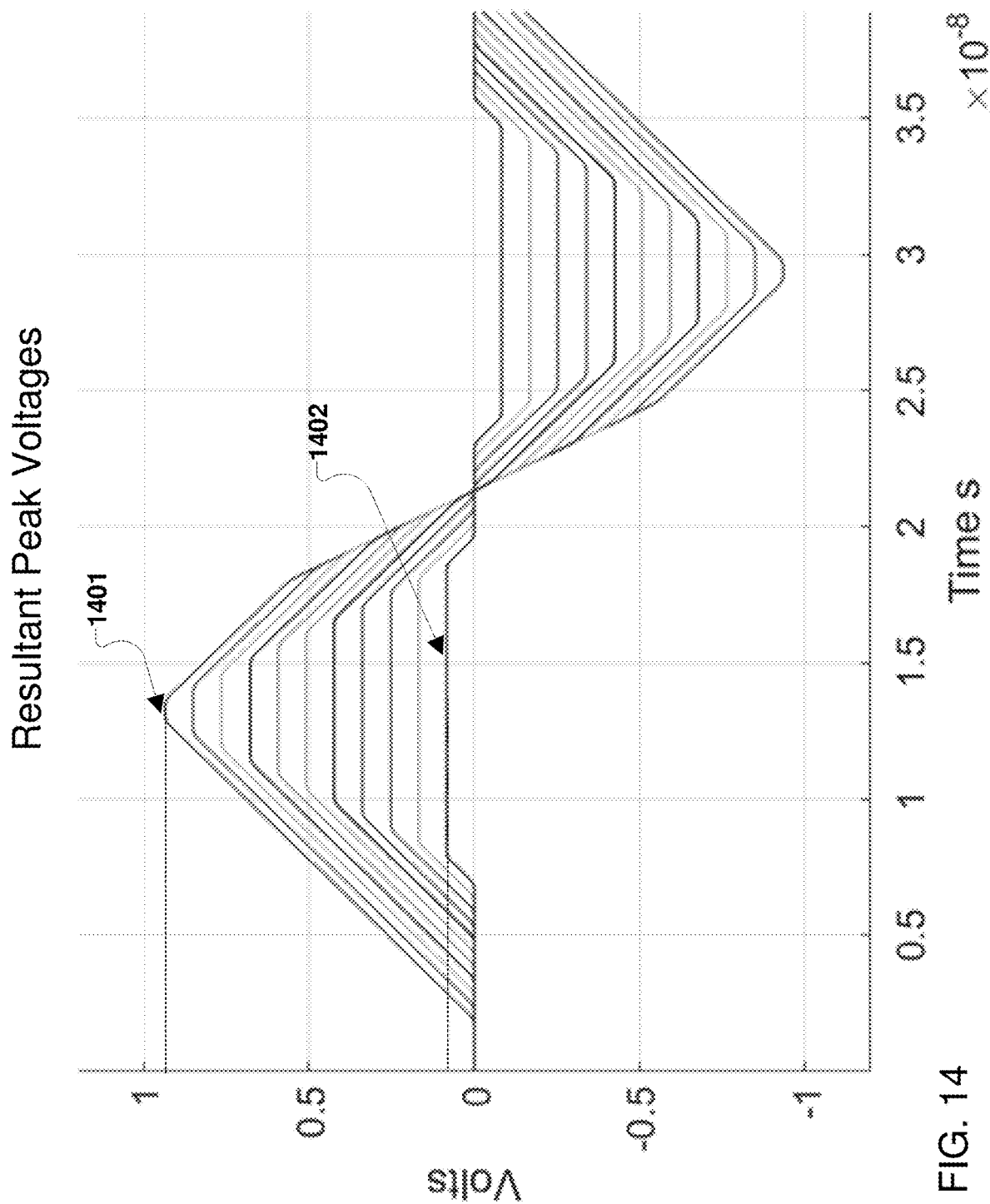
FIG. 14 is a plot of resultant example peak voltages of pulses resulting from pulse interference in accordance with various embodiments.

FIG. 14 is a plot of resultant example peak voltages of pulses resulting from pulse interference in accordance with various embodiments. With reference to FIGS. 1A-14, FIG. 14 illustrates different combined pulses with different pulse peak voltages that may result from an injected pulse, such as pulse 1302, being reflected from a short, such as short 109. The different pulse peak voltages may be proportional to the distance to the short, such as short 109. For example, a closer short may result in a lower peak voltage 1402 than a peak voltage resulting from a farther short 1401. Peak voltage values may be correlated with distances in a memory structure (e.g., array, look-up table, etc.) in a memory and the resulting peak voltage may be matched to a stored peak voltage to determine the distance to the short as the distance correlated with the matching peak voltage value in the memory.

Figure 15:
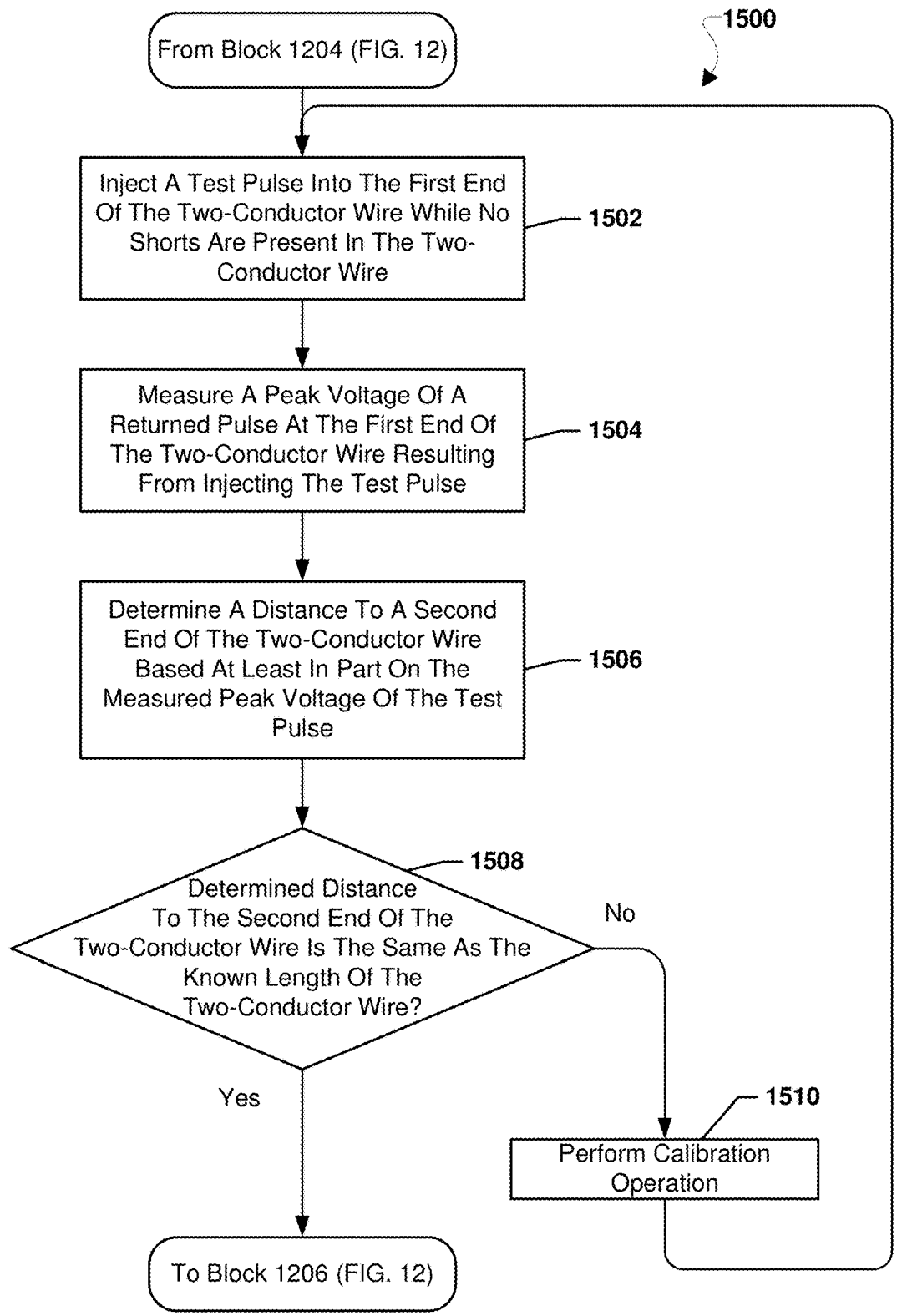
FIG. 15 is a process flow diagram illustrating a method for calibrating a device in accordance with various embodiments.

FIG. 15 illustrates an embodiment method 1500 for calibrating a device, such as device 106. With reference to FIGS. 1A-15, the method 1500 may be performed by a processor (e.g., 126, 1102) of a device (e.g., device 106). With reference to FIGS. 1A-15, the means for performing each of the operations of the method 1500 may be one or more processors of a device (e.g., the device 106), such as one or more processors 126, 1102, and one or more distance measurement circuits of a device (e.g., the device 106), such as one or more distance measurement circuits 128, 1100. In various embodiments, the operations of the method 1500 may be performed in conjunction with the operations of the methods 200 (FIG. 2), 400 (FIG. 4A), and/or 1200 (FIG. 12). For example, the operations of the method 1500 may be performed in response to the operations of block 1204 of the method 1200 (FIG. 12) to determine a selected peak voltage for a selected pulse and a selected pulse shape for the selected pulse based at least in part on the known length of the two-conductor wire.

In block 1502, the processor may perform operations to inject a test pulse into the first end of the two-conductor wire while no shorts are present in the two-conductor wire. For example, the injected test pulse may be any pulse shape, such as a Gaussian, a triangle pulse, etc. In various embodiments, the injected test pulse may be a ramp-pulse with no modulation applied to the ramp-pulse. In various embodiments, the pulse shape may be configured such that the ramp-up portion of the pulse has a different shape than a ramp-down portion of the pulse.

In block 1504, the processor may perform operations to measure a peak voltage of a combined pulse at the first end of the two-conductor wire resulting from injecting the test pulse. For example, the processor may measure the peak voltage of the returned test pulse in the first conductor 104 at the first end 102 of the two-conductor wire 101 using the peak detect circuit 1106 and ADC 1108.

In block 1506, the processor may perform operations to determine a distance to a second end of the two-conductor wire based at least in part on the measured peak voltage of the test pulse. For example, the peak voltage values may be correlated with distances in a memory structure (e.g., array, look-up table, etc.) in a memory available to the processor and the processor may determine the distance to the second end of the two-conductor wire as the distance correlated with the peak voltage in the memory structure matching the measured peak voltage.

In determination block 1508, the processor may perform operations to determine whether the determined distance to the second end of the two-conductor wire is the same as the known length of the two-conductor wire. For example, the processor may subtract the determined distance to the second end of the two-conductor wire from the known length of the two-conductor wire to determine whether the determined distance to the second end of the two-conductor wire is the same as the known length of the two-conductor wire. A non-zero result may indicate that the determined distance to the second end of the two-conductor wire is not the same as the known length of the two-conductor wire. A zero result may indicate that the determined distance to the second end of the two-conductor wire is the same as the known length of the two-conductor wire.

In response to determining that the determined distance to the second end of the two-conductor wire is not the same as the known length of the two-conductor wire (i.e., determination block 1508="No"), the processor may perform one or more calibration operations in block 1510. For example, the processor may perform calibration operations including adjusting device (e.g., device 106) settings, changing a test pulse shape, etc. The known length and determined length being different may indicate a known length of the wire is incorrect, a peak detection circuit is not operating correctly, or another anomaly in the system. The calibration operations may enable the anomaly to be corrected.

In response to performing the calibration operation, the processor may proceed to block 1502 to inject a test pulse into the first end of the two-conductor wire while no shorts are present in the two-conductor wire, measure the peak voltage in block 1504, determine a distance to the second end of the two-conductor again in block 1506, and determine whether the determined distance to the second end of the two-conductor wire is the same as the known length of the two-conductor wire in determination block 1508. In this manner, test pulse injection/measurement and calibration operations may be repeatedly performed to calibrate the device (e.g., device 106).

In response to determining that the determined distance to the second end of the two-conductor wire is the same as the known length of the two-conductor wire (i.e., determination block 1508="No"), the processor may perform the operations in block 1206 of the method 1200 (FIG. 12) to inject a selected pulse into a first end of the two-conductor wire, the selected pulse having a selected peak voltage and a selected pulse shape as described.

The processors of the various devices discussed herein, such as processors 126, 356, 1102, etc., may be any programmable microprocessor, microcomputer or multiple processor chip or chips that can be configured by software instructions (applications) to perform a variety of functions, including the functions of the various embodiments described below. In some devices, multiple processors may be provided, such as one processor within an SOC dedicated to communication functions and one processor within an SOC dedicated to running other applications. Typically, software applications may be stored in the memory (e.g., memory 129, 357, etc.) before they are accessed and loaded into the processor. The processors may include internal memory sufficient to store the application software instructions.

As used in this application, the terms "component," "module," "system," and the like are intended to include a computer-related entity, such as, but not limited to, hardware, firmware, a combination of hardware and software, software, or software in execution, which are configured to perform particular operations or functions. For example, a component may be, but is not limited to, a process running on a processor, a processor, an object, an executable, a thread of execution, a program, and/or a computer. By way of illustration, both an application running on a wireless device and the wireless device may be referred to as a component. One or more components may reside within a process and/or thread of execution and a component may be localized on one processor or core and/or distributed between two or more processors or cores. In addition, these components may execute from various non-transitory computer readable media having various instructions and/or data structures stored thereon. Components may communicate by way of local and/or remote processes, function or procedure calls, electronic signals, data packets, memory read/writes, and other known network, computer, processor, and/or process related communication methodologies.

A number of different cellular and mobile communication services and standards are available or contemplated in the future, all of which may implement and benefit from the various embodiments. Such services and standards include, e.g., third generation partnership project (3GPP), long term evolution (LTE) systems, third generation wireless mobile communication technology (3G), fourth generation wireless mobile communication technology (4G), fifth generation wireless mobile communication technology (5G), global system for mobile communications (GSM), universal mobile telecommunications system (UMTS), 3GSM, general packet radio service (GPRS), code division multiple access (CDMA) systems (e.g., cdmaOne, CDMA1020TM), enhanced data rates for GSM evolution (EDGE), advanced mobile phone system (AMPS), digital AMPS (IS-136/TDMA), evolution-data optimized (EV-DO), digital enhanced cordless telecommunications (DECT), Worldwide Interoperability for Microwave Access (WiMAX), wireless local area network (WLAN), Wi-Fi Protected Access I & II (WPA, WPA2), and integrated digital enhanced network (iDEN). Each of these technologies involves, for example, the transmission and reception of voice, data, signaling, and/or content messages. It should be understood that any references to terminology and/or technical details related to an individual telecommunication standard or technology are for illustrative purposes only, and are not intended to limit the scope of the claims to a particular communication system or technology unless specifically recited in the claim language.

Various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment. For example, one or more of the operations of the methods 200, 400, 450, 600, 650, 700, 750, 800, 850, 900, 1010, 1020, 1200, and/or 1500 may be substituted for or combined with one or more operations of the methods 200, 400, 450, 600, 650, 700, 750, 800, 850, 900, 1010, 1020, 1200, and/or 1500.

Implementation examples are described in the following paragraphs. While some of the following implementation examples are described in terms of example methods, further example implementations may include: the example methods discussed in the following paragraphs implemented by a device including a processor configured with processor-executable instructions to perform operations of the methods of the following implementation examples; the example methods discussed in the following paragraphs implemented by a including means for performing functions of the methods of the following implementation examples; and the example methods discussed in the following paragraphs may be implemented as a non-transitory processor-readable storage medium having stored thereon processor-executable instructions configured to cause a processor of a device to perform operations of the methods of the following implementation examples.

Example 1. A method for determining a distance to a short in a two-conductor wire, including: injecting an initial tone into a first end of the two-conductor wire, the initial tone having an initial known signal phase; measuring a signal phase of an initial reflected tone at the first end of the two-conductor wire resulting from injecting the initial tone; determining an initial phase difference as a phase difference between the initial known signal phase and the measured signal phase of the initial reflected tone; and determining a distance to the short in the two-conductor wire based at least in part on the determined initial phase difference.

Example 2. The method of example 1, in which: the initial known signal phase is an initial known current phase; and the measured signal phase of the initial reflected tone is a measured current phase of the initial reflected tone.

Example 3. The method of example 1, in which: the initial known signal phase is an initial known voltage phase; and the measured signal phase of the initial reflected tone is a measured voltage phase of the initial reflected tone.

Example 4. The method of example 3, in which the initial tone has an initial frequency, the method further including: injecting a second tone into the first end of the two-conductor wire, the second tone having a second initial voltage phase and a second frequency different from the initial frequency; measuring a voltage phase of a second reflected tone at the first end of the two-conductor wire resulting from injecting the second tone; and determining a second phase difference as a phase difference between the second initial voltage phase and the measured voltage phase of the second reflected tone, in which determining the distance to the short in the two-conductor wire based at least in part on the determined initial phase difference includes determining the distance to the short in the two-conductor wire based at least in part on the determined initial phase difference and the determined second phase difference.

Example 5. The method of any of examples 1-4, further including: controlling a device along the two-conductor wire to create the short in the two-conductor wire prior to injecting the initial tone, prior to injecting the second tone, and prior to determining the distance to the short.

Example 6. The method of any of examples 1-5, in which the initial tone has an initial known signal amplitude, the method further including: measuring an amplitude of the initial reflected tone at the first end of the two-conductor wire resulting from injecting the initial tone; and determining an initial amplitude difference as a difference between the initial known signal amplitude and the measured amplitude of the initial reflected tone, in which determining the distance to the short in the two-conductor wire based at least in part on the determined initial phase difference includes determining the distance to the short in the two-conductor wire based at least in part on the determined initial phase difference and the determined initial amplitude difference.

Example 7. The method of example 6, in which: the initial known signal amplitude is an initial known current amplitude; and the measured amplitude of the initial reflected tone is a measured current amplitude of the initial reflected tone.

Example 8. The method of example 6, in which: the initial known signal amplitude is an initial known voltage amplitude; and the measured amplitude of the initial reflected tone is a measured voltage amplitude of the initial reflected tone.

Example 9. A method for determining a distance to a short in a two-conductor wire, including: injecting a selected pulse into a first end of the two-conductor wire, the selected pulse having a selected peak voltage and a selected pulse shape; measuring a peak voltage of a combined pulse at the first end of the two-conductor wire resulting from injecting the selected pulse; and determining a distance to the short in the two-conductor wire based at least in part on the measured peak voltage of the combined pulse.

Example 10. The method of example 9, further including: determining the selected peak voltage for the selected pulse and the selected pulse shape for the selected pulse based at least in part on a known length of the two-conductor wire prior to injecting the selected pulse.

Example 11. The method of any of examples 1-10, in which the selected pulse is a ramp-pulse with no modulation applied to the ramp-pulse.

Example 12. The method of any of examples 9-11, further including, prior to injecting the selected pulse: injecting a test pulse into the first end of the two-conductor wire while no shorts are present in the two-conductor wire; measuring a peak voltage of a returned test pulse at the first end of the two-conductor wire resulting from injecting the test pulse; determining a distance to a second end of the two-conductor wire based at least in part on the measured peak voltage of the returned test pulse; determining whether the determined distance to the second end of the two-conductor wire is the same as a known length of the two-conductor wire; and performing a calibration operation in response to determining that the distance to the second end of the two-conductor wire is not the same as the known length of the two-conductor wire, in which injecting the selected pulse into the first end of the two-conductor wire includes injecting the selected pulse into the first end of the two-conductor wire in response to determining that the distance to the second end of the two-conductor wire is the same as the known length of the two-conductor wire.

Example 13. The method of any of examples 9-12, further including: controlling a device along the two-conductor wire to create the short in the two-conductor wire prior to injecting the selected pulse into the first end of the two-conductor wire.

The foregoing method descriptions and the process flow diagrams are provided merely as illustrative examples and are not intended to require or imply that the operations of various embodiments must be performed in the order presented. As will be appreciated by one of skill in the art the order of operations in the foregoing embodiments may be performed in any order. Words such as "thereafter," "then," "next," etc. are not intended to limit the order of the operations; these words are used to guide the reader through the description of the methods. Further, any reference to claim elements in the singular, for example, using the articles "a," "an," or "the" is not to be construed as limiting the element to the singular.

Various illustrative logical blocks, modules, components, circuits, and algorithm operations described in connection with the embodiments disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such embodiment decisions should not be interpreted as causing a departure from the scope of the claims.

The hardware used to implement various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver smart objects, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in a processor-executable software module or processor-executable instructions, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage smart objects, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments without departing from the scope of the claims. Thus, the present disclosure is not intended to be limited to the embodiments shown herein but is to be accorded the widest scope consistent with the following claims and the principles and novel features disclosed herein.

What is claimed is:

1. A method for determining a distance to a short in a two-conductor wire, comprising:
    injecting an initial tone into a first end of the two-conductor wire, the initial tone having an initial known signal phase;
    measuring a signal phase of an initial reflected tone at the first end of the two-conductor wire resulting from injecting the initial tone;
    determining an initial phase difference as a phase difference between the initial known signal phase and the measured signal phase of the initial reflected tone; and
    determining a distance to the short in the two-conductor wire based at least in part on the determined initial phase difference;
    wherein:
        the initial known signal phase is an initial known voltage phase; and
        the measured signal phase of the initial reflected tone is a measured voltage phase of the initial reflected tone;
        the initial tone has an initial frequency, the method further comprising:
            injecting a second tone into the first end of the two-conductor wire, the second tone having a second initial voltage phase and a second frequency different from the initial frequency;
            measuring a voltage phase of a second reflected tone at the first end of the two-conductor wire resulting from injecting the second tone; and
            determining a second phase difference as a phase difference between the second initial voltage phase and the measured voltage phase of the second reflected tone,
        wherein determining the distance to the short in the two-conductor wire based at least in part on the determined initial phase difference comprises determining the distance to the short in the two-conductor wire based at least in part on the determined initial phase difference and the determined second phase difference.

2. The method of claim 1, wherein:
    the initial known signal phase is an initial known current phase; and
    the measured signal phase of the initial reflected tone is a measured current phase of the initial reflected tone.

3. The method of claim 1, further comprising:
    controlling a device along the two-conductor wire to create the short in the two-conductor wire prior to injecting the initial tone, prior to injecting the second tone, and prior to determining the distance to the short.

4. The method of claim 1, wherein the initial tone has an initial known signal amplitude, the method further comprising:
    measuring an amplitude of the initial reflected tone at the first end of the two-conductor wire resulting from injecting the initial tone; and
    determining an initial amplitude difference as a difference between the initial known signal amplitude and the measured amplitude of the initial reflected tone,
    wherein determining the distance to the short in the two-conductor wire based at least in part on the determined initial phase difference comprises determining the distance to the short in the two-conductor wire based at least in part on the determined initial phase difference and the determined initial amplitude difference.

5. The method of claim 4, wherein:
    the initial known signal amplitude is an initial known current amplitude; and
    the measured amplitude of the initial reflected tone is a measured current amplitude of the initial reflected tone.

6. The method of claim 4, wherein:
    the initial known signal amplitude is an initial known voltage amplitude; and
    the measured amplitude of the initial reflected tone is a measured voltage amplitude of the initial reflected tone.

7. A method for determining a distance to a short in a two-conductor wire, comprising:
    injecting a selected pulse into a first end of the two-conductor wire, the selected pulse having a selected peak voltage and a selected pulse shape;
    measuring a peak voltage of a combined pulse at the first end of the two-conductor wire resulting from injecting the selected pulse; and
    determining a distance to the short in the two-conductor wire based at least in part on the measured peak voltage of the combined pulse;
    wherein prior to injecting the selected pulse, the method further comprising:
        injecting a test pulse into the first end of the two-conductor wire while no shorts are present in the two-conductor wire;
        measuring a peak voltage of a returned test pulse at the first end of the two-conductor wire resulting from injecting the test pulse;
        determining a distance to a second end of the two-conductor wire based at least in part on the measured peak voltage of the returned test pulse;
        determining whether the determined distance to the second end of the two-conductor wire is the same as a known length of the two-conductor wire; and
        performing a calibration operation in response to determining that the distance to the second end of the two-conductor wire is not the same as the known length of the two-conductor wire; and
    wherein the processor is configured with processor-executable instructions to inject the selected pulse into the first end of the two-conductor wire by injecting the selected pulse into the first end of the two-conductor wire in response to determining that the distance to the second end of the two-conductor wire is the same as the known length of the two-conductor wire.

8. The method of claim 7, further comprising:
determining the selected peak voltage for the selected pulse and the selected pulse shape for the selected pulse based at least in part on a known length of the two-conductor wire prior to injecting the selected pulse.

9. The method of claim 7, wherein the selected pulse is a ramp-pulse with no modulation applied to the ramp-pulse.

10. The method of claim 7, further comprising:
controlling a device along the two-conductor wire to create the short in the two-conductor wire prior to injecting the selected pulse into the first end of the two-conductor wire.

11. A device, comprising:
a distance measurement circuit; and
a processor connected to the distance measurement circuit, the processor configured with processor-executable instructions to:
inject an initial tone into a first end of the two-conductor wire, the initial tone having an initial known signal phase;
measure a signal phase of an initial reflected tone at the first end of the two-conductor wire resulting from injecting the initial tone;
determine an initial phase difference as a phase difference between the initial known signal phase and the measured signal phase of the initial reflected tone; and
determine a distance to the short in the two-conductor wire based at least in part on the determined initial phase difference;
wherein:
the initial known signal phase is an initial known voltage phase; and
the measured signal phase of the initial reflected tone is a measured voltage phase of the initial reflected tone;
the initial tone has an initial frequency, the processor is further configured with processor-executable instructions to:
inject a second tone into the first end of the two-conductor wire, the second tone having a second initial voltage phase and a second frequency different from the initial frequency;
measure a voltage phase of a second reflected tone at the first end of the two-conductor wire resulting from injecting the second tone; and
determine a second phase difference as a phase difference between the second initial voltage phase and the measured voltage phase of the second reflected tone,
the processor is configured with processor-executable instructions to determine distance to the short in the two-conductor wire based at least in part on the determined initial phase difference by determining the distance to the short in the two-conductor wire based at least in part on the determined initial phase difference and the determined second phase difference.

12. The device of claim 11, wherein:
the initial known signal phase is an initial known current phase; and
the measured signal phase of the initial reflected tone is a measured current phase of the initial reflected tone.

13. The device of claim 11, the processor is further configured with processor-executable instructions to:
control a device along the two-conductor wire to create the short in the two-conductor wire prior to injecting the initial tone, prior to injecting the second tone, and prior to determining the distance to the short.

14. The device of claim 11, wherein:
the initial tone has an initial known signal amplitude;
the processor is further configured with processor-executable instructions to:
measure an amplitude of the initial reflected tone at the first end of the two-conductor wire resulting from injecting the initial tone; and
determine an initial amplitude difference as a difference between the initial known signal amplitude and the measured amplitude of the initial reflected tone; and
the processor is configured with processor-executable instructions to determine the distance to the short in the two-conductor wire based at least in part on the determined initial phase difference by determining the distance to the short in the two-conductor wire based at least in part on the determined initial phase difference and the determined initial amplitude difference.

15. The device of claim 14, wherein:
the initial known signal amplitude is an initial known current amplitude; and
the measured amplitude of the initial reflected tone is a measured current amplitude of the initial reflected tone.

16. The device of claim 14, wherein:
the initial known signal amplitude is an initial known voltage amplitude; and
the measured amplitude of the initial reflected tone is a measured voltage amplitude of the initial reflected tone.

17. The device of claim 11, wherein the distance measurement circuit includes only one radio.

18. The device of claim 11, wherein the distance measurement circuit comprises a first radio and a second radio.

19. The device of claim 18, wherein the first radio and the second radio are both Bluetooth radios.

20. A device, comprising:
a distance measurement circuit; and
a processor connected to the distance measurement circuit, the processor configured with processor-executable instructions to:
inject a selected pulse into a first end of the two-conductor wire, the selected pulse having a selected peak voltage and a selected pulse shape;
measure a peak voltage of a combined pulse at the first end of the two-conductor wire resulting from injecting the selected pulse; and
determine a distance to the short in the two-conductor wire based at least in part on the measured peak voltage of the combined pulse.

21. The device of claim 20, wherein the processor is further configured with processor-executable instructions to:
determine the selected peak voltage for the selected pulse and the selected pulse shape for the selected pulse based at least in part on a known length of the two-conductor wire prior to injecting the selected pulse.

22. The device of claim 20, wherein the selected pulse is a ramp-pulse with no modulation applied to the ramp-pulse.

23. The device of claim 20, wherein the processor is further configured with processor-executable instructions to:
control a device along the two-conductor wire to create the short in the two-conductor wire prior to injecting the selected pulse into the first end of the two-conductor wire.

* * * * *